(12) United States Patent
Cronie et al.

(10) Patent No.: US 8,649,445 B2
(45) Date of Patent: Feb. 11, 2014

(54) METHODS AND SYSTEMS FOR NOISE RESILIENT, PIN-EFFICIENT AND LOW POWER COMMUNICATIONS WITH SPARSE SIGNALING CODES

(75) Inventors: Harm Cronie, Lausanne (CH); Amin Shokrollahi, Préverenges (CH); Armin Tajalli, Cavannes-pré-Renens (CH)

(73) Assignee: École Polytechnique Fédérale de Lausanne (EPFL) (CH)

( * ) Notice: Subject to any disclaimer, the term of this patent is extended or adjusted under 35 U.S.C. 154(b) by 93 days.

(21) Appl. No.: 13/030,027

(22) Filed: Feb. 17, 2011

(65) Prior Publication Data

US 2012/0213299 A1 Aug. 23, 2012

(51) Int. Cl.
*H04L 27/00* (2006.01)

(52) U.S. Cl.
USPC ........... 375/259; 375/257; 375/264; 375/286; 375/288; 370/252; 370/332; 370/329; 370/445; 331/25; 341/56

(58) Field of Classification Search
USPC ........... 375/259, 257, 264, 286, 288; 331/25; 370/252, 332, 329, 445; 341/56
See application file for complete search history.

(56) References Cited

U.S. PATENT DOCUMENTS

| | | | |
|---|---|---|---|
| 5,053,974 A * | 10/1991 | Penz | 706/18 |
| 5,166,956 A | 11/1992 | Baltus et al. | |
| 5,412,689 A | 5/1995 | Chan et al. | |
| 5,511,119 A | 4/1996 | Lechleider | |
| 5,553,097 A | 9/1996 | Dagher | |
| 5,995,016 A | 11/1999 | Perino | |
| 6,005,895 A | 12/1999 | Perino et al. | |
| 6,359,931 B1 | 3/2002 | Perino et al. | |
| 6,404,820 B1 | 6/2002 | Postol | |
| 6,504,875 B2 | 1/2003 | Perino et al. | |
| 6,556,628 B1 | 4/2003 | Poulton et al. | |
| 6,621,427 B2 * | 9/2003 | Greenstreet | 341/58 |
| 6,661,355 B2 | 12/2003 | Cornelius et al. | |
| 6,766,342 B2 | 7/2004 | Kechriotis | |
| 6,839,429 B1 | 1/2005 | Gaikwald et al. | |
| 6,999,516 B1 | 2/2006 | Rajan | |
| 7,167,019 B2 | 1/2007 | Broyde et al. | |
| 7,180,949 B2 | 2/2007 | Kleveland et al. | |
| 7,184,483 B2 | 2/2007 | Rajan | |

(Continued)

FOREIGN PATENT DOCUMENTS

WO 2010/031824 A 3/2010

OTHER PUBLICATIONS

John W. Poulton et al, "Multieire Differential Signaling", Aug. 6, 2003, UNC-CH Department of Computer Science, Revision 1.1.*

(Continued)

*Primary Examiner* — Leon Flores
(74) *Attorney, Agent, or Firm* — Robert J. Irvine, III

(57) ABSTRACT

In bus communications methods and apparatus, a first set of physical signals representing the information to be conveyed over the bus is provided, and mapped to a codeword of a sparse signaling code, wherein a codeword is representable as a vector of a plurality of components, some of which are quiescent components and some of which are non-quiescent components, wherein the number of quiescent components and non-quiescent components meet a sparseness requirement.

20 Claims, 45 Drawing Sheets

(56) References Cited

U.S. PATENT DOCUMENTS

| | | | |
|---|---|---|---|
| 7,358,869 B1 * | 4/2008 | Chiarulli et al. | 341/58 |
| 7,362,130 B2 | 4/2008 | Broyde et al. | |
| 7,656,321 B2 | 2/2010 | Wang | |
| 7,706,524 B2 | 4/2010 | Zerbe | |
| 7,746,764 B2 | 6/2010 | Rawlins et al. | |
| 7,933,770 B2 | 4/2011 | Kruger et al. | |
| 8,091,006 B2 | 1/2012 | Prasad et al. | |
| 8,159,375 B2 | 4/2012 | Abbasfar | |
| 8,159,376 B2 | 4/2012 | Abbasfar | |
| 8,279,094 B2 | 10/2012 | Abbasfar | |
| 8,443,223 B2 | 5/2013 | Abbasfar | |
| 2003/0071745 A1 | 4/2003 | Greenstreet | |
| 2006/0159005 A1 | 7/2006 | Rawlins et al. | |
| 2007/0283210 A1 | 12/2007 | Prasad et al. | |
| 2008/0273623 A1 | 11/2008 | Chung et al. | |
| 2009/0185636 A1 | 7/2009 | Palotai et al. | |
| 2010/0180143 A1 | 7/2010 | Ware et al. | |
| 2010/0189186 A1 | 7/2010 | Zerbe | |
| 2010/0205506 A1 | 8/2010 | Hara | |
| 2010/0215118 A1 | 8/2010 | Ware et al. | |
| 2010/0309964 A1 | 12/2010 | Oh et al. | |
| 2011/0029801 A1 | 2/2011 | Abbasfar | |
| 2011/0051854 A1 | 3/2011 | Kizer et al. | |
| 2011/0235501 A1 | 9/2011 | Goulahsen | |
| 2011/0268225 A1 | 11/2011 | Cronie et al. | |
| 2011/0299555 A1 | 12/2011 | Cronie et al. | |
| 2011/0302478 A1 | 12/2011 | Cronie et al. | |
| 2013/0051162 A1 | 2/2013 | Amirkhany et al. | |

OTHER PUBLICATIONS

Abbasfar, A., "Generalized Differential Vector Signaling," IEEE International Conference on Communications, ICC '09, Jun. 14, 2009, pp. 1-5.

Dasilva, et al. "Multicarrier Orthogonal CDMA Signals for Quasi-Synchronous Communication Systems," IEEE Journal on Selected Areas in Communications, Jun. 1, 1994, vol. 12, No. 5, pp. 842-852.

Slepian, D., "Permutation Modulation", Proceedings of the Institute of Electrical Engineers, Institution of Electrical Engineers. Stevenage, GB, Mar. 1, 1965, vol. 53, No. 3, pp. 228-236.

Stan, M. et al., "Bus-Invert Coding for Low-power I/O", 1995, IEEE Transactions on VLSI systems, vol. 3, No. 1, pp. 49-50.

Tallini, L., et al. Transmission Time Analysis for the Parallel Asynchronous Communication Scheme:, 2003, IEEE Transactions on Computers, vol. 52, No. 5, pp. 558-571.

Wang, X. et al., "Applying CDMA Technique to Network-on-chip," IEEE Transactions on Very Large Scale Integration (VLSI) Systems, Oct. 1, 2007, vol. 15, No. 10, pp. 1091-1100.

International Search Report mailed Nov. 5, 2012, in International Patent Application S.N. PCT/EP2012/052767.

International Search Report mailed Jul. 14, 2011 in International Patent Application S.N. PCT/EP2011/002170.

Non-Final Office Action dated Sep. 21, 2012 in related U.S. Appl. No. 12/784,414.

Notice of Allowance dated May 20, 2013 in related U.S. Appl. No. 12/982,777.

* cited by examiner

Figure 1 [PRIOR ART]

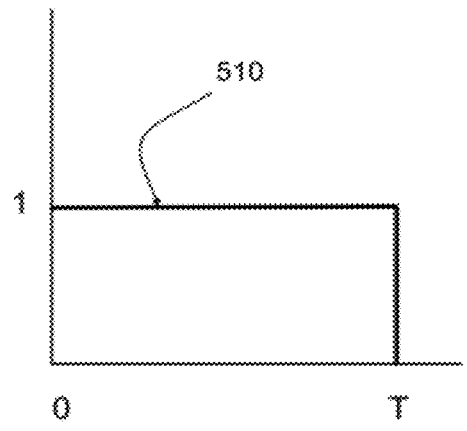
Figure 5 (a)
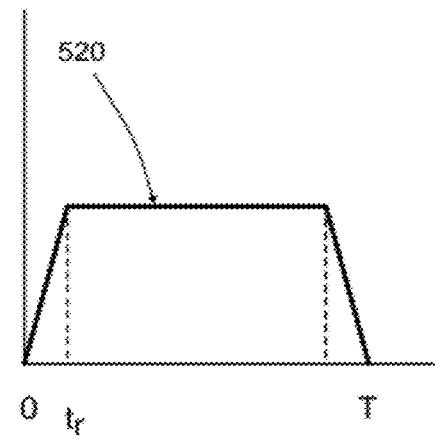
Figure 5 (b)
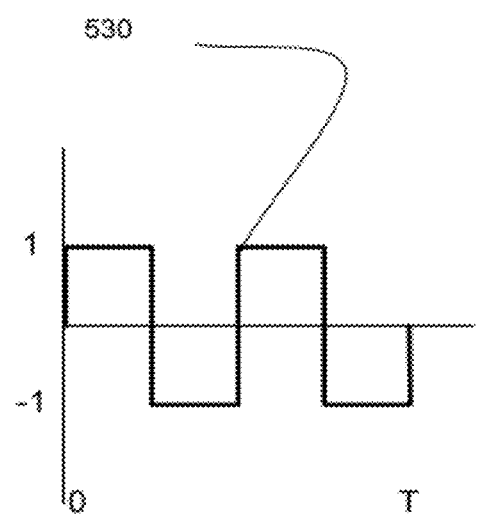
Figure 5 (c)
Figure 5 (PRIOR ART)

| x | b,b,b,b | x | b,b,b,b | x | b,b,b,b | x | b,b,b,b |
|---|---------|---|---------|---|---------|---|---------|
| 0 | 0,4,1,8 | 1 | 6,0,7,8 | 2 | 5,0,7,6 | 3 | 5,0,6,7 |
| 4 | 6,0,7,4 | 5 | 0,6,1,8 | 6 | 4,0,7,6 | 7 | 4,0,6,7 |
| 8 | 5,0,7,4 | 9 | 4,0,7,5 | 10 | 0,6,1,7 | 11 | 4,0,5,7 |
| 12 | 5,0,6,4 | 13 | 4,0,6,5 | 14 | 4,0,5,6 | 15 | 0,4,1,7 |
| 16 | 2,1,3,4 | 17 | 0,1,4,5 | 18 | 0,1,4,6 | 19 | 0,1,4,7 |
| 20 | 0,1,5,4 | 21 | 2,1,3,5 | 22 | 0,1,5,6 | 23 | 0,1,5,7 |
| 24 | 0,1,6,4 | 25 | 0,1,6,5 | 26 | 2,1,3,6 | 27 | 0,1,6,7 |
| 28 | 0,1,7,4 | 29 | 0,1,7,5 | 30 | 0,1,7,6 | 31 | 2,1,3,7 |
| 32 | 1,2,3,4 | 33 | 0,2,4,5 | 34 | 0,2,4,6 | 35 | 0,2,4,7 |
| 36 | 0,2,5,4 | 37 | 1,2,3,5 | 38 | 0,2,5,6 | 39 | 0,2,5,7 |
| 40 | 0,2,6,4 | 41 | 0,2,6,5 | 42 | 1,2,3,6 | 43 | 0,2,6,7 |
| 44 | 0,2,7,4 | 45 | 0,2,7,5 | 46 | 0,2,7,6 | 47 | 1,2,3,7 |
| 48 | 1,3,2,4 | 49 | 0,3,4,5 | 50 | 0,3,4,6 | 51 | 0,3,4,7 |
| 52 | 0,3,5,4 | 53 | 1,3,2,5 | 54 | 0,3,5,6 | 55 | 0,3,5,7 |
| 56 | 0,3,6,4 | 57 | 0,3,6,5 | 58 | 1,3,2,6 | 59 | 0,3,6,7 |
| 60 | 0,3,7,4 | 61 | 0,3,7,5 | 62 | 0,3,7,6 | 63 | 1,3,2,7 |
| 64 | 2,0,3,4 | 65 | 1,0,4,5 | 66 | 1,0,4,6 | 67 | 1,0,4,7 |
| 68 | 1,0,5,4 | 69 | 2,0,3,5 | 70 | 1,0,5,6 | 71 | 1,0,5,7 |
| 72 | 1,0,6,4 | 73 | 1,0,6,5 | 74 | 2,0,3,6 | 75 | 1,0,6,7 |
| 76 | 1,0,7,4 | 77 | 1,0,7,5 | 78 | 1,0,7,6 | 79 | 2,0,3,7 |
| 80 | 1,4,2,5 | 81 | 6,1,7,5 | 82 | 5,1,7,6 | 83 | 5,1,6,7 |
| 84 | 6,1,7,4 | 85 | 1,5,2,5 | 86 | 4,1,7,6 | 87 | 4,1,6,7 |
| 88 | 5,1,7,4 | 89 | 4,1,7,5 | 90 | 1,6,2,7 | 91 | 4,1,5,7 |
| 92 | 5,1,6,4 | 93 | 4,1,6,5 | 94 | 4,1,5,6 | 95 | 1,4,2,7 |
| 96 | 0,2,3,4 | 97 | 1,2,4,5 | 98 | 1,2,4,6 | 99 | 1,2,4,7 |
| 100 | 1,2,5,4 | 101 | 0,2,3,5 | 102 | 1,2,5,6 | 103 | 1,2,5,7 |
| 104 | 1,2,6,4 | 105 | 1,2,6,5 | 106 | 0,2,3,6 | 107 | 1,2,6,7 |
| 108 | 1,2,7,4 | 109 | 1,2,7,5 | 110 | 1,2,7,6 | 111 | 0,2,3,7 |
| 112 | 0,3,2,4 | 113 | 1,3,4,5 | 114 | 1,3,4,6 | 115 | 1,3,4,7 |
| 116 | 1,3,5,4 | 117 | 0,3,2,5 | 118 | 1,3,5,6 | 119 | 1,3,5,7 |
| 120 | 1,3,6,4 | 121 | 1,3,6,5 | 122 | 0,3,2,6 | 123 | 1,3,6,7 |
| 124 | 1,3,7,4 | 125 | 1,3,7,5 | 126 | 1,3,7,6 | 127 | 0,3,2,7 |
| 128 | 1,0,3,4 | 129 | 2,0,4,5 | 130 | 2,0,4,6 | 131 | 2,0,4,7 |
| 132 | 2,0,5,4 | 133 | 1,0,3,5 | 134 | 2,0,5,6 | 135 | 2,0,5,7 |
| 136 | 2,0,6,4 | 137 | 2,0,6,5 | 138 | 1,0,3,6 | 139 | 2,0,6,7 |
| 140 | 2,0,7,4 | 141 | 2,0,7,5 | 142 | 2,0,7,6 | 143 | 1,0,3,7 |
| 144 | 0,1,4,4 | 145 | 2,1,4,5 | 146 | 2,1,4,6 | 147 | 2,1,4,7 |
| 148 | 2,1,5,4 | 149 | 0,1,3,5 | 150 | 2,1,5,6 | 151 | 2,1,5,7 |
| 152 | 2,1,6,4 | 153 | 2,1,6,5 | 154 | 0,1,3,6 | 155 | 2,1,6,7 |
| 156 | 2,1,7,4 | 157 | 2,1,7,5 | 158 | 2,1,7,6 | 159 | 0,1,3,7 |
| 160 | 2,4,3,5 | 161 | 6,2,7,5 | 162 | 5,2,7,6 | 163 | 5,2,6,7 |
| 164 | 6,2,7,4 | 165 | 2,5,3,5 | 166 | 4,2,7,6 | 167 | 4,2,6,7 |
| 168 | 5,2,7,4 | 169 | 4,2,7,5 | 170 | 2,6,3,7 | 171 | 4,2,5,7 |
| 172 | 5,2,6,4 | 173 | 4,2,6,5 | 174 | 4,2,5,6 | 175 | 2,4,3,7 |
| 176 | 0,3,1,4 | 177 | 2,3,4,5 | 178 | 2,3,4,6 | 179 | 2,3,4,7 |
| 180 | 2,3,5,4 | 181 | 0,3,1,5 | 182 | 2,3,5,6 | 183 | 2,3,5,7 |
| 184 | 2,3,6,4 | 185 | 2,3,6,5 | 186 | 0,3,1,6 | 187 | 2,3,6,7 |
| 188 | 2,3,7,4 | 189 | 2,3,7,5 | 190 | 2,3,7,6 | 191 | 0,3,1,7 |
| 192 | 1,0,2,4 | 193 | 3,0,4,5 | 194 | 3,0,4,6 | 195 | 3,0,4,7 |
| 196 | 3,0,5,4 | 197 | 1,0,2,5 | 198 | 3,0,5,6 | 199 | 3,0,5,7 |
| 200 | 3,0,6,4 | 201 | 3,0,6,5 | 202 | 1,0,2,6 | 203 | 3,0,6,7 |
| 204 | 3,0,7,4 | 205 | 3,0,7,5 | 206 | 3,0,7,6 | 207 | 1,0,2,7 |
| 208 | 0,1,2,4 | 209 | 3,1,4,5 | 210 | 3,1,4,6 | 211 | 3,1,4,7 |
| 212 | 3,1,5,4 | 213 | 0,1,2,5 | 214 | 3,1,5,6 | 215 | 3,1,5,7 |
| 216 | 3,1,6,4 | 217 | 3,1,6,5 | 218 | 0,1,2,6 | 219 | 3,1,6,7 |
| 220 | 3,1,7,4 | 221 | 3,1,7,5 | 222 | 3,1,7,6 | 223 | 0,1,2,7 |
| 224 | 0,2,1,4 | 225 | 3,2,4,5 | 226 | 3,2,4,6 | 227 | 3,2,4,7 |
| 228 | 3,2,5,4 | 229 | 0,2,1,5 | 230 | 3,2,5,6 | 231 | 3,2,5,7 |
| 232 | 3,2,6,4 | 233 | 3,2,6,5 | 234 | 0,2,1,6 | 235 | 3,2,6,7 |
| 236 | 3,2,7,4 | 237 | 3,2,7,5 | 238 | 3,2,7,6 | 239 | 0,2,1,7 |
| 240 | 0,4,3,5 | 241 | 6,3,7,5 | 242 | 5,3,7,6 | 243 | 5,3,6,7 |
| 244 | 6,3,7,4 | 245 | 0,5,3,5 | 246 | 4,3,7,6 | 247 | 4,3,6,7 |
| 248 | 5,3,7,4 | 249 | 4,3,7,5 | 250 | 0,6,3,7 | 251 | 4,3,5,7 |
| 252 | 5,3,6,4 | 253 | 4,3,6,5 | 254 | 4,3,5,6 | 255 | 0,4,3,7 |

METHODS AND SYSTEMS FOR NOISE RESILIENT, PIN-EFFICIENT AND LOW POWER COMMUNICATIONS WITH SPARSE SIGNALING CODES

CROSS REFERENCES

The following references are herein incorporated by reference in their entirety for all purposes:

U.S. Patent Application No. 61/330,107 filed Apr. 30, 2010 naming Harm Cronie and Amin Shokrollahi, and entitled "Orthogonal Differential Vector Signaling" and hereinafter "Cronie I").

U.S. patent application Ser. No. 12/982,777 filed Dec. 20, 2010 naming Harm Cronie and Amin Shokrollahi, and entitled "Power and Pin Efficient Chip-to-Chip Communications with Common-Mode Rejection and SSO Resilience" (hereinafter "Cronie II").

FIELD OF THE INVENTION

The present invention relates to communications in general and in particular to transmission of signals capable of conveying information

BACKGROUND OF THE INVENTION

One goal of a communication system is to transport information from one physical location to another. In most electronic communication systems, the communication itself takes place between electronic components. Often, these electronic components are integrated circuits ("ICs") and this communication setting is referred to as "chip-to-chip communication." The communicating electronic components might be located in the same apparatus, such as the communication between a central processing unit ("CPU") and memory inside a computer, tablet computing device, or other mobile device. Another example is the communication between two CPU cores that are integrated on the same chip. Yet another example is the communication between a Graphics Processing Unit ("GPU") and memory on a graphics card. In these cases, the actual communication takes place over wires on a printed circuit board ("PCB") and/or metal wires integrated in a chip and these wires carry electrical signals. It should be apparent upon reading this disclosure that other possibilities exist. The communication may, for instance, take place wirelessly or over an optical fiber.

In some case, communication takes place between components that are located in different apparatuses. An example of this situation is a digital photo camera that is connected to a computer. In this setting, the communication takes place over a physical cable or wirelessly. Another example is a set of computers that are connected to a network. The electronic components on the network card of each computer communicate with the electronic components of another network card of yet another computer.

In all these communication settings, a goal is to transmit digital information from one electronic component to another in a reliable and efficient way. The efficiency of the communication can be expressed in terms of the time it takes to transfer certain amount of information (speed), the energy that is required to transmit the information reliably (power consumption) and the number of wires per bit that is required for communication (pin-efficiency). In most systems, several trade-offs exist between these parameters and, depending on the application, some of these parameters may be more important than others. A good example is the communication between a CPU and a memory in a mobile device. A battery feeds a mobile device and the power consumption of the communication between the CPU and memory has a large impact on the battery life. When the device is wall-plugged, power consumption may be less of an issue, but the design needs to deal with the unplugged environment.

In most chip-to-chip communication systems communication takes place over a plurality of wires to increase the aggregate bandwidth. A single or pair of these wires may be referred to as a channel or link and multiple channels create a communication bus between the electronic components.

The difficulty in designing high speed, low power and pin-efficient chip-to-chip communication systems lies in part in the fact that the communication channel is not perfect. First, the physical wires will disturb the signals transmitted on them and noise and interference will be added to the transmitted signals. Second, the electronic components used to implement the communication system are not perfect and this disturbs the signals used for communication.

There are several typical sources of noise in chip-to-chip communication systems. First, there is noise and interference that is common to a set of wires. This type of noise and interference is called common-mode noise. Second, there is thermal noise that is induced in electrical conductors. Thermal noise is often well modeled as Gaussian noise that is superimposed to each conductor independently. Third, there is simultaneous switching output ("SSO") noise that is caused by a time-varying current in the electronics that drive the wires. Fourth, the signals transmitted on different wires may interfere with one other, which causes crosstalk and severely degrades signal integrity especially at high speeds. Fifth, for some signaling methods an absolute voltage or current reference is required at the receiver. Such references are hard to make precisely and any errors in the reference may cause unwanted distortions and noise.

Many conventional chip-to-chip communication systems employ differential signaling to solve several of these issues related to noise. A typical chip-to-chip communications system based on differential signaling comprises multiple links and an example of such a system with n links is shown in FIG. 1. As shown there, a first IC 110 communicates with a second IC 120 over a bus 130 comprising 2n wires 135. The two chips may be located in two different devices or may be located in the same device. In the latter case, the two chips may be mounted on the same PCB or may be integrated in the same package or even on the same die. The latter is often referred to as "on-chip communications." The IC 110 employs a set of n transceivers 140 that implement differential signaling. At the other end of the bus 130, the IC 120 employs another set of n transceivers. The i-th transceiver in IC 110 is connected by two wires to the i-th transceiver in IC 120.

FIG. 2 illustrates, at a high-level overview, a transmitter and a receiver that implement differential signaling. As shown there, communication takes place over a bus 130 comprising two wires. At the transmitter, a driver 210 drives the two wires of the bus and produces a signal 220 that is denoted by $s_0$ for the first wire and a signal 230 that is denoted by $s_1$ for the second wire. The signals may correspond to a physical voltage across the wires of the bus or a current through the wires of the bus. At the receiver side, the bus is terminated by a resistor 240. A differential receiver 250 senses the voltage across the termination resistor 240. In differential signaling, these signals satisfy $s_0 = -s_1$ and it is known to one of skill in the art that this gives differential signaling its excellent properties with respect to common-mode noise, SSO noise and crosstalk. A major disadvantage of differential signaling is that it requires two wires for every signal that is to be transmitted on the communication bus. The pin-efficiency of differential signaling is only one half. Furthermore, a substantial amount of transmitter power is required to operate a bus communication system based on differential links.

Some solutions to these problems are taught by Cronie I, showing, among other things, a method to increase the pin-efficiency of chip-to-chip communication systems to a number close to, but smaller than one. The signaling methods disclosed in Cronie I preserve the properties with respect to common-mode noise, SSO noise and interference when implemented properly, but sometimes a greater pin-efficiency is desired. To further increase the pin-efficiency while maintaining good noise resilience, one can use methods disclosed in Cronie II.

Several embodiments described in Cronie II use spherical codes for chip-to-chip communication. Other embodiments in Cronie II are more specific and involve group codes, and teach to use a particular type of group codes called permutation modulation codes for chip-to-chip communications. In their original form, permutation modulation codes were known. [Slepian] suggested the use of such codes for transmission of information on communication channels in which signals are disturbed by Gaussian noise. Cronie II contains some examples of permutation modulation codes applied to chip-to-chip communication, and teaches how to achieve pin-efficiencies of one or larger using such techniques. However, some applications might be improved or require additional simplification and/or an even further reduction of chip-to-chip communication systems power consumption based on permutation modulation codes.

The methods disclosed in [Chiarulli] lead to a signaling scheme with the properties of differential signaling and an increased pin-efficiency compared to differential signaling. However, the resulting pin-efficiencies are substantially less than one and the methods disclosed in [Chiarulli] only lead to moderate improvements in power consumption. Furthermore, encoding and decoding complexity is an issue for the methods disclosed in [Chiarulli].

In [Poulton], a specific variant of a permutation modulation code is disclosed. However, a major downside of the methods disclosed in [Poulton] is the complexity of the circuitry required for encoding and decoding at the transmitter and receiver side. Furthermore, the scheme does not lead to improvements in power consumption and is only useful to improve upon the pin-efficiency, as pointed out in [Poulton]. Furthermore, the invention disclosed in [Poulton] is only useful for a relatively small number of bus wires (e.g., less than six) due to the complexity of encoding and decoding of the codes.

What is therefore needed are improved methods for chip-to-chip communications that result in a high pin-efficiency, have good resilience against different noise types present in chip-to-chip communications and are efficient in terms of the power consumption of the transmitter and receiver.

REFERENCES

[Poulton] U.S. Pat. No. 6,556,628 B1 issued Apr. 29, 2003 to John W. Poulton, Stephen G. Tell and Robert E. Palmer, and entitled "Methods and Systems for Transmitting and Receiving Differential Signals Over a Plurality of Conductors".

[Chiarulli] U.S. Pat. No. 7,358,869 issued Apr. 15, 2008 to Donald M. Chiarulli and Steven P. Levitan, and entitled "Power Efficient, High Bandwidth Communication Using Multi-Signal-Differential Channels".

[Slepian] Slepian, D., "Permutation Modulation", published in Proc. of the IEEE, Vol. 53, No. 3, March 1965, pp. 228-236.

BRIEF SUMMARY OF THE INVENTION

Embodiments of the present invention provide for processes and apparatus for transmitting data over physical channels such that the signals transmitted are resilient to common mode noise, do not require a common reference at the transmission and reception points, involving a pin-efficiency that is greater than 50%, with relatively low power dissipation for encoding and decoding. In some embodiments, pin-efficiency is greater than 100% and uses a relatively few active transmission wires at any given time. Corresponding decoders at reception points are also disclosed.

In a particular embodiment, information is transmitted over a communication bus by receiving a first set of signals representing the information, mapping the first set of signals to a second set of signals, wherein the second set of signals comprises one or more code word selected from among the valid code words of a sparse signaling code, and providing the second set of signals for transmission over the communication bus. A corresponding decoder decodes the second set of signals (possibly altered by the communication bus) in an attempt to recover a replication of the first set of signals while reducing the amount of energy needed to do so.

In some embodiments, code words can be represented by vectors and each vector comprises a plurality of vector components and further, the signaling code is characterized by having code words representable by vectors having quiescent vector components and nonquiescent vector components and wherein a sparse signaling code is one where the number of quiescent vector components and nonquiescent vector components meets some sparseness requirement. One such sparseness requirement might be that a ratio of quiescent vector components to total vector components is greater than or equal to one-third. However, other sparseness requirements might be used instead. In specific examples, a quiescent vector component is represented by a value of zero, a zero voltage and/or a zero current, but the sparse code need not be limited to such examples. In general, a quiescent vector component is a vector component that does not lead to physical power transfer from one end to another end of a bus wire, or at least substantially less physical power transfer as compared with the physical power transfer caused by a nonquiescent vector component. The quiescent vector component is typically referred to herein as the "zero" symbol.

In some embodiments, different voltage, current, etc. levels are used for signaling and more than two levels might be used, such as a ternary sparse signaling code wherein each wire signal has one of three values. In some embodiments, there are no more than two nonquiescent vector components for each code word vector and in some embodiments, at least half of the vector components of each code word vector are quiescent vector components.

Hardware elements might be provided to provide storage for symbols of input information used for selecting code words, processing hardware to convert symbols to signals, parsing symbols into separate partitions, storing results, and providing the partitions in sequence as signals.

Various embodiments of the invention are given with reference to specific hardware implementations of small area and low power dissipation. The following detailed description together with the accompanying drawings will provide a better understanding of the nature and advantages of the present invention.

BRIEF DESCRIPTION OF THE DRAWINGS

FIG. 5 illustrates examples of conventional pulse shapes that might be used for signaling; FIG. 5(a) illustrates a square pulse 510; FIG. 5(b) illustrates a pulse with a finite rise and a finite fall time; and FIG. 5(c) illustrates a pulse 530 that comprises two periods of a bi-polar square wave.

FIG. 30 is a table of an example of a mapping from a decimal representation of bits to integers.

DETAILED DESCRIPTION OF THE INVENTION

Figure 1:
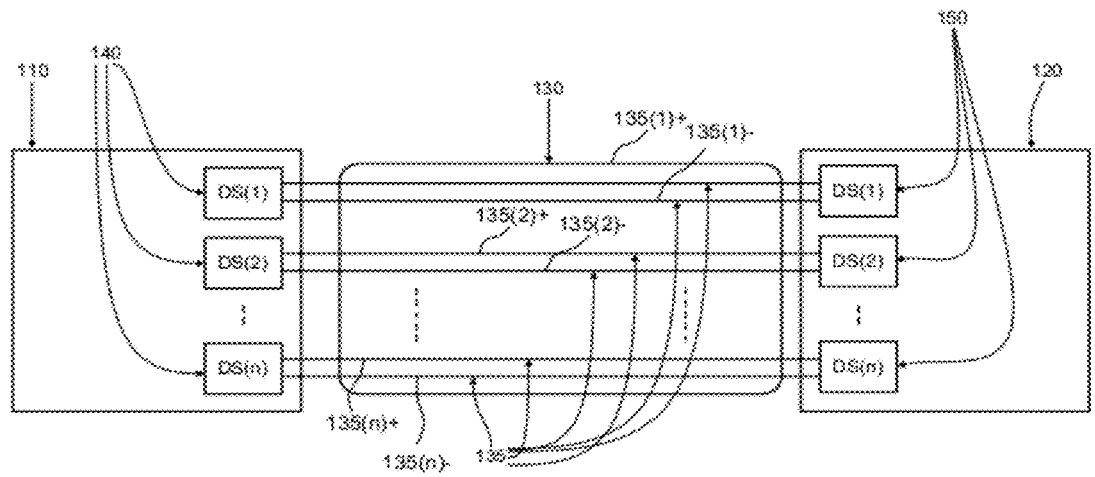
FIG. 1 illustrates a conventional chip-to-chip communication system employing differential signaling with multiple links.
Figure 2:
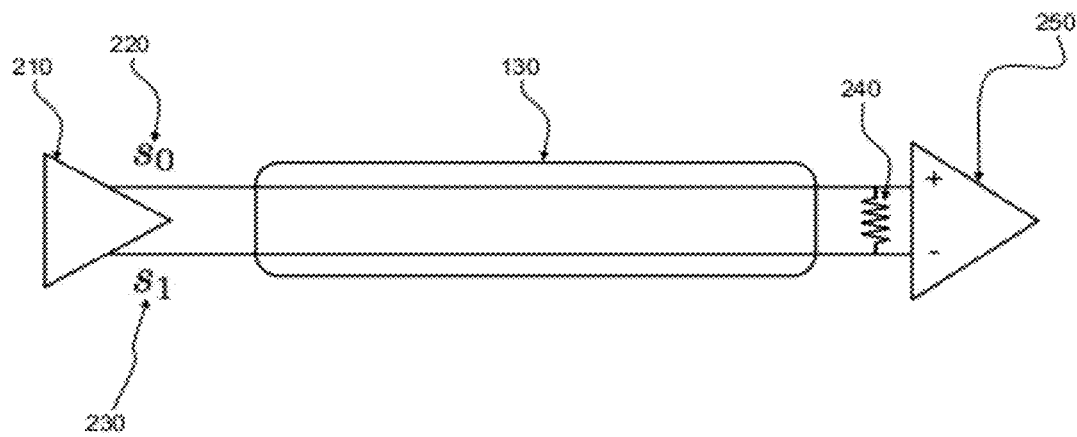
FIG. 2 illustrates, at a high level overview, a transmitter and a receiver that implement differential signaling.
Figure 3:
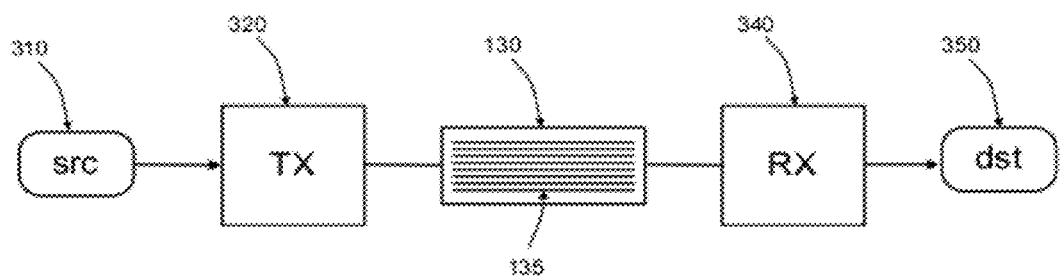
FIG. 3 is a high-level block diagram of a bus communication system over which the present invention might be used, or conventional transmitters/receivers might be used.

FIG. 3 is a high-level block diagram of a bus communication system over which the present invention might be used, or conventional transmitters/receivers might be used. With such a system, there are multiple wires of the bus and signals are sent over those multiple wires, typically at a periodic rate. Thus, an information source 310 might provide a sequence of k information symbols per period, where the period might be measured as a time interval of 1/T seconds. In preferred embodiments, T is greater than one and where T is an integer, the bus can convey the information content of kT symbols per second. Without loss of generality, we can assume that these information symbols are bits.

These bits are to be transmitted on the communication bus 130 to a destination 350. The communication bus 130 comprises n physical wires 135. An example of such a communication bus 130 is for example a bus between a processor and memory. In this case the physical wires may take the form of striplines or microstrips on a PCB. Another example of a communication bus 130 is a set of wires connecting two different devices. The information bits in 310 are fed to transmit unit 320. The task of the transmit unit 320 is to transform these bits into a set of physical signals that can be transmitted on the wires of bus 130. At the other side of the bus 130, a receive unit 340 maps the received signals back to information bits in 310.

In this disclosure, most of the examples refer to communication buses where the wires carry electrical signals. However one of ordinary skill in the art, upon reading this disclosure, should recognize that the methods disclosed below are not limited to electrical signals only. The methods may readily be applied in the setting of optical communications.

As used here, pin-efficiency of a chip-to-chip communication system refers to a ratio of the number of bits transmitted in each time interval and the number, n, of physical wires used to transmit those bits. In the case of optical channels, wires might be replaced by fiber or other media.

Figure 4:
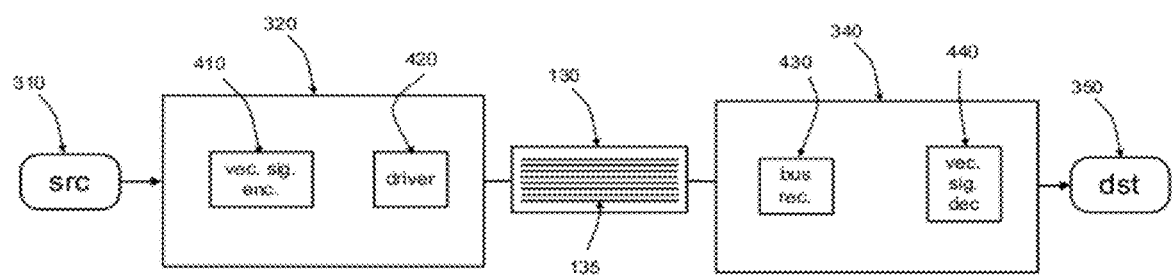
FIG. 4 illustrates an increased pin-efficiency architecture over which the present invention could be used.

FIG. 4 illustrates an increased pin-efficiency architecture over which the present invention could be used. This is shown by Cronie II and also deals with many of the types of noise in a bus communication system. In a system according to that illustration, at the transmit side the transmit unit 320 comprises a vector signal encoder 410 and a bus driver 420. At the receive side, the receive unit 340 comprises a bus receiver 430 and a vector signal decoder 440. In FIG. 4, the information source 310 supplies a sequence of k bits every 1/T seconds to the vector signal encoder 410. In the i-th time interval, the vector signal encoder maps these k bits to a vector $c_i$. The vector $c_i$ is supplied to the bus driver 420 that generates a sequence of n signals $s_0(t)$ to $s_{n-1}(t)$. These n signals may be written as shown in Equation 1, where p(t) denotes a pulse shape.

$$\begin{bmatrix} s_0(t) \\ \vdots \\ s_{n-1}(t) \end{bmatrix} = c_i p(t) \quad \text{(Eqn. 1)}$$

FIG. 5 illustrates examples of conventional pulse shapes that might be used for signaling; FIG. 5(a) illustrates a square pulse 510; FIG. 5(b) illustrates a pulse 520 with a finite rise and a finite fall time; and FIG. 5(c) illustrates a pulse 530 that comprises two periods of a bi-polar square wave. Pulse 530 may be useful to facilitate clock recovery and equalization. One of ordinary skill in the art will recognize that other pulse shapes could be used instead.

For a single wire, some pulse shapes are referred to as pulse-amplitude modulation, but the invention is not so limited. In the general case, time is divided into periods and for each period on each of n wires, some signal of some pulse shape is conveyed according to the code word or code words used for the period.

In the example illustrated, the signals $s_0(t)$ to $s_{n-1}(t)$ are transmitted by bus driver 420 as, e.g., currents or voltages on the wires of the bus. These currents or voltages induce electromagnetic waves that traverse the bus. Bus driver 420 may perform additional tasks, such as amplification, pre-emphasis, equalization and filtering before actual transmission on the bus. At the receiver side, a set of signals $y_0(t)$ to $y_{n-1}(t)$ is present and these are sensed by the bus receiver 430. In the presence of noise or other signal alterations of the wires or channels, a set of signals $y_0(t)$ to $y_{n-1}(t)$ might not exactly equal the set of signals $s_0(t)$ to $s_{n-1}(t)$, as is well-known. The bus receiver 430 may perform additional tasks, such as amplification, filtering and other operations that improve upon the quality of the received signals. Many of these methods are known to one of skill in the art. The task of the bus receiver 430 is to provide a reconstruction of the vector $c_i$ to the vector signal decoder 440. The vector signal decoder 440 recovers the original k bits from $c_i$ and supplies them to the destination 350.

In a preferred embodiment in Cronie II, the vector $c_i$ may be taken to be a specific element chosen from a predetermined set S. The vector $c_i$ itself is called the code word and the set S is referred to as the code or the signal constellation. It should be understood that when code or constellation is used, it is not (unless otherwise indicated) merely an abstract mathematical construct, but is a configuration of encoders and decoders, and processes for encoding and decoding, that use the code and its code words for communications.

In general, the pin-efficiency, r, of a bus communication system using the signal constellation S can be calculated from the constellation S and the number, n, of wires as shown by Equation 2.

$$r = \frac{\log_2 |S|}{n} \quad \text{(Eqn. 2)}$$

As is explained below, one can construct a noise-resilient, pin-efficient, and power-efficient bus communication system using the techniques taught herein, by a proper choice and implementation of the signal constellation S and corresponding vector signal encoder 410, bus driver 420, bus receiver 430 and vector signal decoder 440.

Multi-Wire Communications with Sparse Signaling Codes

Figure 6:
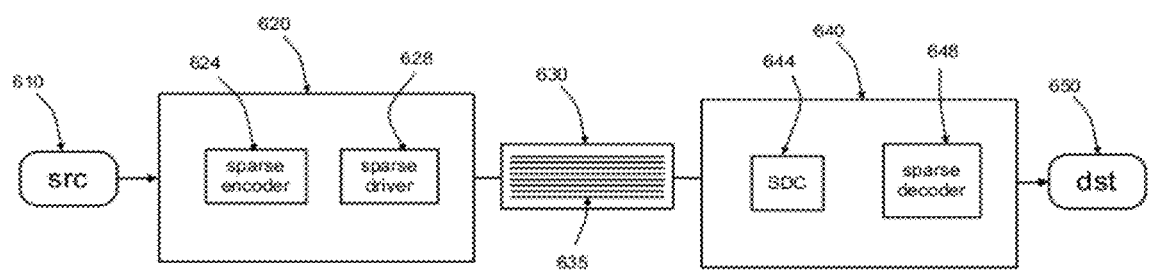
FIG. 6 illustrates a bus communication system according to embodiments of the present invention, comprising a transmitter and a receiver, the former with a sparse encoder and a sparse driver, while the receiver has corresponding elements.

FIG. 6 illustrates a bus communication system according to embodiments of the present invention, comprising a transmitter and a receiver, the former with a sparse encoder and a sparse driver, while the receiver has corresponding elements.

In the structure shown in FIG. 6, bus communication takes place over a communication bus 630 comprising a set of wires 635. Herein, "n" is used to indicate the number of wires. Generally, n is selected to be two or more and the exact value might be driven by the needs of the particular application, such as being constrained by the number of pins allotted on a chip for the bus or other considerations. Each of these n wires can be means of signal transmission where the signal may be defined by a current or voltage and physically distinct such that different signals can be present on different wires and might be independent between at least some of the wires. The bus communication system may employ termination at one or both sides of the bus. Information available in a source 610 is to be communicated to a destination 650 at the other end of the bus. Many methods and apparatus for driving a signal on a wire are known and so will not be described herein in great detail.

Without loss of generality, one may assume that the information to be conveyed is available as a sequence of bits in the source 610. Every period of 1/T seconds, k of those bits may be available in the source 610. Here, T is typically a number greater than one. For example, where the bus communication system is to transmit 16 Gigabits of data per second, then 1/T may be chosen to be $(k \times 10^{-9})/16$. These bits are fed to a bus transmitter 620.

The bus transmitter 620 comprises a sparse encoder 624 and a sparse driver 628. The sparse encoder 624 takes as its input the k bits from the source 610 and produces a sequence of n numbers or a set of numbers, signals, values, stored memory elements or electronic hardware elements or configurations that represent these n numbers. These n numbers (or their representations) are fed to the sparse driver 628, whose task it is to generate a sequence of signals corresponding to the data generated by the sparse encoder 624. The sparse driver 628 may or may not use the specific form of numbers generated by sparse encoder 624. The signals generated by the sparse driver 628 usually correspond to currents and/or voltages defining the electromagnetic waves induced on the bus wires 635.

The sparse driver 628 may also perform additional signal processing such as amplification, filtering and equalization before driving the wires 635 of the bus 630. At the receive end of the bus, a signal-to-digital converter (SDC) 644 senses the signals that are present on the wires of the bus and generates a representation of the numbers generated by the sparse driver 628 which, as explained above, might not match what was transmitted.

The SDC 644 may or may not use the specific form of numbers generated by sparse encoder 624, or the specific form of the signals generated by sparse driver 628. The SDC 644 may perform additional tasks such as amplification, filtering or any other signal processing functionality required to successfully recover the data transmitted on the bus. The data generated by the SDC 644 is passed along to the sparse decoder 648. The sparse decoder 648 attempts to recover the original data in 610 from the discrete representation of the signals on the bus that the SDC 644 has generated. One of ordinary skill in the art should recognize that in a chip-to-chip communication system bi-directional communications may be preferred for some applications. It is straightforward to extend the circuits of FIG. 6 to support bi-directional communications.

Sparse Signaling Codes

In a preferred embodiment, the sparse encoder 624 maps a sequence of k bits to n real numbers represented by a vector, c, of size n where the vector c is an element of a predetermined signal constellation, S. The signal constellation S may contain at least $2^k$ elements, wherein each element has the property that it is a permutation of a vector, $x_0$. The vector $x_0$ is referred to herein as the basis vector of the signal constellation and the signal constellation defines a permutation modulation code. In a preferred embodiment, the vector $x_0$ is defined by a sequence of m integers, $l_0$ to $l_{m-1}$, where $l_0 \leq l_1 \leq \ldots \leq l_{m-1}$. Below, N is used to represent the sum of the m integers, as in Equation 3.

$$N = \sum_{i=0}^{m-1} l_i \quad \text{(Eqn. 3)}$$

The basis vector $x_0$ has the form shown in Equation 4, where $a_0$ to $a_{m-1}$ are non-zero numbers such that Equation 5 is satisfied, i.e., that the sum of the values of all instances of $a_i$ that appear in the basis vector sum to zero.

$$x_0 = (\underbrace{a_0, \ldots, a_0}_{l_0} | \underbrace{a_1, \ldots, a_1}_{l_1} | \ldots | \underbrace{a_{m-1}, \ldots, a_{m-1}}_{l_{m-1}} | \underbrace{0, \ldots, 0}_{n-N}) \quad \text{(Eqn. 4)}$$

$$\sum_{i=0}^{m-1} l_i a_i = 0 \quad \text{(Eqn. 5)}$$

The basis vector $x_0$ is sparse, by some sparseness criteria. In some embodiments, sparse is defined by the ratio of n to N. For example, the encoder in one example is constrained to use sparse code words in that it is configured to satisfy Equation 6, wherein the number of quiescent components of the basis vector (here represented as "0" symbols) is at least one third of the total number of components of the basis vector. However, other sparseness measures might be used instead.

$$\frac{n-N}{n} \geq \frac{1}{3} \quad \text{(Eqn. 6)}$$

Since $x_0$ is sparse and Equation 5 holds, m will be greater than one and $x_0$ will have at least three different components. A signaling code is referred to herein as a "sparse signaling code" when the code's signal constellation involves a sparse vector. In embodiments where the encoders and decoders use m=2, i.e., where the basis vector is a sparse vector if comprises components of a first nonzero value, components of a second nonzero value and zero components, it is referred to herein as "a ternary sparse signaling code."

Several advantages of the methods disclosed herein follow from the sparsity of $x_0$, and such advantages are present even if the zeroes in the basis vector $x_0$ (i.e., the quiescent components) are represented by some nonzero value, either in processing, storage or computation at the encoder and/or decoder. For example, a transformation of the zeroes to non-zeroes may result in the same power savings. However, for clarity of disclosure, such quiescent components are represented by zeroes and zeroes represent symbols that do not lead to physical power transfer from one end to another end of the bus wires.

When structure of $x_0$ is as described above a sequence of k bits is encoded into a permutation of $x_0$, some noise resilience and pin-efficiency benefits of a chip-to-chip communication system follow. First, due to the sparsity, the amount of power required to transmit the vector corresponding to a permutation of $x_0$ is substantially less than in a case in which $x_0$ is not sparse. Second, the sparsity of $x_0$ allows for very efficient mappings from a set of k bits to a permutation of $x_0$ and vice-versa. Third, additional power may be saved by employing a sparse driver 628 and/or a SDC 644 that are tailored to the specifics of the basis vector $x_0$. These advantages are explained and exemplified in more detail throughout the remainder of this disclosure.

In a preferred embodiment, the sparse driver 628 may generate a sequence of n signals, $s_0(t)$ to $s_{n-1}(t)$, where signal $s_i(t)$ corresponds to a voltage and/or current induced on the i-th wire of the bus. Furthermore, these n signals are proportional to the n values generated by the sparse encoder 624 and have the form shown in Equation 7, where p(t) denotes a pulse shape and $c_i$ is a valid word from the signal constellation (a permutation of $x_0$) as generated by the sparse encoder 624.

$$\begin{bmatrix} s_0(t) \\ \vdots \\ s_{n-1}(t) \end{bmatrix} = c_i p(t) \quad \text{(Eqn. 7)}$$

Noise Resilience

The signals $s_0(t)$ to $s_{n-1}(t)$ generated by the sparse driver 628 satisfy Equation 5 and this results in resilience against common-mode noise and interference. Furthermore, no reference at the receiver is required to detect and decode the received signals. The SDC 644 can make use of these properties as is exemplified later in this disclosure.

Figure 7:
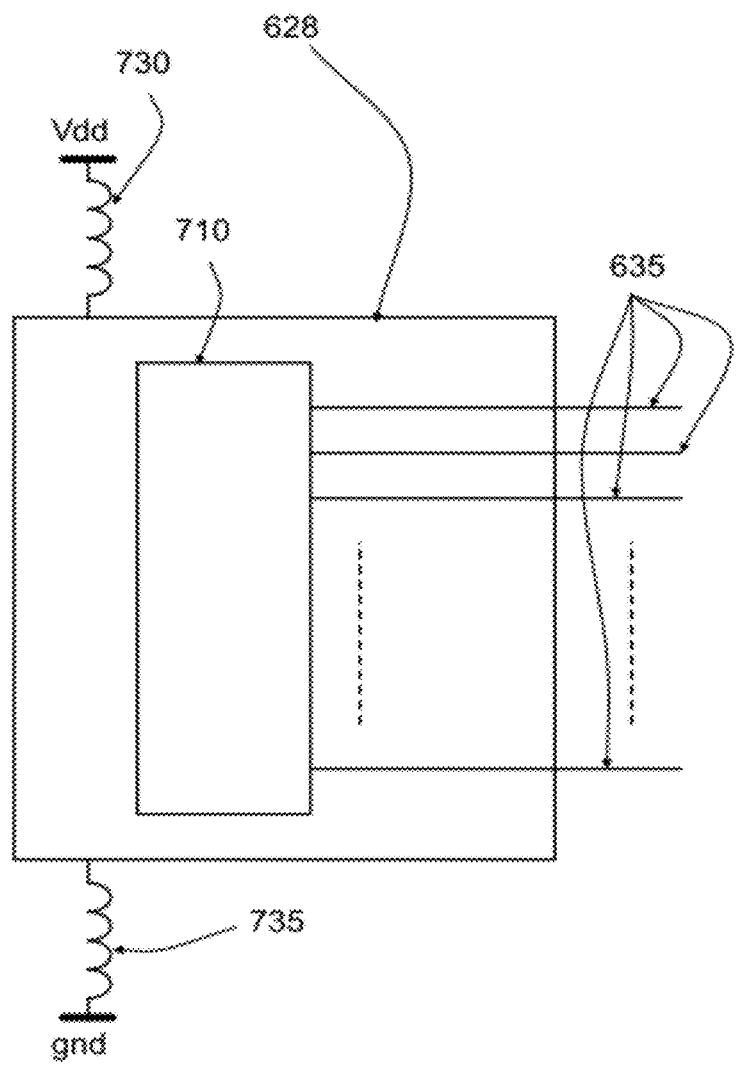
FIG. 7 illustrates a bus driver in more detail.

FIG. 7 illustrates a specific example of a bus driver in more detail. Simultaneous switching output ("SSO") noise may be minimized as illustrated with reference to FIG. 7, which shows a bus driver 628 for a set of n bus wires 635. The electronics of the bus driver 628 is in the unit 710 which is fed by a power supply through the parasitic inductors 730 and 735. The inductors 730 and 735 are the result of parasitic effects in the package of the chip and/or impedance discontinuities present in the path connecting the chip to the power supply outside the chip.

If the currents through the inductors 730 and 735 vary from cycle to cycle, a voltage is induced across the inductors 730 and 735. This may cause interference to the signals transmitted on the bus wires 635. A large part of the current through the inductors 730 and 735 comprises the currents induced on the bus wires 635. However, if Equation 5 holds for a particular implementation, the sum of these currents is zero and the variation of the currents through inductors 730 and 735 is minimized.

Crosstalk between the bus wires 635 is often the result of inductive and/or capacitive coupling between the bus wires 635. The magnitude of the crosstalk induced is proportional to the derivatives of the currents and/or voltages on the bus wires 635. Since, in preferred embodiments, the basis vector $x_0$ is sparse, the average number of transitions is smaller compared to a non-sparse $x_0$ and the amount of crosstalk is reduced.

Pin-Efficiency

The pin-efficiency, r, depends on the number of bus wires n and the basis vector $x_0$. For a sparse basis vector $x_0$, the maximum number of elements a signal constellation S can contain is given by Equation 8.

$$|S| = \frac{n!}{l_0! l_1! \ldots l_{m-1}! l_{n-N}!}. \quad \text{(Eqn. 8)}$$

Table 1 lists example sparse basis vectors $x_0$ for various values of n along with their corresponding values for S and their pin-efficiencies (using Equation 2).

TABLE 1

| n | $x_0$ | S | $\log_2 |S|$ | r |
|---|---|---|---|---|
| 4 | [−1, 1, 0, 0] | 12 | 3.59 | 0.90 |
| 5 | [−1, 1, 0, 0, 0] | 20 | 4.32 | 0.86 |
| 6 | [−1, 1, 0, 0, 0, 0] | 30 | 4.91 | 0.82 |
| 6 | [−1, −1, 1, 1, 0, 0] | 90 | 6.49 | 1.08 |
| 8 | [−1, −1, 1, 1, 0, 0, 0, 0] | 420 | 8.71 | 1.09 |
| 8 | [−2, −1, 1, 2, 0, 0, 0, 0] | 1680 | 10.71 | 1.34 |
| 9 | [−1, 1, 0, 0, 0, 0, 0, 0, 0] | 72 | 6.17 | 0.69 |
| 10 | [−2, −1, 1, 2, 0, 0, 0, 0, 0, 0] | 5040 | 12.30 | 1.23 |
| 12 | [−2, −1, 1, 2, 0, 0, 0, 0, 0, 0, 0, 0] | 11880 | 13.54 | 1.13 |
| 16 | [−1, −1, −1, 1, 1, 1, 0, 0, 0, 0, 0, 0, 0, 0, 0, 0] | 160160 | 17.29 | 1.08 |
| 17 | [−1, 1, 0, 0, 0, 0, 0, 0, 0, 0, 0, 0, 0, 0, 0, 0, 0] | 272 | 8.09 | 0.48 |

Table 1 clearly shows that pin-efficiencies can be obtained that are substantially larger than those of bus communication systems based on differential signaling, which have a pin-efficiency of r=0.5. In preferred embodiments, k is an integer and not all possible permutations of the basis vector $x_0$ are used. For instance, for the first entry of Table 1, the encoder might only use eight permutations of [−1, 1, 0, 0] to transmit three bits per time interval 1/T seconds on a bus comprising four wires.

Power Consumption

The n signals generated by the sparse driver 628 may be generated according to Equation 7. The signals $s_0(t)$ to $s_{n-1}(t)$ may correspond to voltages and/or currents induced on the bus wires 635 by the sparse driver 628. Since the power delivered to the bus is proportional to sum of squares of the $s_i(t)$, the power delivered to the bus is also proportional to the sum of the products as shown in Equation 9.

$$P \propto \sum_{i=0}^{m-1} l_i a_i^2 \quad \text{(Eqn. 9)}$$

The amount of power used to transmit the signals determines the resilience to noise of the signals. For the purpose of this disclosure, a rather simple but sufficiently accurate noise model is used. At the receiver end of the bus, a circuit design might require that at each wire the minimum separation between measured signal levels has at least some positive value d. The exact value of d may depend on the noise levels, the type of termination and the technology in which the circuitry is implemented. However, the value of d is proportional to the minimum separation between values for each of the coordinates of $x_0$, with the n components of $x_0$ representing coordinates in an n-dimensional space and separation measured in a conventional fashion.

To compare the transmit power of different sparse signaling codes with each other, it may be advantageous to normalize the minimum separation of the coordinates of $x_0$. One of ordinary skill in the art will recognize that in the same way sparse signaling codes may be compared with other known schemes.

For example, suppose the sparse signaling codes defined in Table 1 have the separation between values at each coordinate normalized to one. To compare different schemes on an equal basis, it is reasonable to normalize the power delivered to the bus per bit transmitted. A quantity, $E_b$, a set out in Equation 10 might define the amount of energy that is used per bit for a sparse signaling code when all permutations of the basis vector $x_0$ are used.

$$E_b = \frac{\sum_{i=0}^{m-1} l_i a_i^2}{\log_2 |S|} \quad \text{(Eqn. 10)}$$

From this, it should be clear that to lower power consumption, one would like to use a basis vector $x_0$ for which the number of possible permutations is large and which contains many zeroes. Table 2 gives some example values of $E_b$ for the sparse signaling codes defined in Table 1. A lower value of $E_b$ is preferred over a higher value of $E_b$.

TABLE 2

| n | $x_0$ | r | $E_b$ |
|---|---|---|---|
| 4 | [−1, 1, 0, 0] | 0.90 | 0.56 |
| 5 | [−1, 1, 0, 0, 0] | 0.86 | 0.46 |
| 6 | [−1, 1, 0, 0, 0, 0] | 0.82 | 0.41 |
| 6 | [−1, −1, 1, 1, 0, 0] | 1.08 | 0.62 |
| 8 | [−1, −1, 1, 1, 0, 0, 0, 0] | 1.09 | 0.46 |
| 8 | [−2, −1, 1, 2, 0, 0, 0, 0] | 1.34 | 0.93 |
| 9 | [−1, 1, 0, 0, 0, 0, 0, 0, 0] | 0.69 | 0.32 |
| 10 | [−2, −1, 1, 2, 0, 0, 0, 0, 0, 0] | 1.23 | 0.81 |
| 12 | [−2, −1, 1, 2, 0, 0, 0, 0, 0, 0, 0, 0] | 1.13 | 0.89 |
| 16 | [−1, −1, −1, 1, 1, 1, 0, 0, 0, 0, 0, 0, 0, 0, 0, 0] | 1.08 | 0.35 |

Compared to other schemes, the methods disclosed herein provide several advantages. For example, the methods disclosed in [Chiarulli] lead to pin-efficiencies that are lower than the ones given in Table 1, and power consumptions that are higher than the methods disclosed in this application. Of the codes disclosed in [Chiarulli], the 12C6 code has the highest pin-efficiency. However, the pin-efficiency of the 12C6 code is only r=0.75. All but one of the sparse basis vectors of Table 2 lead to higher pin-efficiencies. Furthermore, the value of $E_b$ is equal to 0.67 for the 12C6 code, from which one can conclude that most of the sparse vectors of Table 2 correspond to pin-efficiencies that are substantially higher and a transmission power that is substantially lower.

The methods disclosed in [Poulton] may lead to pin-efficiencies comparable to those of the methods and apparatus disclosed herein. However, this is at the cost of significantly higher power consumption. In [Poulton], an embodiment for transmission on four wires is presented that can achieve a pin-efficiency of 1. However, for this scheme, the value of $E_b$ is equal to 2.5, which is more than four times as high as several of the basis vectors presented in Table 2 that achieve at least the same pin-efficiency. The power delivered to the wires of a bus using methods presented in [Poulton] grows quadratically with the number of wires used, which makes these methods only suitable for a small number of wires when power consumption is an issue.

A general disadvantage of the codes disclosed in [Chiarulli] and [Poulton] is that encoding and/or decoding is only simple to implement for a small number of wires. For more than four wires, one requires a look-up table and/or complex logic. The disadvantage of look-up tables and complex logic is that it is difficult to operate these at high speeds and low power consumption. Methods disclosed herein have the advantage that efficient encoding and decoding can be used such that no look-up table is required and encoding and decoding may be implemented with simple circuitry. Another advantage of the methods disclosed herein is that the sparse driver 624 and/or SDC 644 may be adjusted to the specific form of the basis vector $x_0$ that may result in additional power savings.

One of ordinary skill in the art will recognize that the power estimates made above are not necessarily valid under other noise models. However, advantages of sparse signaling codes can carry over to other noise scenarios where one operates in the high signal-to-noise ratio regime, as is the case in chip-to-chip communications.

Example Embodiments of Sparse Signaling Systems

Sparse Encoders

Figure 8:
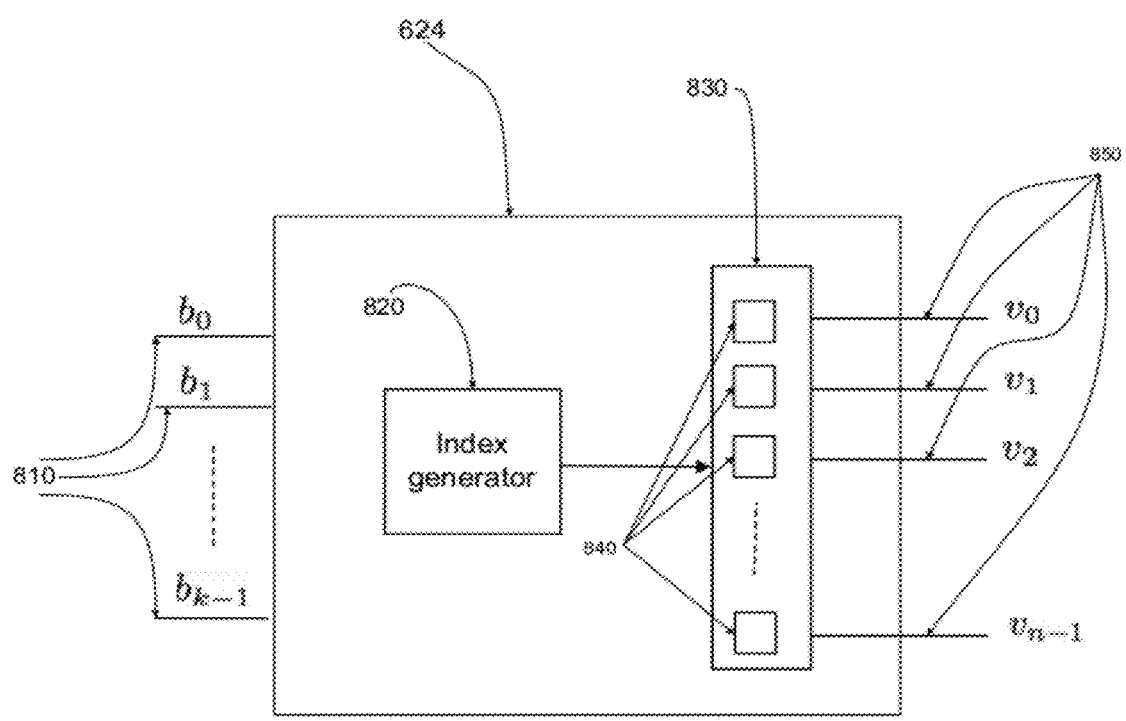
FIG. 8 illustrates an embodiment of a sparse encoder.

FIG. 8 illustrates an embodiment of a sparse encoder 624. There, a sparse encoder 624 has inputs comprising k bits 810 that are denoted by $b_0, \ldots, b_{k-1}$. The sparse encoder 624 encodes these k bits into a vector of numbers or signals 850 that are denoted by $v_0, \ldots, v_{n-1}$. The set of all possible encodings into numbers or signals 850 is defined by a set of $2^k$ different permutations of a sparse basis vector $x_0$. The sparse encoder 624 may comprise an index generator 820 whose task it is to generate N indices $i_0, \ldots, i_{N-1}$, where each of these indices is associated with one of the $a_i$ defining the sparse basis vector $x_0$. An example may be provided by the basis vector, $x_0=[-2, -1, 1, 2, 0, 0, 0, 0]$, wherein N=4 and $a_0=-2$, $a_1=-1$, $a_2=1$, and $a_3=2$.

For such a basis vector, the index generator 820 may generate four indices $i_0, i_1, i_2, i_3$ defining the positions of $a_0, a_1, a_2, a_3$, respectively, for a permutation of the elements of $x_0$. These N=4 indices are passed to a storage device 830 that may comprise n storage elements 840. Each of these storage elements 840 is able to store or buffer a single value. Each of the storage elements 840 should at least be able to store a zero value and the values of $a_0, \ldots, a_{m-1}$. The value of each of the storage elements 840 in storage device 830 is initially set to 0 and the indices $i_0, \ldots, i_{N-1}$ indicate which elements of the storage device or buffer 830 are changed to their corresponding non-zero values. The output of the sparse encoder 624 comprises n signals $v_0, \ldots, v_{n-1}$ that correspond to the values in the storage or buffer device 830.

Figure 9:
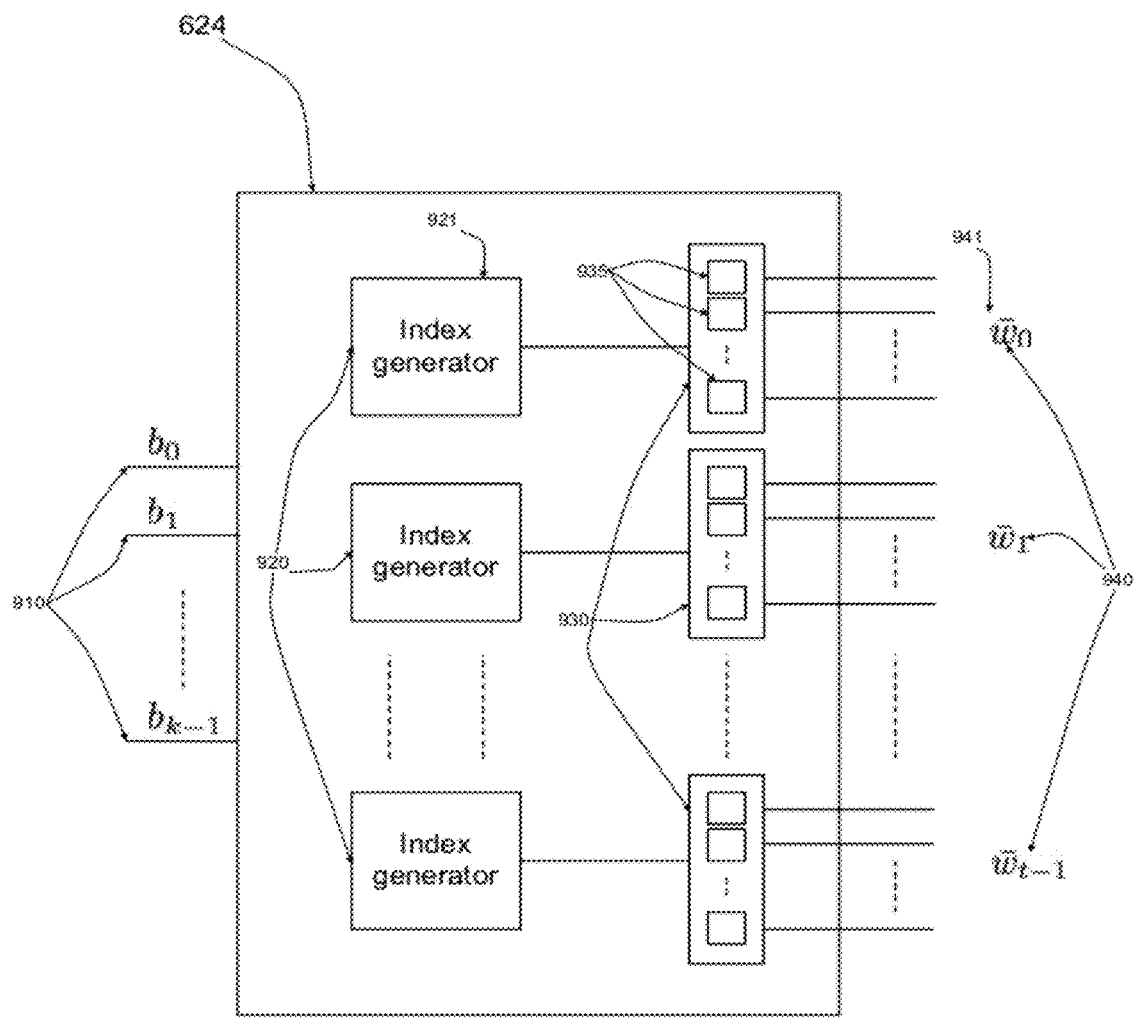
FIG. 9 illustrates another example of a sparse encoder.

FIG. 9 illustrates another example of a sparse encoder. It may be preferable that the output of the sparse encoder 624 is in another form to facilitate the implementation of a sparse driver 628. Such an embodiment is further described with reference to FIG. 9. The sparse encoder 624 as exemplified in FIG. 9 encodes k bits into a permutation of a sparse basis vector $x_0$ where the permutation is represented as follows.

The output of the sparse encoder 624 comprises a set of m vectors of size n each. The i-th vector is denoted by $\overline{w}_i$ and comprises $l_i$ ones and $n-l_i$ zeros. The locations of the ones correspond to the positions where the encoded permutation has a value of $a_i$.

As an example, again consider the basis vector above. Suppose that the set of k input bits is such that the encoded permutation is given by $x_0=[0, 0, 2, 1, -1, -2, 0, 0]$. The sparse encoder 624 generates the first output vector as $\overline{w}_0=[0,0,0,0,1,0,0]$ and the second output vector is as $\overline{w}_1=[0,0,0,0,1,0,0,0]$. In a similar fashion, $\overline{w}_2$ and $\overline{w}_3$ are generated as $\overline{w}_2=[0,0,0,1,0,0,0,0]$ and $\overline{w}_3=[0,0,1,0,0,0,0,0]$. To accomplish this task, the sparse encoder 624 may comprise m index generators 920. The first index generator 921 generates a set of $l_0$ indices that correspond to the positions where the encoded permutation have a value of $a_0$. In a similar way, the i-th index generator generates a set of $l_{i-1}$ indices that correspond to the positions where the encoded permutation has a value of $a_{i-1}$. The indices generated by the index generators 920 are passed to a set of m storage devices 930. Each of these storage devices 930 may comprise n storage elements or buffers 935 that is able to buffer or store a value of 0 and 1. All storage elements in the storage devices 930 are initialized to 0. The values of the storage elements or buffer in the i-th storage device corresponding to the $l_{i-1}$ indices from the i-th index generator are set to 1. The value of $\overline{w}_{i-1}$ corresponds to the values in the storage elements or buffer in the i-th storage device.

The implementation of a sparse encoder 624 poses several challenges. One difficulty lies in the efficient implementation of the index generator 820 shown in FIG. 8, and of the index generators 920 shown in FIG. 9. A straightforward solution would be to implement the index generators 820 and 920 with look-up tables ("LUTs"). However, this poses several problems of their own, such as high power consumption at high speeds and limited scalability. Several refinements of sparse encoders 624 are described below that exemplify and solve these problems for cases when the problems occur.

Sparse Drivers

Figure 10:
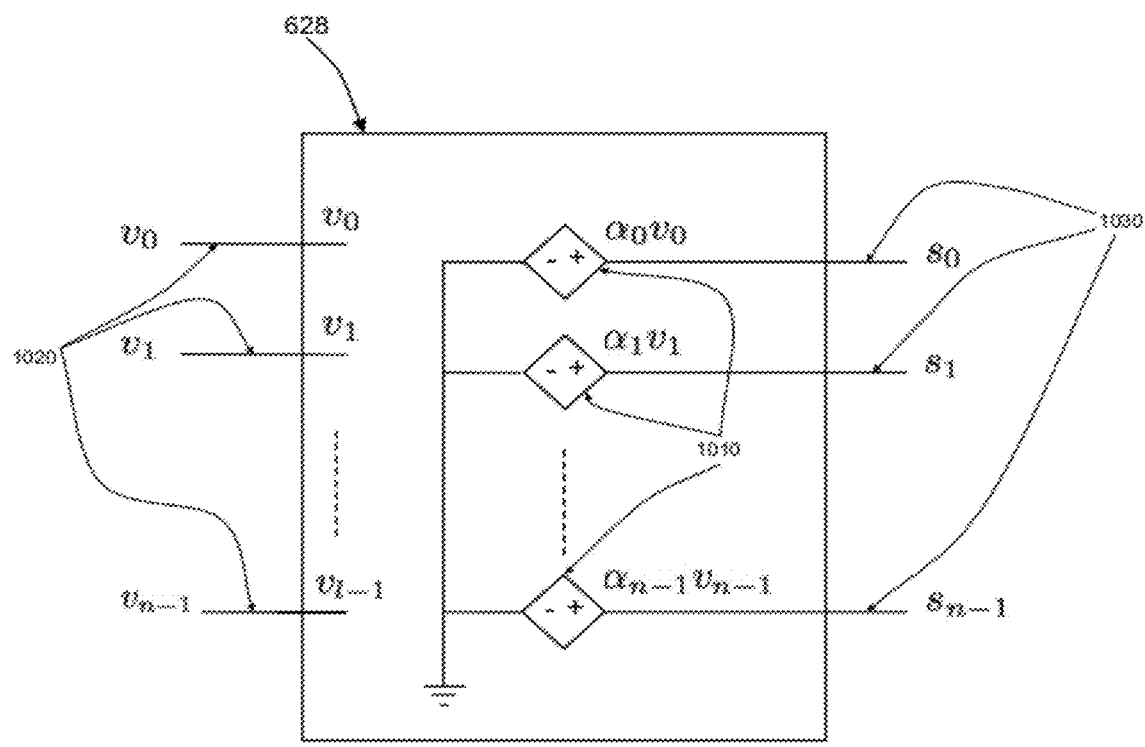
FIG. 10 illustrates an embodiment of a sparse driver.

To make use of the sparsity of the PM code, a sparse driver 628 operates as follows. A preferred embodiment of a sparse driver 628 is shown in FIG. 10. The input of the sparse driver 628 comprises n signals 1020, which are denoted by $v_0, \ldots, v_{n-1}$. The sparse driver 628 may comprise n controlled voltage sources 1010. The output voltage of the voltage source i is denoted by $s_i$ and is proportional to $v_i$, where the constant of proportionality is given by $a_i$. When one of the input signals $v_i$ is equal to 0, the corresponding output signal, $s_i$, is equal to 0 as well. In this case, the corresponding controlled voltage source will not deliver any power to the bus wires 635. At any moment, only N of the controlled voltage sources 1010 will deliver power to the bus wires 635, because a sparse signaling code is used. Compared to other signaling methods, power is saved. Furthermore, the excellent properties of differential signaling remain valid.

Figure 11:
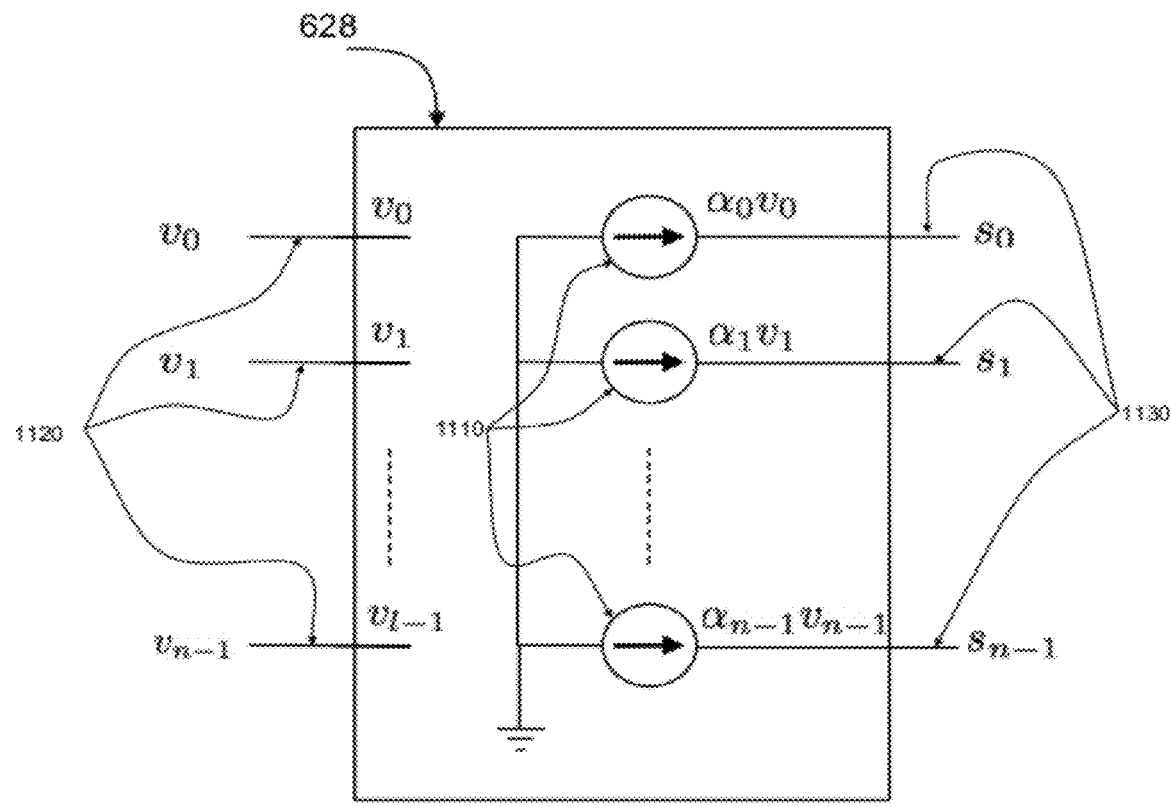
FIG. 11 illustrates an embodiment of a sparse driver that drives the wires in current-mode.

Often it is desired to drive the bus wires 635 in current-mode. A preferred embodiment of a sparse driver 628 that drives the wires in current-mode is exemplified in FIG. 11. The input of the sparse driver 628 comprises n signals 1120, which are denoted by $v_0, \ldots, v_{n-1}$. The sparse driver 624 may comprise n controlled current sources 1110. The output current of the current source i is denoted by $s_i$ and proportional to $v_i$, where the constant of proportionality is given by $a_i$. When one of the input signals $v_i$ is equal to 0, the corresponding current driven into wire i is 0 as well. Hence, this controlled current source will not deliver any power to the bus wires. Note that the sum of the $v_i$ is equal to 0 by Equation 5. Hence, the sum of current driven into the bus wires 635 is 0 as well.

At high speeds, it is difficult to turn on and off current sources or to modulate the amount of current they source and sink. Implementations of current-mode circuits that resolve this are disclosed later below.

Signal-to-Digital Converters

At the receive end of the bus, a signal-to-digital converter ("SDC") 644 senses the signals that are present on the wires of the bus and generates a discrete representation of the numbers generated by the sparse driver 628. The continuous-time signals present at the output of the bus are denoted by $y_0(t), \ldots, y_{n-1}(t)$. The bus may either be terminated or not terminated.

Figure 12:
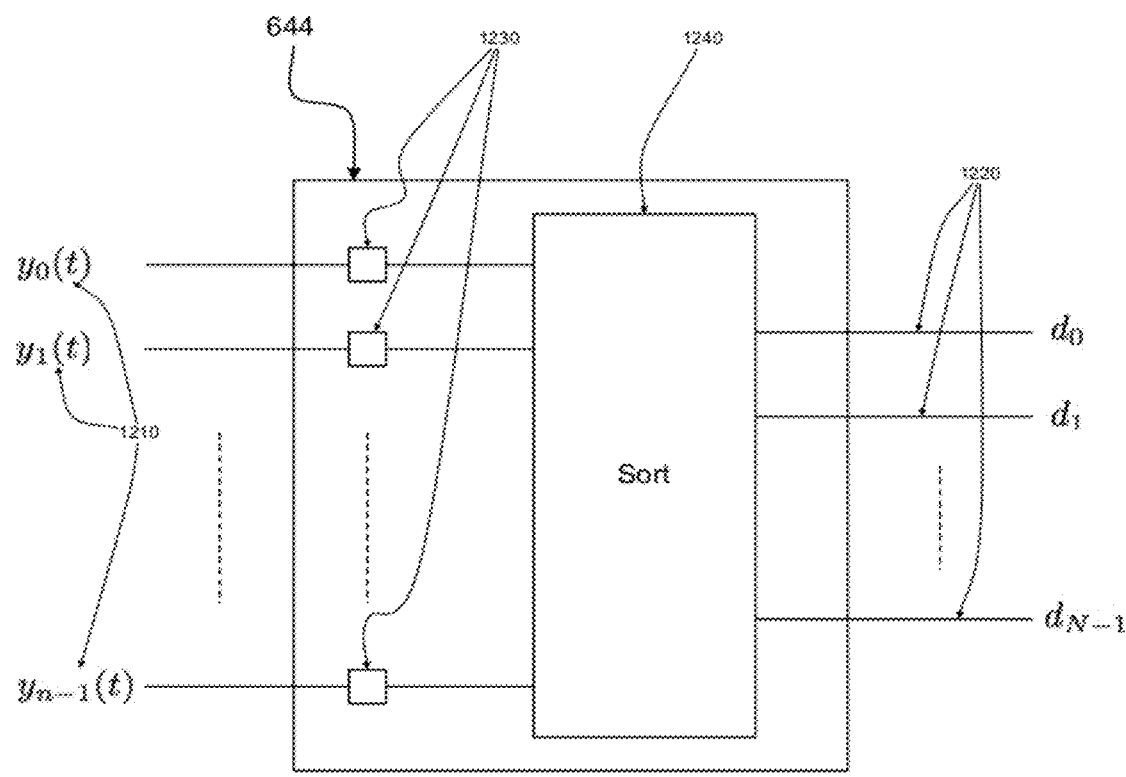
FIG. 12 illustrates a signal-to-digital converter.

A preferred embodiment of an SDC is further described with reference to FIG. 12. The input of the SDC 644 comprises n signals 1210 that are sensed at the bus wires 635 or across the termination of the bus. Sample-and-hold and/or track-and-hold units 1230 sample these signals. One of skill in the art will recognize that control logic samples the signals at preferred time instances, such as other than times where signals are changing from period to period. Many methods for clock and/or data recovery are known to one of ordinary skill in the art. Herein, for these examples, assume that this functionality is included in the sample units 1230. The outputs of the sample units 1230 are denoted by $z_0, \ldots, z_{n-1}$. These n samples correspond to the permutation of the basis vector as generated by the sparse encoder 624. One of skill in the art will recognize that these samples may be corrupted by noise, but that in general, a basis vector $x_0$ gives some error-correcting capabilities since the set of permutations of $x_0$ defines a permutation modulation code.

The samples $z_0, \ldots, z_{n-1}$ are fed into a sorting unit 1240 whose task it is to sort the sequence of samples $z_0, \ldots, z_{n-1}$ in ascending or descending order and during this process extracts N indices that are denoted by $d_0, \ldots, d_{N-1}$. The process of sorting the samples $z_0, \ldots, z_{n-1}$ is optimal for sparse signaling codes under many noise conditions as will be appreciated by one of skill in the art. Indices $d_0, \ldots, d_{l_0-1}$ correspond to the $n_0$ positions of $a_0$ in the permutation of $x_0$ as generated by the sparse encoder 624. In a similar way, the indices $d_{l_0}, \ldots, d_{l_0+l_1-1}$ correspond to the $l_1$ positions of $a_1$ in the permutation of $x_0$, etc. These indices are the output of the SDC 644. Each of these outputs may be represented by a fixed number of bits and one of skill in the art recognizes that one may use $\lceil \log_2(n) \rceil$ bits to represent each of these indices, wherein for a real number z, the quantity $\lceil z \rceil$ denotes the smallest integer that is greater than or equal to z.

The SDC 644 only has to output the positions of the non-zero elements, since a permutation of $x_0$ is completely specified by the locations of the non-zero elements. The exact form of the outputs of the SDC is not relevant as long as the positions of the non-zero elements are specified in some predetermined way.

It may be preferred to interchange the location of the samplers 1230 and the sorting unit 1240. In such embodiments, sorting could be accomplished in continuous time and the conversion to discrete-time would occur after sorting. Some embodiments are disclosed below herein employing this principle. The advantage of this approach is that a sorting unit may be implemented that is more power efficient.

Sparse Decoders

Figure 13:
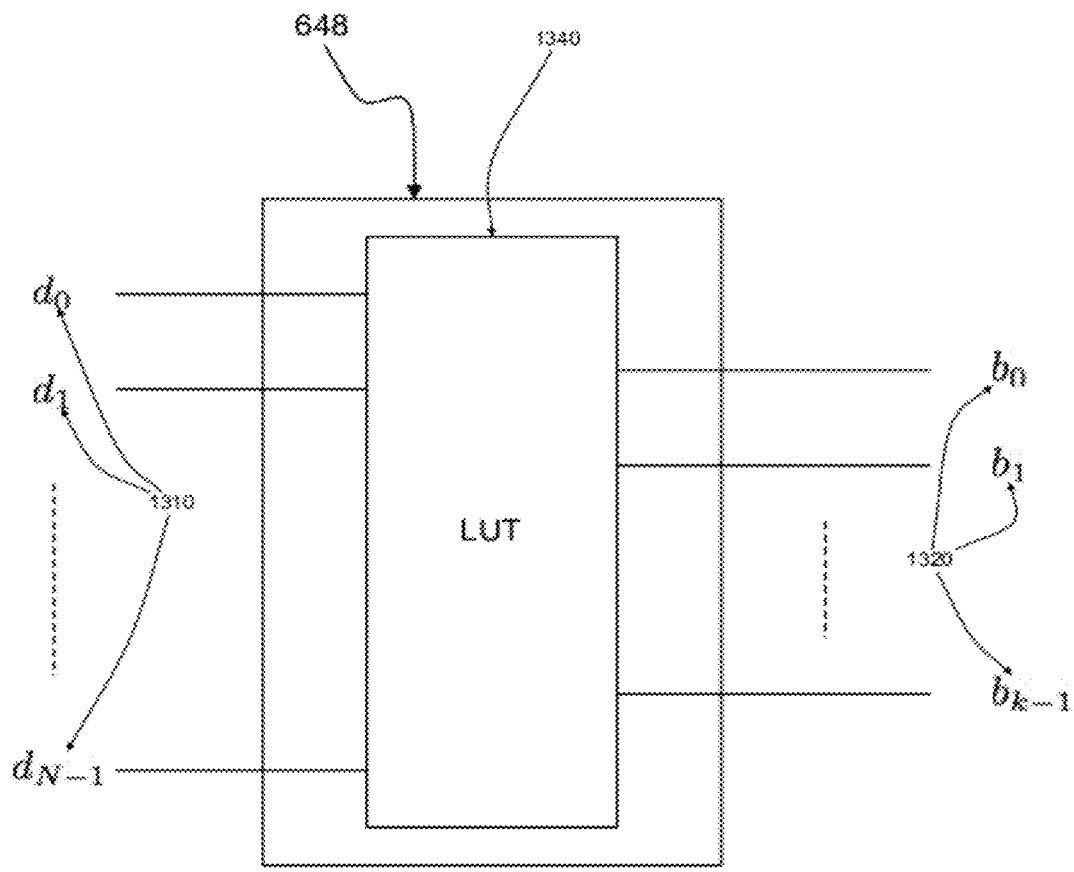
FIG. 13 illustrates an embodiment of a sparse decoder.

A preferred embodiment of a sparse decoder 648 is exemplified in FIG. 13. The input of the sparse decoder comprises the N indices $d_0, \ldots, d_{N-1}$ and the output comprises a set of k bits $b_0, \ldots, b_{k-1}$. In case communications is without error, the bits $b_0, \ldots, b_{k-1}$ are equal to the original information in 610. In a preferred embodiment, the sparse decoder 648 may comprise a LUT 1340 to map the indices $d_0, \ldots, d_{N-1}$ to the original bits to accomplish the task of decoding. The use of LUTs may pose several problems, such as power consumption at high speeds and scalability. Several refinements of sparse decoders 628 are discussed below that exemplify and solve these problems. After presenting these examples, a general approach is exemplified.

A Sparse Signaling Code for Transmitting Four Bits on Five Wires

In a preferred embodiment, the bus 630 comprises five wires (n=5) and in each cycle of 1/T seconds, four bits are transmitted over the wires 635 of the bus 630. Furthermore, the transmitter 620 implements a sparse signaling code that is defined by the sparse basis vector $x_0 = [-1, 1, 0, 0, 0]$ of which $2^4 = 16$ different permutations are used. This leads to a pin-efficiency of r=0.8. This sparse signaling code is referred to herein as a 4b5w code (e.g., 4 bits over 5 wires) and we exemplify preferred embodiments of a sparse encoder 624, a sparse driver 628, a SDC 644 and a sparse decoder 648 for this code.

A 4b5w Encoder

Figure 14:
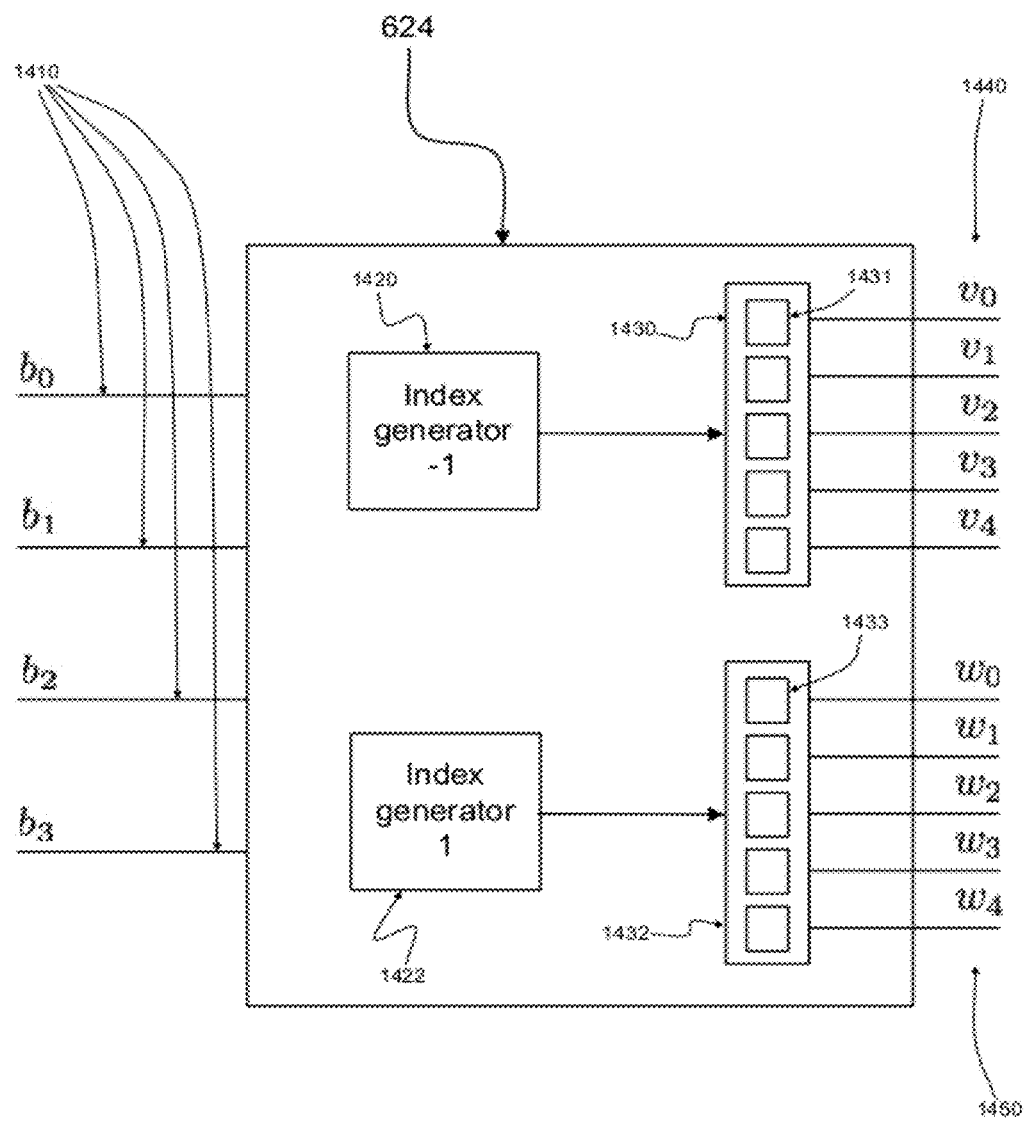
FIG. 14 illustrates an embodiment of an encoder for a 4b5w code.

A preferred embodiment of the encoder for the 4b5w code is exemplified with reference to FIG. 14. The input of the sparse encoder 624 comprises four bits 1410, which are denoted by $b_0, b_1, b_2, b_3$. The sparse encoder 624 may comprise an index generator 1420 that generates an index $i_0$ that indexes the position of the −1. The index $i_0$ is passed on to a storage device 1430 that comprises five storage elements or buffers 1431. These storage elements are able to store the values −1, 0 and are initialized by the value of 0. The $i_0$-th storage element in 1430 is set to the value of −1 where it is understood that an index $i_0=0$ corresponds to storage element 1431.

The sparse encoder 624 may comprise a second index generator 1422 that generates an index $i_1$ that indexes the position of the 1. The index $i_1$ is passed on to a storage device 1432 that comprises five storage elements or buffers 1433. These storage elements are able to store the values 1, 0 and are initialized by the value of 0. The $i_1$-th storage element in 1432 is set to the value of 1. The output of the sparse encoder 624 comprises two sets of five signals. The first set of five output signals 1440 are denoted by $v_0, \ldots, v_4$ and these correspond to the values in the storage elements in 1430. The second set of five output signals 1450 are denoted by $w_0, \ldots, w_4$ and these correspond to the values in the storage elements in 1432.

In a preferred embodiment, the index generators 1420 and 1422 are implemented by LUTs. Each of these LUTs is indexed by a four bit value corresponding to $b_0, \ldots, b_3$ and each entry of the LUTs contains an integer in the range from 0 to 4. Several methods of implementing LUTs are known to one of skill in the art. One may for instance choose to use a random access memory (RAM) or read only memory (ROM). However, a disadvantage of using RAMs or ROMs for the LUTs is that it is not easy to operate at very high speeds for acceptable power consumption. To solve this problem, a simple process is desired that is able to generate the indices such that a valid 4b5w sparse signaling code is generated.

Figure 15:
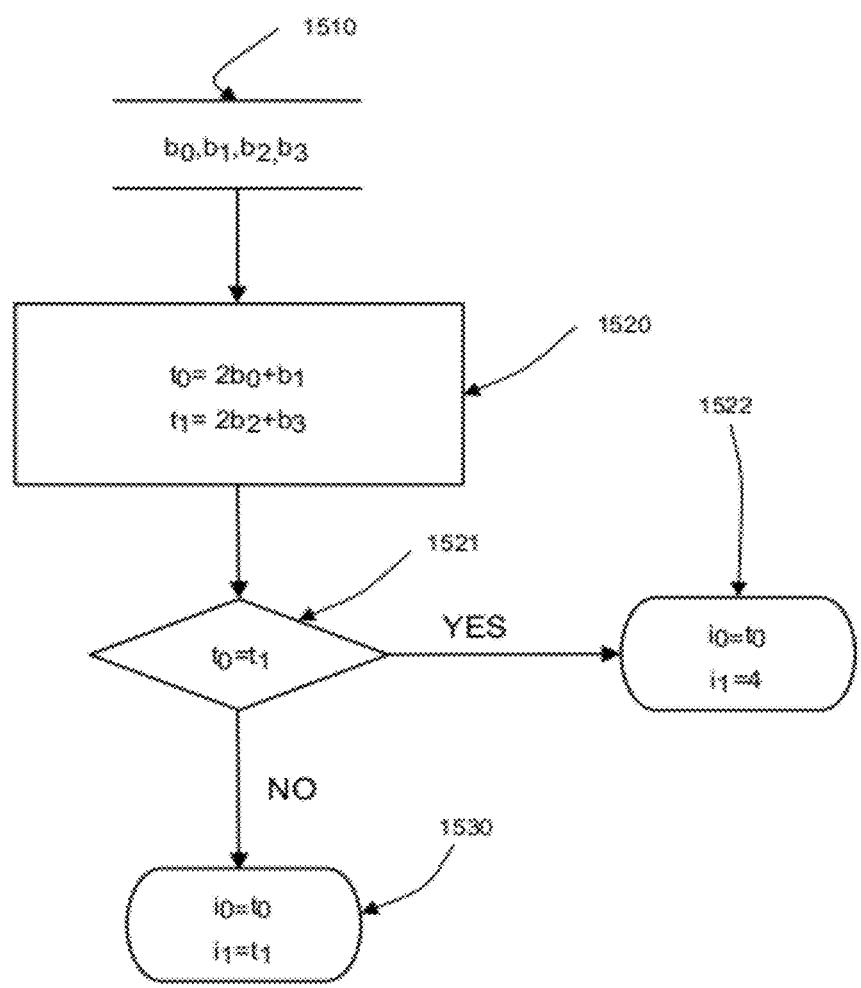
FIG. 15 is a flowchart of a process for generating indices, as might be used in the encoder of FIG. 14.

A simple process that may be implemented by the index generators 1420 and 1422 to generate the indices $i_0$ and $i_1$ is shown in FIG. 15. The inputs 1510 to the process are the bits $b_0, \ldots, b_3$. In 1520, these bits are split in two pairs and represented by their integer representations, $t_0$ and $t_1$. In 1521, the two integers $t_0$ and $t_1$ are compared and if they are equal, the index $i_0$ is set to $t_0$ and the index $i_1$ is set to 4, in 1522. If $t_0$ and $t_1$ are not equal, the index $i_0$ is set to $t_0$ and the index $i_1$ is set to $t_1$, in 1530. The output of the process comprises the indices $i_0$ and $i_1$. Table 3 gives an example of the content of two LUTs where the 16 permutations of the basis vector $x_0=[-1, 1, 0, 0, 0]$ are generated according to the process in FIG. 15. Table 3 also gives the outputs 1440 and 1450 of the sparse encoder 624 corresponding to the indices $i_0$ and $i_1$.

TABLE 3

| $8b_0 + 4b_1 + 2b_2 + b_3$ | | $[v_0\, v_1\, v_2\, v_3\, v_4]$ | | $[w_0\, w_1\, w_2\, w_3\, w_4]$ |
|---|---|---|---|---|
| 0 | 0 | [1 0 0 0 0] | 4 | [0 0 0 0 1] |
| 1 | 0 | [1 0 0 0 0] | 1 | [0 1 0 0 0] |
| 2 | 0 | [1 0 0 0 0] | 2 | [0 0 1 0 0] |
| 3 | 0 | [1 0 0 0 0] | 3 | [0 0 0 1 0] |
| 4 | 1 | [0 1 0 0 0] | 0 | [1 0 0 0 0] |
| 5 | 1 | [0 1 0 0 0] | 4 | [0 0 0 0 1] |

TABLE 3-continued

| $8b_0 + 4b_1 + 2b_2 + b_3$ | | $[v_0 v_1 v_2 v_3 v_4]$ | | $[w_0 w_1 w_2 w_3 w_4]$ |
|---|---|---|---|---|
| 6 | 1 | [0 1 0 0 0] | 2 | [0 0 1 0 0] |
| 7 | 1 | [0 1 0 0 0] | 3 | [0 0 0 1 0] |
| 8 | 2 | [0 0 1 0 0] | 0 | [1 0 0 0 0] |
| 9 | 2 | [0 0 1 0 0] | 1 | [0 1 0 0 0] |
| 10 | 2 | [0 0 1 0 0] | 4 | [0 0 0 0 1] |
| 11 | 2 | [0 0 1 0 0] | 3 | [0 0 0 1 0] |
| 12 | 3 | [0 0 0 1 0] | 0 | [1 0 0 0 0] |
| 13 | 3 | [0 0 0 1 0] | 1 | [0 1 0 0 0] |
| 14 | 3 | [0 0 0 1 0] | 2 | [0 0 1 0 0] |
| 15 | 3 | [0 0 0 1 0] | 4 | [0 0 0 0 1] |

Figure 16:
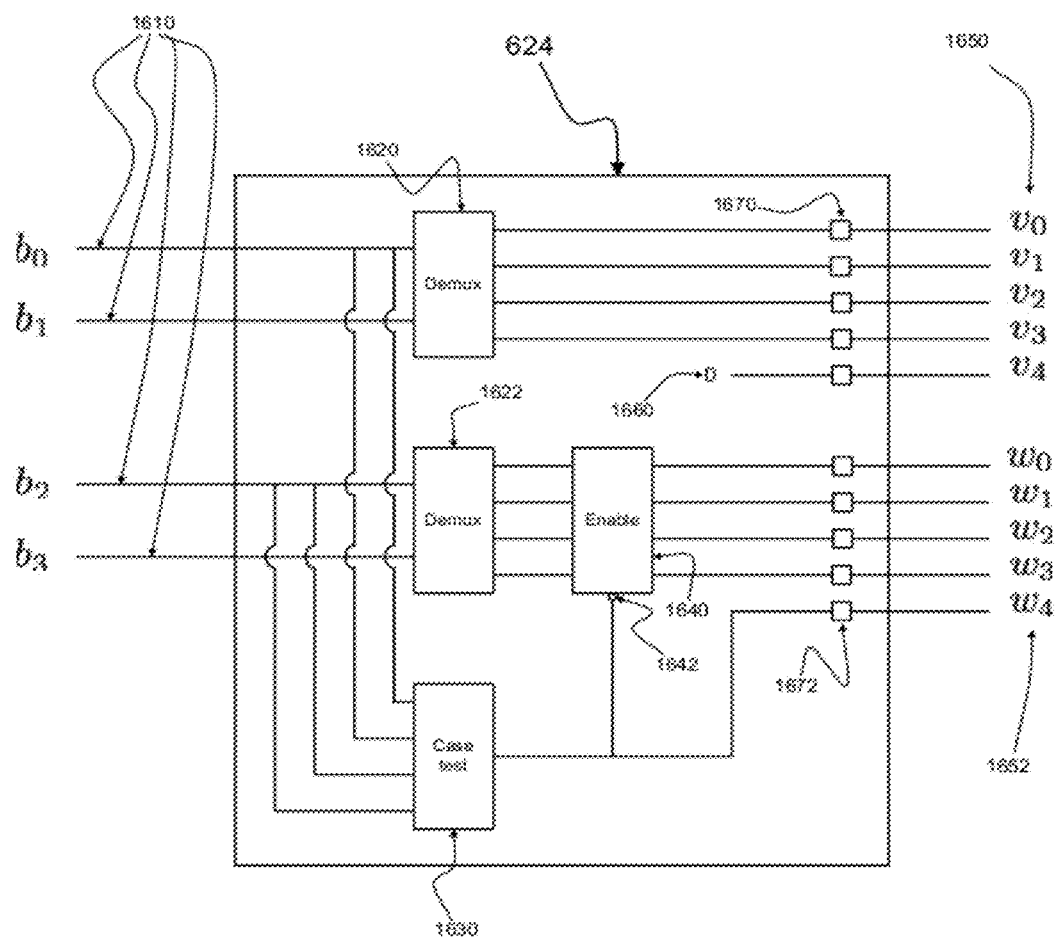
FIG. 16 illustrates the use of basic building blocks to implement a sparse encoder.

The process that is exemplified in FIG. 15 allows one to implement the sparse encoder 624 shown in FIG. 14 very efficiently. One may use basic building blocks that are straightforward to implement by combinatorial logic blocks to implement the sparse encoder 624. One such preferred embodiment is further described with reference to FIG. 16. The embodiment of FIG. 16 performs a similar task as the embodiment of FIG. 14 where the index generators implement the process of FIG. 15. The inputs to the sparse encoder 624 in FIG. 16 are the four bits $b_0, \ldots, b_3$ and the output comprises two pairs of signals. The first pair of output signals 1652 is denoted by $v_0, \ldots, v_4$ and the second pair of output signals 1652 is denoted by $w_0, \ldots, w_4$. The four input bits 1610 are split into two pairs $b_0, b_1$ and $b_2, b_3$. The first pair is input to a de-multiplexer unit 1620 and the second pair is input to a de-multiplexer unit 1622. Both de-multiplexer units 1620 and 1622 are 1-to-4 de-multiplexers where the input is always high and the two pairs of inputs 1610 are used to select to corresponding output. Such a de-multiplexer is also known as a decoder to one of moderate skill in the art. The logic function that the de-multiplexer units 1620 and 1622 may implement is illustrated in Table 4 for de-multiplexer unit 1620. The outputs are denoted by $y_0, \ldots, y_3$.

TABLE 4

| $b_0 b_1$ | $p_0 p_1 p_2 p_3$ |
|---|---|
| 00 | 1000 |
| 01 | 0100 |
| 10 | 0010 |
| 11 | 0001 |

Output signals $v_0, \ldots, v_3$ of the set of outputs 1650 are set to the output of the de-multiplexer 1620, i.e., $v_i=p_i$. Output signal 1660 that corresponds to $v_4$ is always set to 0. One may choose not to include $v_4$, since it is always 0. In FIG. 16, the output $v_4$ has been included for reasons of clarity. A set of additional flip-flops or latches 1670 might be included, to ensure stability of the output signals 1650. A case test unit 1630 compares the two pairs of input bits $b_0, b_1$ and $b_2, b_3$. If $b_0=b_2$ and $b_1=b_3$, the output of the case test unit 1630 will be high. The output of the case test unit 1630 is fed to an enable unit 1640 whose input 1642 is inverting. If the output of the case test unit 1630 is low, the enable unit 1640 passes along the input signals from the de-multiplexer 1622 and if the output of the case test unit 1630 is high, the enable unit 1640 sets its outputs to a logical 0. Output signals $w_0, \ldots, w_3$ of the set of outputs 1652 are equal to the output of the de-multiplexer 1622. The output signal $w_4$ is equal to the output of the case test unit 1630. A set of additional flip-flops or latches 1672 might be included, to ensure stability of the output signals 1652.

Figure 17:
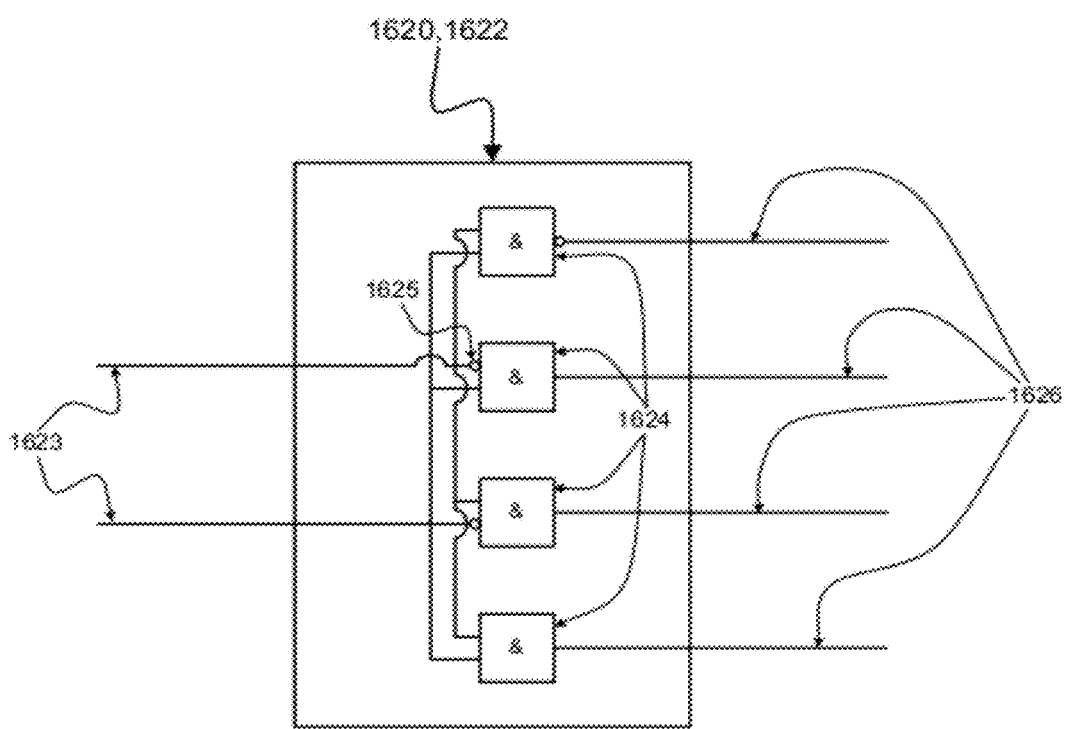
FIG. 17 illustrates an embodiment of the demultiplexer units of FIG. 16.

A preferred embodiment of the de-multiplexer units 1620 and 1622 is shown in FIG. 17. The two inputs 1623 of the de-multiplexer unit are fed to a set of AND gates 1624, each denoted by "&" in the figure. Each of these AND gates 1624 corresponds to one of the outputs 1626 of the de-multiplexer unit 1620, 1622. The output of the first AND gate, and some of the inputs of the second and third AND gates are inverting. This is denoted by a little circle as is the case for the first input 1625 of the second AND gate.

Figure 18:
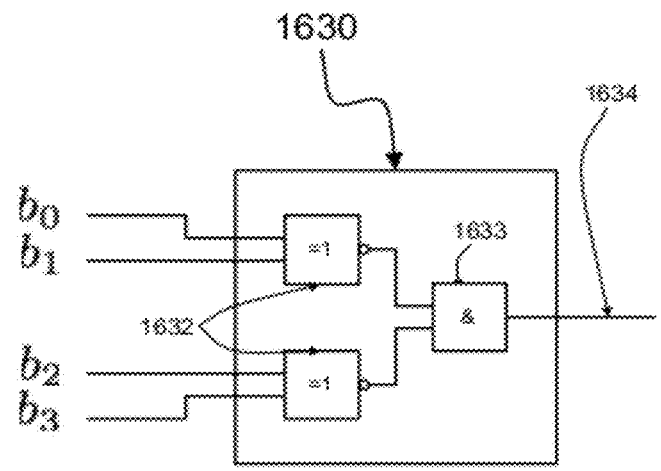
FIG. 18 illustrates a case test unit.

A preferred embodiment of the case test unit 1630 is shown in FIG. 18. The two pairs of inputs $b_0, b_1$ and $b_2, b_3$ are the input of two XOR gates 1632 whose output is inverting. Each of the XOR gates is denoted by "=1" in the figure. The output of these XOR gates is input to an AND gate 1633 whose output is the logical output 1634 of the case test unit 1630.

Figure 19:
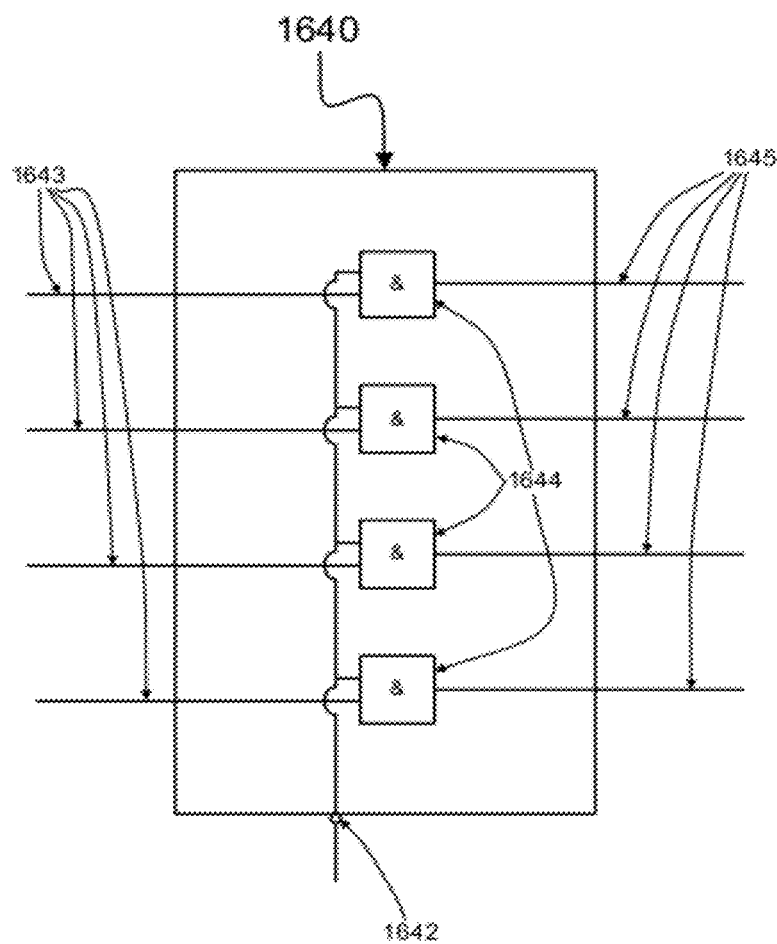
FIG. 19 illustrates an embodiment of an enable unit.

A preferred embodiment of the enable unit 1640 is shown in FIG. 19. The inverting enable input 1642 is connected to the first input of four AND gates 1644. The four inputs 1643 of the enable unit 1640 are connected to the second input of the AND gates 1644 and the outputs 1645 of the enable unit 1640 are the outputs of the four AND gates 1644.

A 4b5w Sparse Driver

Figure 20:
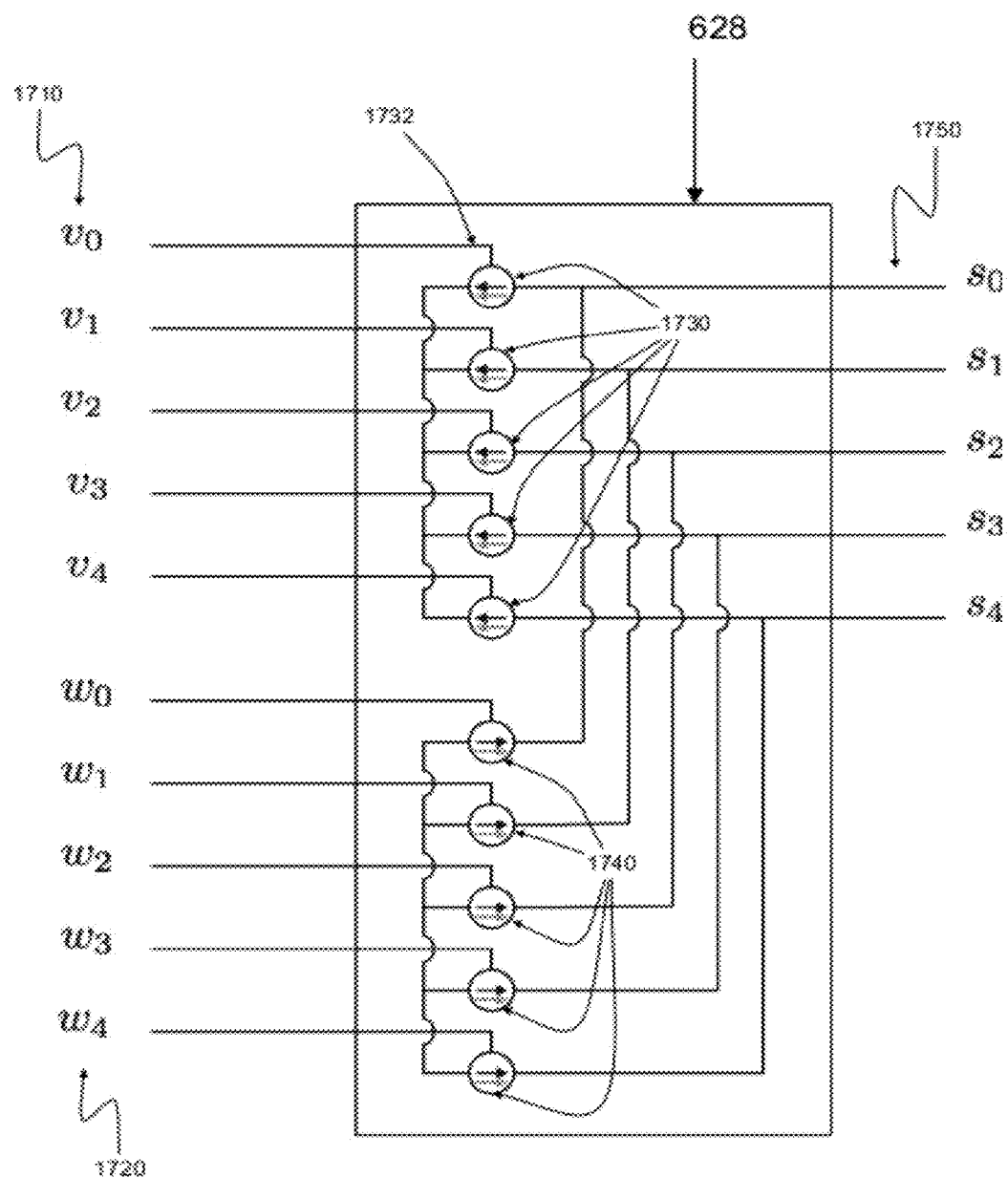
FIG. 20 illustrates another embodiment of a sparse driver that matches the sparse encoder of FIG. 16.

A preferred embodiment of a sparse driver 628 that matches the sparse encoder 624 exemplified in FIG. 16 is now described with reference to FIG. 20. The outputs of the sparse driver 628 comprise five wires 1750 carrying electrical signals $s_0, \ldots, s_4$. The five wires 1750 are connected to a set of five controlled current sources 1730 that sink a current of size I from the wires, and to a set of five controlled current sources 1740 that source a current of size I into the wires. Each of the control inputs, of which input 1732 is an example, may take a binary value where a logical 1 may denote that the respective current source is on and a logical 0 may denote that the respective current source is off. The outputs of the sparse encoder 624 for the 4b5w code are such that at any time there is only one sourcing or one sinking current source active. Furthermore, the sum of currents on the wires is equal to 0.

As is known to those of skill in the art, it is not straightforward to implement a current source that can be turned on and off at very high speeds (such as speeds in excess of 1 GHz) in IC technologies such as, e.g., Complementary Metal-Oxide-Semiconductor ("CMOS") technology. A preferred embodiment that implements the functionality of the sparse driver as shown in FIG. 20 at a lower level without switching on or off current sources is described with reference to FIG. 21.

Figure 21:
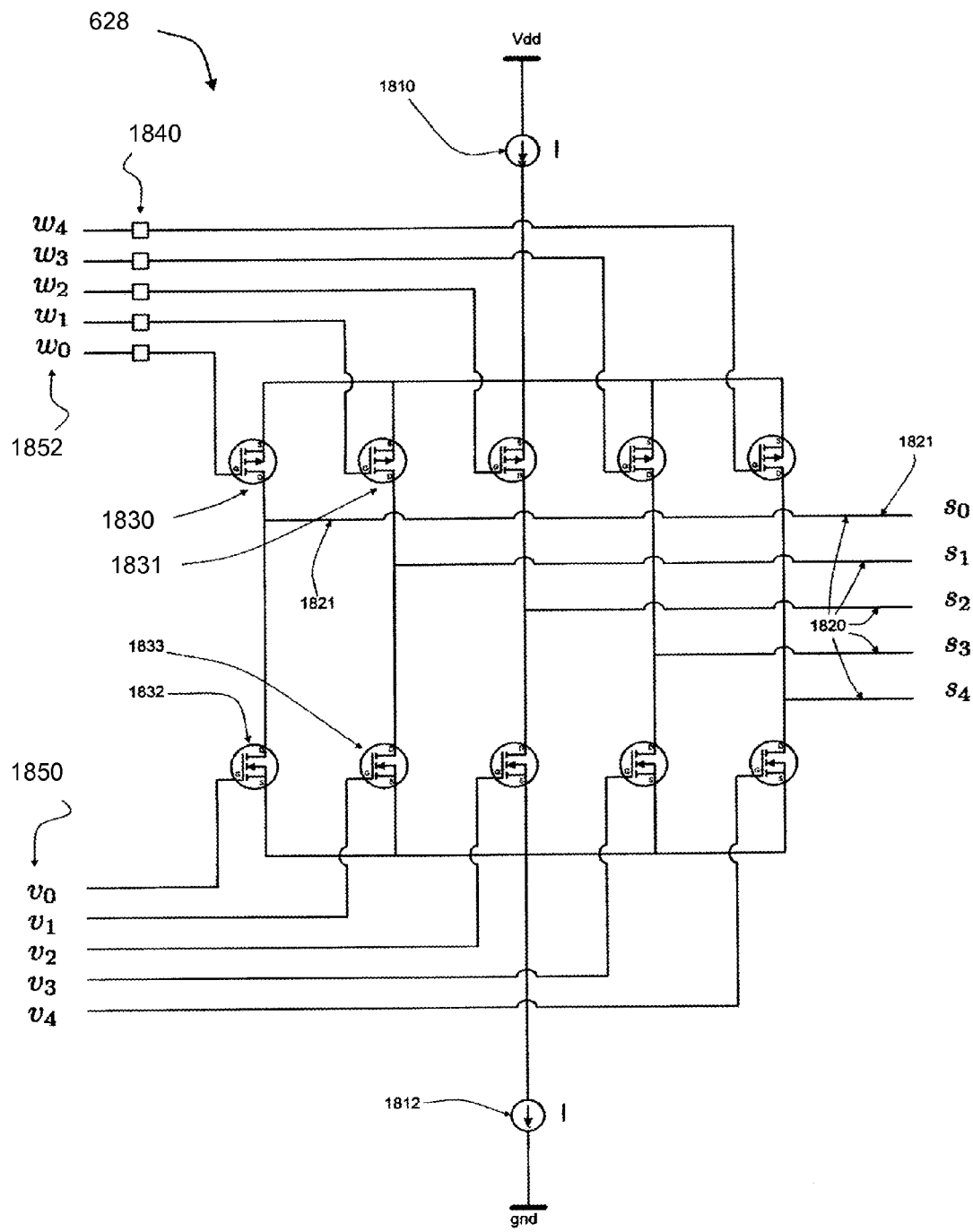
FIG. 21 illustrates another embodiment of a sparse driver, with a current steering design matched to a sparse signaling code.

The sparse driver that is exemplified in FIG. 21 implements a current steering design matched to a sparse signaling code. A current source 1810 draws a current of I from the positive power supply (Vdd) and a current source 1812 sinks a current of I into ground. The output of the sparse driver 628 comprises five wires 1820 and each of these wires carries a physical signal. These physical signals are denoted by $s_0, \ldots, s_4$ and are defined by the currents flowing into the wires. Each of the output wires 1820 is connected to an NMOS transistor and a PMOS transistor. For instance, the first output wire 1821 is connected to the drain of a PMOS transistor 1830 and to the drain of an NMOS transistor 1832. The gates of the NMOS transistors are connected to the first set of inputs 1850. The inputs 1850 are the first set of outputs 1650 of sparse encoder 624 exemplified in FIG. 16 and these inputs 1850 drive the gates of the NMOS transistors. The inputs 1852 are the second set of outputs 1652 of the sparse encoder 624 exemplified in FIG. 16. To drive the gates of the PMOS transistors the logical value of the inputs 1852 are inverted by the inverter units 1840.

The output of the sparse encoder 624 of FIG. 6 for the 4b5w code has the following property. There is always one PMOS transistor in its active state and one NMOS transistor in its active state. Furthermore, the wire with the active PMOS transistor is different from the wire with the active NMOS transistor. Whenever a PMOS transistor is active, the current source 1810 sources a current of I into the corresponding wire. Whenever an NMOS transistor is active, the current source 1812 sinks a current of I from the corresponding wire. As an example, consider the case where the input of the sparse encoder is given by $(b_0\ b_1\ b_2\ b_3)=(0\ 0\ 0\ 1)$.

The sparse encoder as exemplified in FIG. 16 generates the following outputs that are input to the sparse driver 628: $(v_0\ v_1\ v_2\ v_3\ v_4)=(0\ 0\ 0\ 1)$ and $(w_0\ w_1\ w_2\ w_3\ w_4)=(0\ 0\ 0\ 1)$.

In present embodiment, the PMOS transistor 1831 sources a current of I into the second wire and the NMOS transistor 1832 sinks a current of I from the first wire. Furthermore, the remaining wires do not carry any current.

From this embodiment, it becomes clear that a sparse signaling code allows for an efficient driver structure. To drive five wires, only two current sources 1810 and 1812 are required. In contrast, a system based on conventional differential signaling may use two current sources for only two instead of five wires with a value of the current per source that is only slightly smaller than the corresponding value in the disclosed case. The use of sparse signaling codes leads not only to power savings but also to substantial savings in terms of area used on a chip.

A 4b5w Signal to Digital Converter

Figure 22:
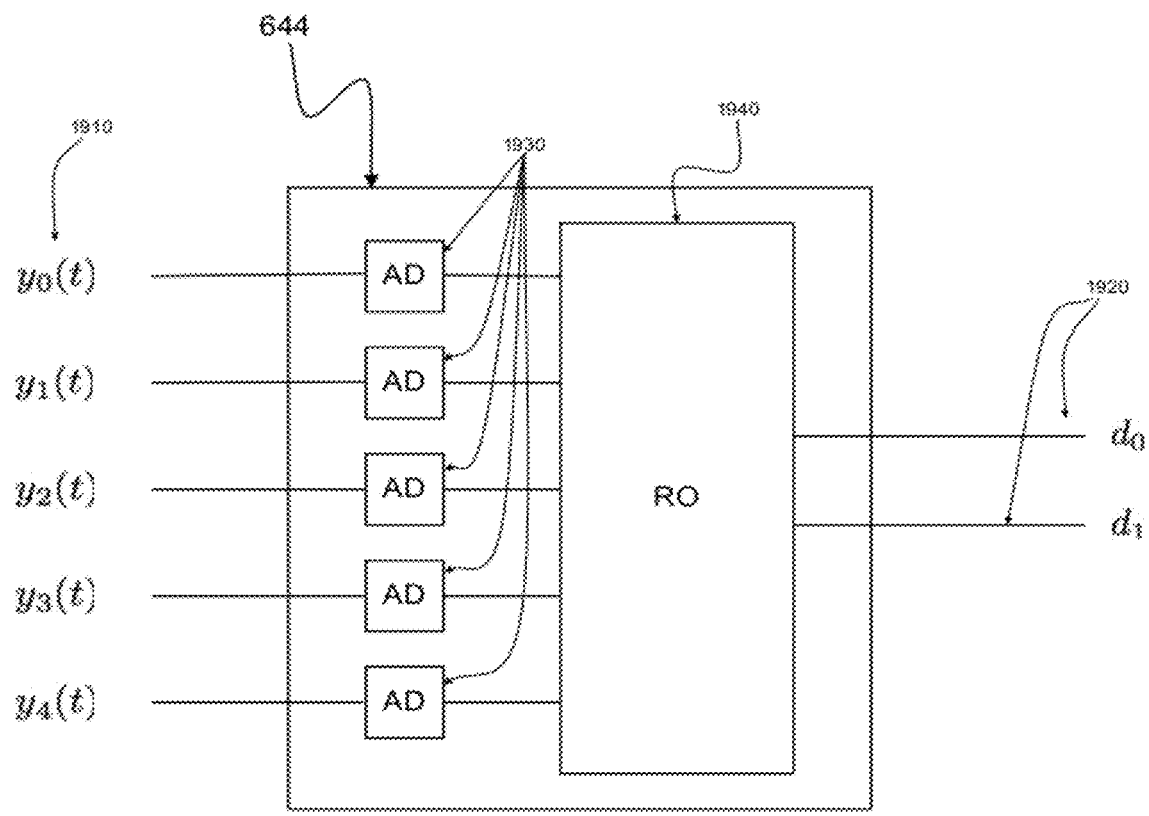
FIG. 22 illustrates a 4b5w signal-to-digital converter ("SDC").

A preferred embodiment of a SDC 644 for the 4b5w code is shown in FIG. 22. The inputs of the SDC 644 are five signals 1910 that are denoted by $y_0(t), \ldots, y_4(t)$. It is assumed that these signals are proportional to the signals generated by the sparse encoder 624 and sparse driver 628 for the 4b5w code. When the bus wires are driven in current-mode we assume that $y_0(t), \ldots, y_4(t)$ are proportional to these currents. This is for instance the case when $y_0(t), \ldots, y_4(t)$ are measured as voltages across termination resistors. The SDC comprises five analog-to-digital converters (ADCs) 1930 denoted by AD. The i-th ADC samples signal $y_{i-1}$ and generates a sample $z_{i-1}$. A clock-and-data recovery unit may determine the time instance within the cycle of 1/T seconds at which the signals are sampled.

The set of samples generated by the ADC is denoted by $z_0, \ldots, z_4$. A resolution of 2 bits for the ADC is sufficient to distinguish the different levels. A higher resolution might be used where equalization has to be performed or when one would like to obtain a higher degree of common-mode noise rejection. A rank-order unit 1940 selects the largest and the smallest of the samples $z_0, \ldots, z_4$. For purposes of illustration, we assume that $d_0$ denotes the index of the wire corresponding to the smallest sample and $d_1$ denotes the index of the wire corresponding to the largest sample. The indices $d_0$ and $d_1$ are the output of the SDC 644 and may be input to the sparse decoder 648.

An architecture with AD converters 1930 is not very cheap in terms of power usage. The properties of the sparse signaling codes can be useful to implement an efficient SDC architecture. A preferred embodiment that accomplishes this is described with reference to FIG. 23. The input of the SDC 648 exemplified in FIG. 23 comprises five input signals 2010 that are denoted by $y_0(t), \ldots, y_4(t)$. The SDC comprises a min-detector unit 2030 and a max-detector unit 2040. The min-detector unit 2030 has as its input the five input signals 2010. The task of the min-detector is to decide which of the input signals has the smallest value. The max-detector unit 2040 has as its input the five input signals 2010. The task of the max-detector is to decide which of the input signals has the largest value.

The output of the SDC 648 comprises two sets of signals. The first set of signals 2020 is the output of the min-detector unit 2030 and denoted by $d_0, \ldots, d_4$. The values of signals 2020 encode the wire on which the corresponding signal has the smallest value with respect to the other wires. The second set of signals 2022 is the output of the max-detector unit 2040 and is denoted by $e_0, \ldots, e_4$. The values of signals 2022 encode the wire on which the corresponding signal has the largest value with respect to the other wires. In a preferred embodiment signals 2020 and signals 2022 are encoded such that a predefined voltage level of $V_1$ corresponds to the wire on which the minimum or maximum is present and a predefined voltage level of $V_2$ corresponds to the wire on which the minimum or maximum is not present.

Figure 23:
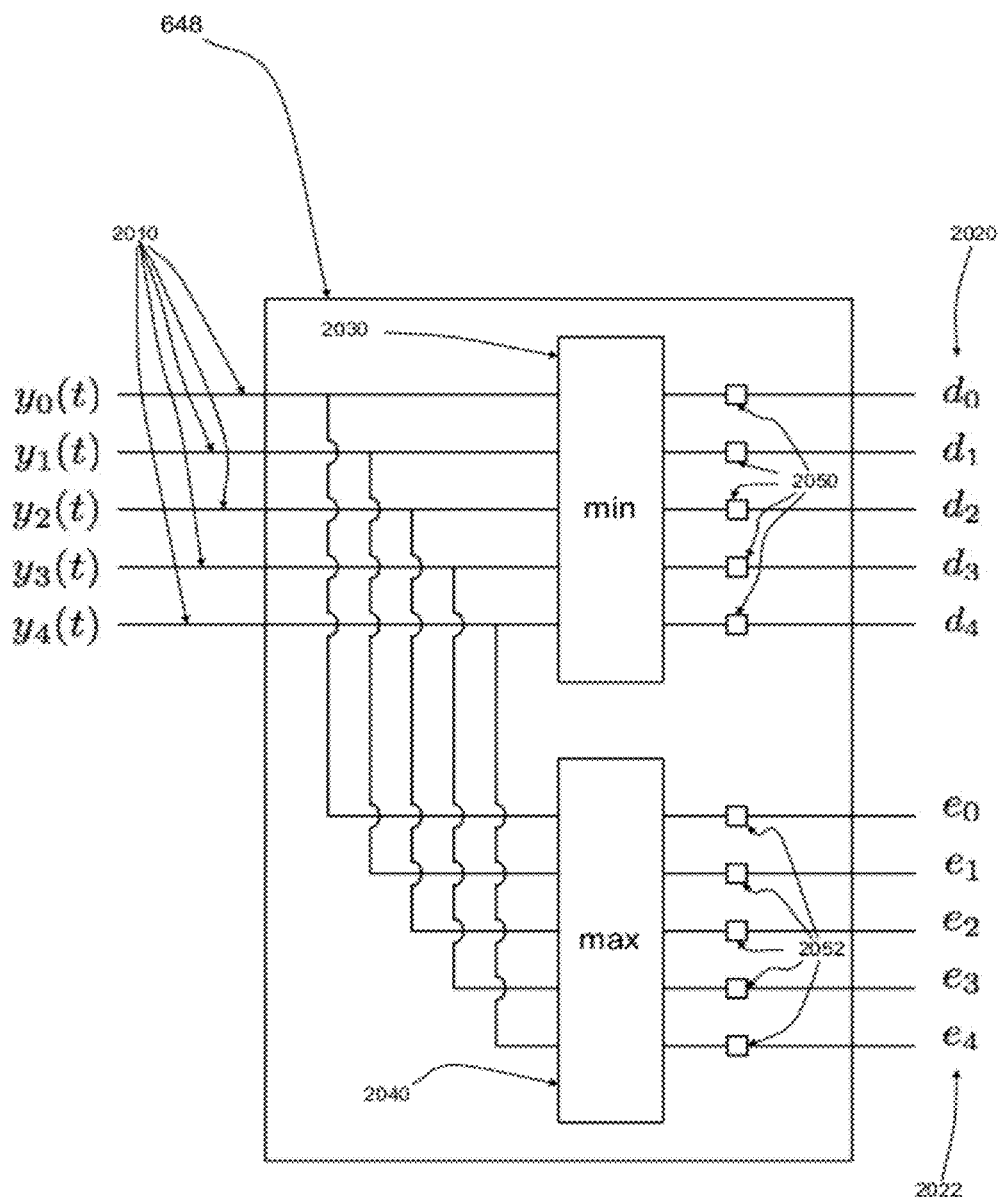
FIG. 23 illustrates an SDC architecture for sparse signaling codes.

In a preferred embodiment, these signals 2020 and 2020 may be converted to logical signals to match the input of the sparse decoder 648. The SDC 648 may include a set of sample-and-hold or track-and-hold units 2050 and 2052 for the outputs 2020 and 2022. In the embodiment of FIG. 23 the min-detector unit 2030 and the max-detector unit 2040 operate in continuous time. One of ordinary skill in the art will recognize that the sample-and-hold units 2050 and 2052 may also be used before the input signals 2010 enter the min-detector unit 2030 and the max-detector unit 2040. In this case, the min-detector unit 2030 and max-detector unit 2040 may operate in discrete time. Additional circuitry may used to determine the optimal sampling moment of the sample-and-hold units 2050 and 2052.

Figure 24:
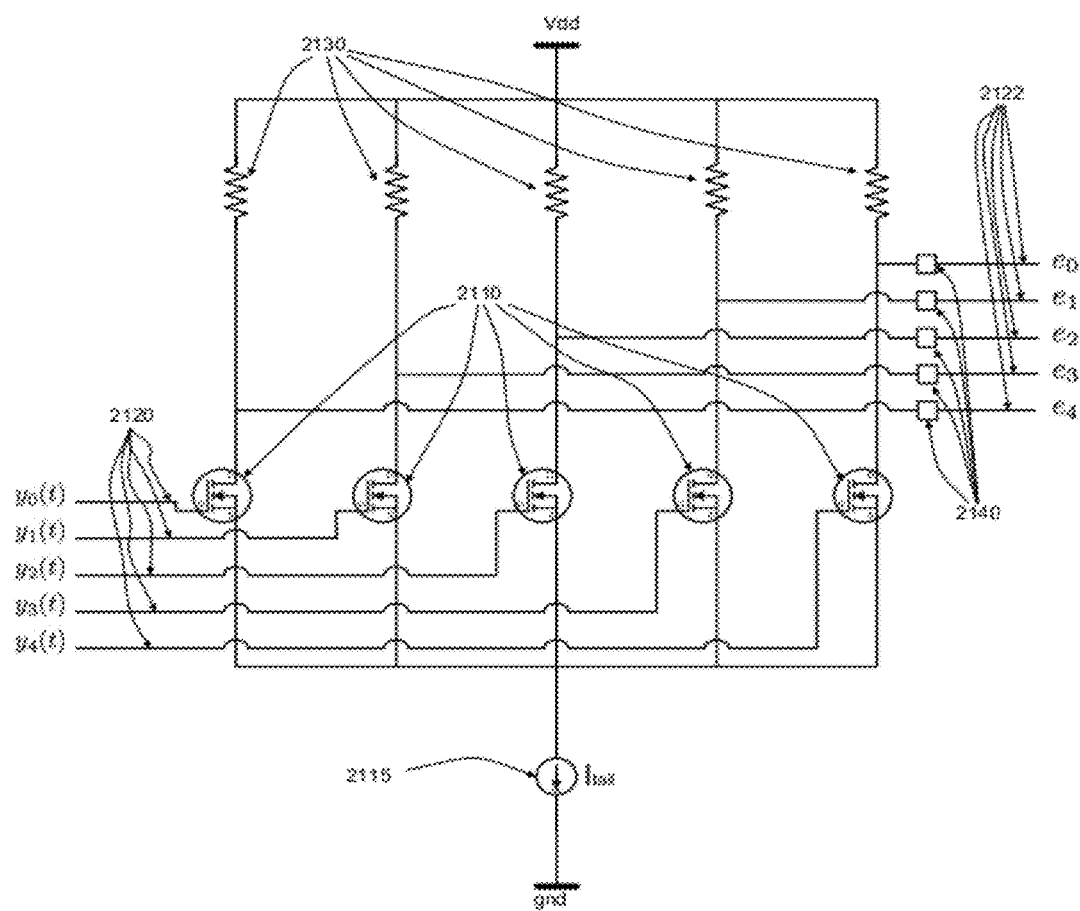
FIG. 24 illustrates an embodiment of a max detector unit.

A preferred embodiment of the max-detector unit 2040 is now further described with reference to FIG. 24. FIG. 24 shows a circuit diagram comprising five NMOS transistors 2110 and five resistors 2130. The inputs to the circuits are the signals 2120 that may be connected to the termination of the bus. Each of the gates of the NMOS transistors 2110 is connected to one of the input signals 2120. The sources of the NMOS transistors are all connected together and a current source 2115 is connected to the sources of the NMOS transistors 2110. The NMOS transistors act as non-linear amplifiers and in case the input voltage $y_i$ crosses a predetermined threshold the i+1-st transistor turns on.

The threshold voltage is predetermined such that for the 4b5w code only one transistor turns on at a time. In case this is the i-th transistor, the current of current source 2115 flows through this i-th transistor and the i-th resistor from the group of resistors 2130. The effect is that the voltage of the i-th output of the group of outputs 2122 drops to a lower value compared to $V_{dd}$. The other outputs in 2122 remain at the level of $V_{dd}$ since no current flows through the resistors corresponding to these outputs. In a preferred embodiment, a set of five sample-and-hold units 2140 may sample these signals and may convert their voltage levels such that these signals are suitable to interface with the logic of the sparse decoder 648.

For a correct and low power functioning of the circuit exemplified in FIG. 22, the signals on the bus should be generated according to a sparse signaling code. The reason for the power efficient functioning of the circuit is that only a single current source 2115 supplies the energy for the circuit and the current $I_{tail}$ can be chosen to be very small (e.g., 100 microamperes). The current $I_{tail}$ will flow through the transistor that corresponds to the wire that carries the 1 symbol of the sparse signaling code. For a preferred embodiment of a min-detector circuit 2030, one may use a similar circuit where the NMOS transistors are replaced by PMOS transistors.

A 4b5w Decoder

Figure 25:
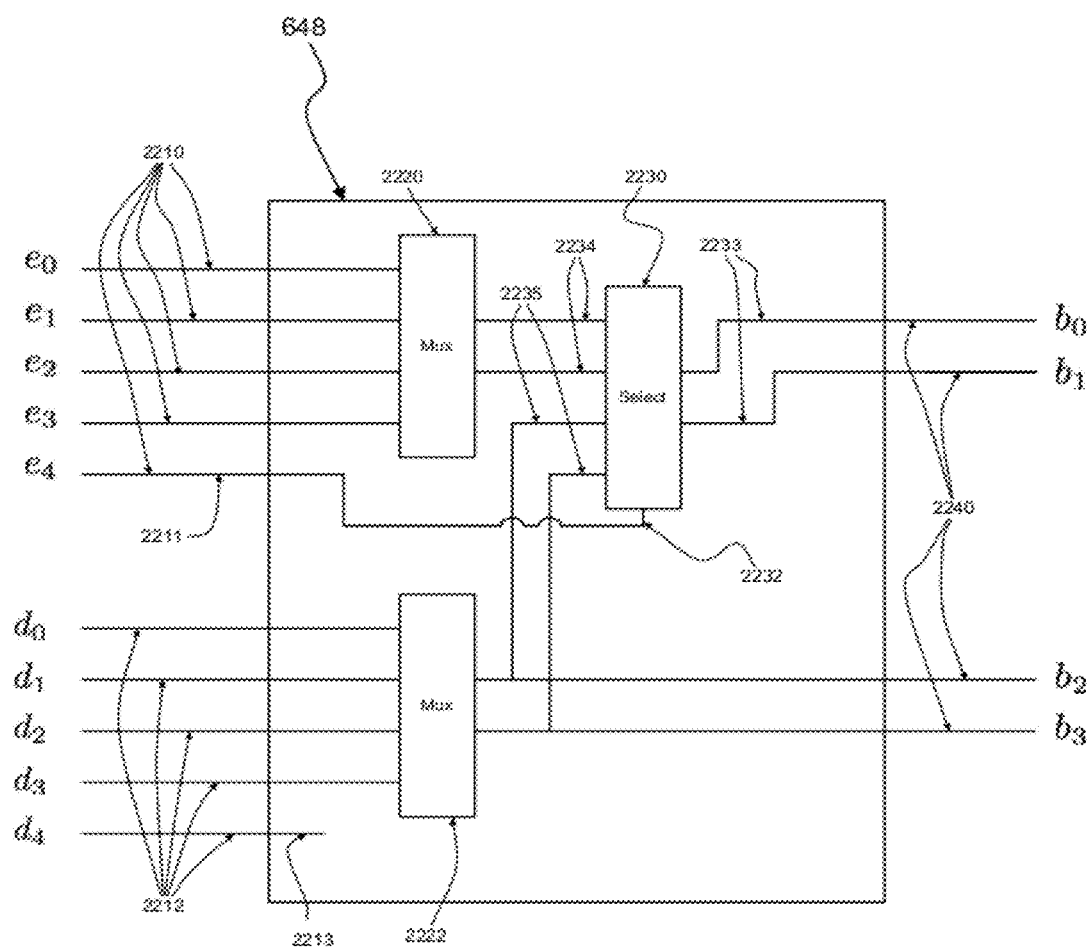
FIG. 25 illustrates an embodiment of a sparse decoder for the 4b5w code that matches the sparse encoder of FIG. 16.

A preferred embodiment of a sparse decoder 648 for the 4b5w code that matches the sparse encoder 624 of FIG. 16 is now further described with reference to FIG. 25. The input of the sparse decoder 648 comprises two sets of five inputs 2210 and 2212. The first set of inputs 2210 is denoted by $e_0, \ldots, e_4$ and when one of these inputs is high, it indicates that the SDC 644 has detected a $-1$ on the corresponding wire. The second set of inputs 2212 is denoted by $d_0, \ldots, d_4$ and when one of these inputs is high, it indicates that the SDC 644 has detected a $-1$ on the corresponding wire.

The sparse decoder 648 may comprise two multiplexer units 2220 and 2222. The multiplexer unit 2220 is connected to the first four inputs of 2210 that are denoted by $e_0, \ldots, e_3$. The input 2211 is connected to the select input 2232 of a select unit 2230. If the select input 2232 is low, the outputs 2233 of the select unit 2230 are equal to the first two inputs 2234. If select input 2232 is low, the outputs 2233 of the select unit 2230 are equal to the second two inputs 2235. The multiplexer unit 2222 is connected to first four inputs of 2212. The input 2213 which corresponds to $d_4$ is not used since the sparse encoder 624 of FIG. 16 will never transmit a $-1$ on the corresponding wire. In FIG. 25, the input 2213 is shown for reasons of clarity. The task of the multiplexer units 2220 and 2222 is illustrated for multiplexer unit 2220 in Table 5. The two outputs 2234 are denoted by $p_0$ and $p_1$ in Table 5.

TABLE 5

| $e_0e_1e_2e_3$ | $p_0p_1$ |
|---|---|
| 1000 | 00 |
| 0100 | 01 |
| 0010 | 10 |
| 0001 | 11 |

The output 2240 of the sparse decoder 648 comprises four bits $b_0$ to $b_3$. The outputs $b_0$ and $b_1$ are equal to the outputs of the select unit 2230 and the outputs $b_2$ and $b_3$ are equal to the output of multiplexer unit 2222. Additional circuitry can be added to the embodiment of FIG. 25 to facilitate for instance error-detection or correction.

Figure 26:
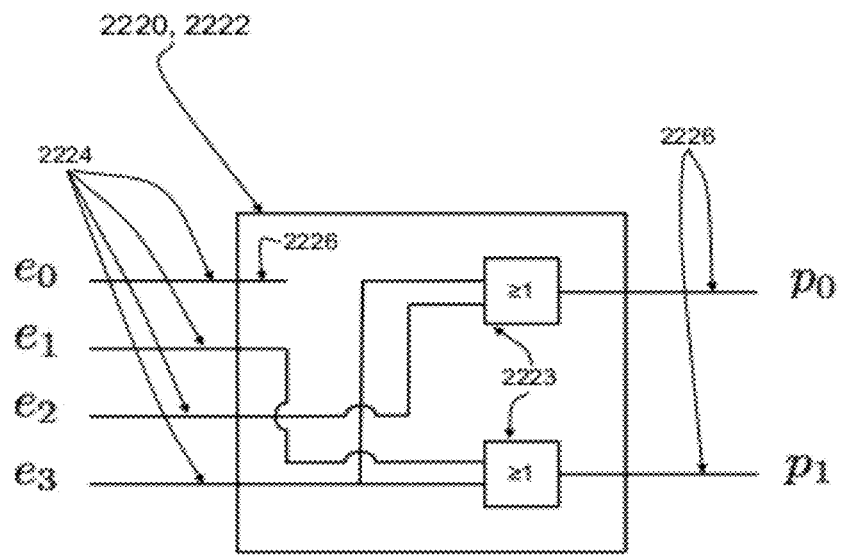
FIG. 26 illustrates an embodiment of a multiplexer unit.
Figure 27:
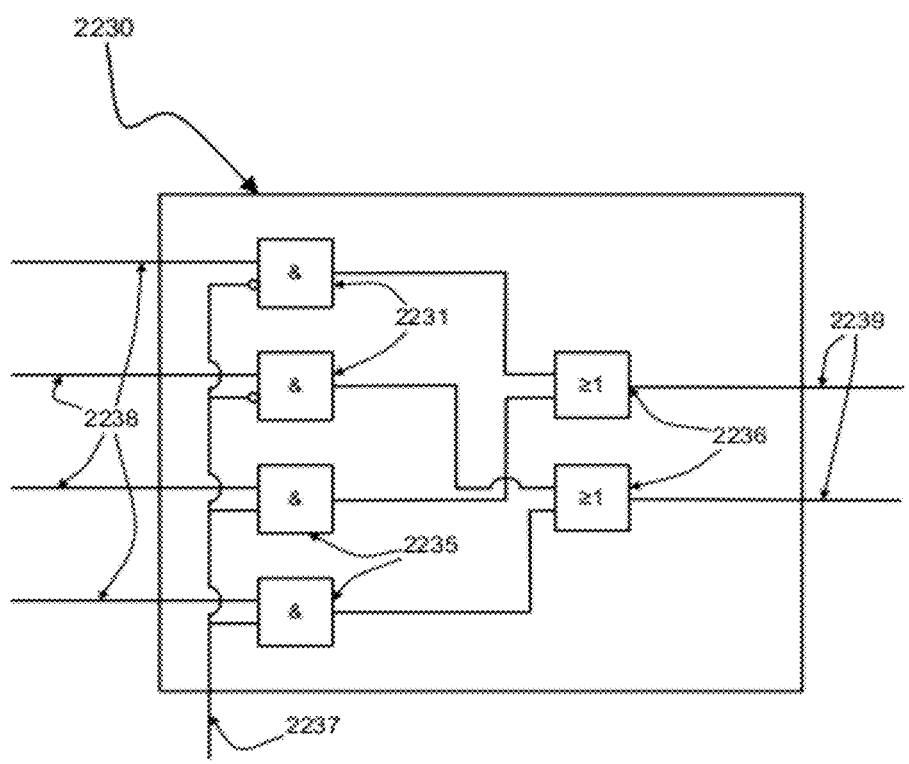
FIG. 27 illustrates an embodiment of a select unit.

A preferred embodiment of the multiplexer unit 2220 and 2222 is exemplified in FIG. 26. The multiplexer unit 2220, 2222 comprises two OR gates 2223. The outputs 2226 of the multiplexer unit 2220, 2222 is set to the outputs of the two OR gates 2223, respectively. The second and fourth input of the inputs 2224 of the multiplexer unit 2220, 2222 are fed to the first OR gate and the third and fourth input of the inputs 2224 are fed to the second OR gate. The OR gates 2223 implement the logic to generate $p_0$ and $p_1$ from $e_0$ to $e_3$ according to Table 5. The first input 2226 is not required to implement the logical function defined by Table 5. A preferred embodiment of the select unit 2230 is shown in FIG. 27. The four inputs 2238 are connected to the first input of four AND gates 2231 and 2235. The second input of the AND gates 2231 and 2235 is connected to the select input 2237. The second input of AND gates 2231 is inverting. The outputs of the AND 2231 and 2235 are forwarded to the OR units 2236 that generate the outputs of the select unit 2230.

Generalizations of the 4B5w Sparse Signaling Code

The 4b5w belongs to a larger family of sparse signaling codes. This family of sparse signaling codes is defined by a basis vector of the form shown in Equation 11.

$$x_0 = \left( -1 \mid 1 \mid \ldots \mid \underbrace{0, \ldots, 0}_{2^k-1} \right) \quad \text{(Eqn. 11)}$$

The size of the basis vector $x_0$ is given by $2^k+1$ and it contains a single 1, a single $-1$ and $2^k-1$ zeros. The 4b5w code is a specific example where $k=2$. A basis vector $x_0$ given by Equation 11 allows one to transmit 2k bits on $2^k+1$ wires. The sparse encoder 624, the sparse driver 628, the SDC 644 and the sparse decoder 648 of the 4b5w code are easily extended for use with the basis vector $x_0$ as given by Equation 11.

A Sparse Signaling Code for Transmitting 8 Bits on 8 Wires

In this embodiment, the bus 630 comprises eight wires (n=8) and in each cycle of 1/T seconds, eight bits are transmitted over the bus 630. Furthermore, the transmitter 620 implements a sparse signaling code that is defined by the sparse basis vector $x_0=[-1, -1, 1, 1, 0, 0, 0, 0]$ of which $2^8=256$ different permutations are used. This leads to full pin-efficiency, i.e., r=1.0. This sparse signaling code is referred to as the 8b8w code.

A 8b8w Encoder

Figure 28:
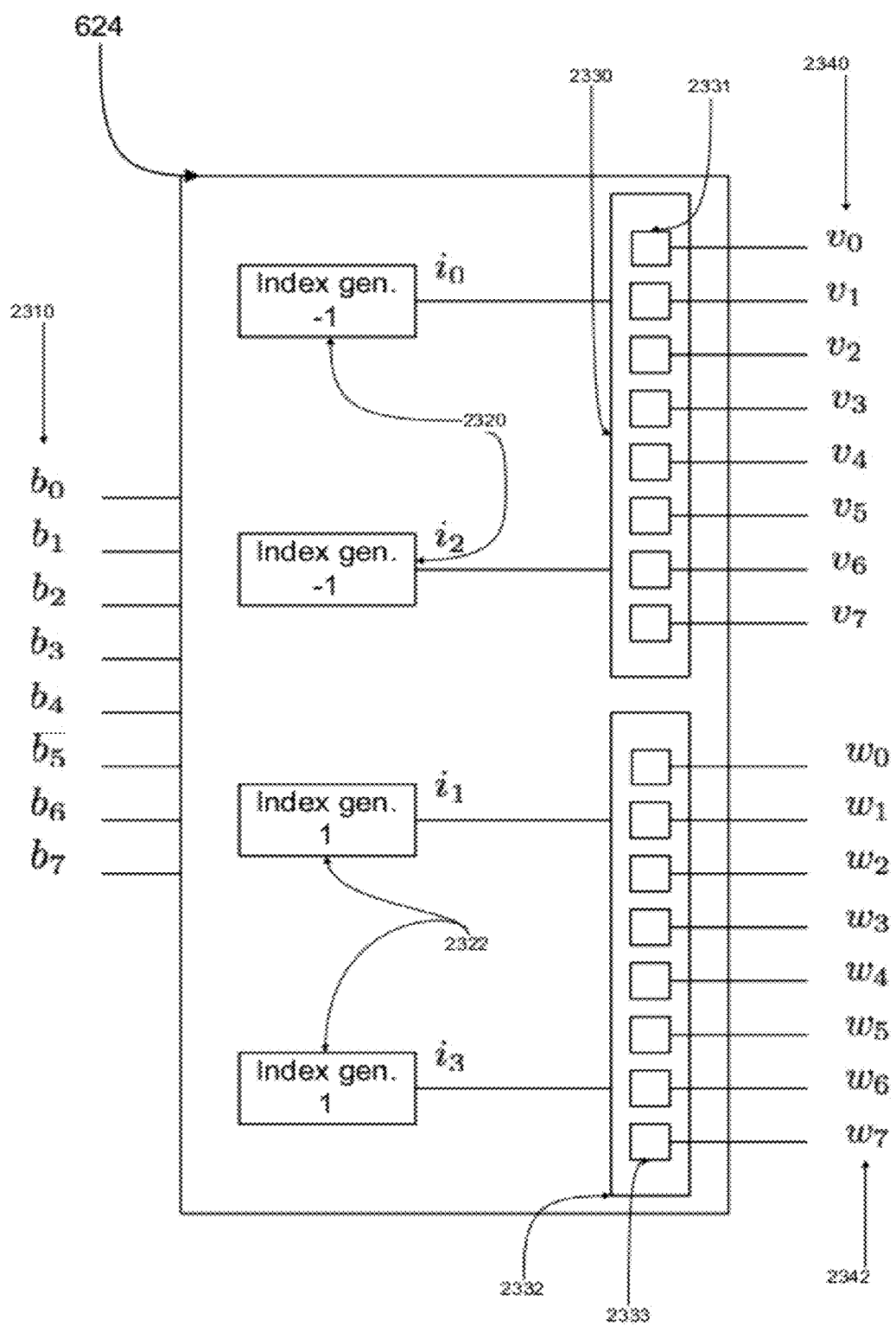
FIG. 28 illustrates an example of a sparse encoder for an 8b8w code.

A preferred embodiment of a sparse encoder 624 for the 8b8w code is exemplified with reference to FIG. 28. The sparse encoder 624 takes as its input 8 bits and returns a permutation of the basis vector $x_0$. The input of the sparse encoder 624 comprises eight bits 2310, which are denoted by $b_0, \ldots, b_7$. The output of the sparse encoder 624 comprises two sets of outputs 2340 and 2342, where each set of outputs comprises eight signals. The first set of output signals 2340 is denoted by $v_0, \ldots, v_7$ and the second set of signals 2342 is denoted by $w_0, \ldots, w_7$.

The sparse encoder 624 may comprise a set of four index generators 2320 and 2322 that generate four indices $i_0, \ldots, i_3$. The indices $i_0$ and $i_2$ are generated by the index generators 2320 and denote the positions in the permutation of $x_0$ that are equal to $-1$. The indices $i_1$ and $i_3$ are generated by index generators 2322 and denote the positions in the permutation of $x_0$ that are equal to 1. The indices $i_0$ and $i_2$ are passed on to a storage device 2330 that comprises eight storage elements or buffers 2331. The value of the eight output signals 2340 is determined by the values in these storage elements or buffers. The indices $i_1$ and $i_3$ are passed on to a storage device 2332 that comprises eight storage elements or buffers 2333. The value of the eight output signals 2342 is determined by the values of these storage elements or buffers. The values of the storage elements or buffers in 2330 and 2332 are initialized by the value of 0.

In some embodiments, the index generators 2320 and 2322 are implemented by LUTs. Each of these LUTs is indexed by an eight bit value corresponding to $b_0, \ldots, b_7$ and each entry of the LUTs contains an integer in the range from 0 to 7. In some embodiments, the LUTs to implement the index generators 2320 and 2322 have 256 entries of 3 bits each (12 bits in total for the four LUTs). The implementation of a LUT with, e.g., a memory such as a ROM or RAM poses several problems at very high speeds. The main disadvantage of using RAMs or ROMS to implement the LUTs is that it is not easy to operate at very high speeds for acceptable power consumption.

To solve this problem, a simple process is desired that is able to generate the indices such that a valid 8b8w sparse signaling code is generated. It is far from a trivial problem to devise such a process in general. However, the present disclosure provides several explicit schemes to facilitate encoding and decoding of sparse signaling codes.

Figure 29:
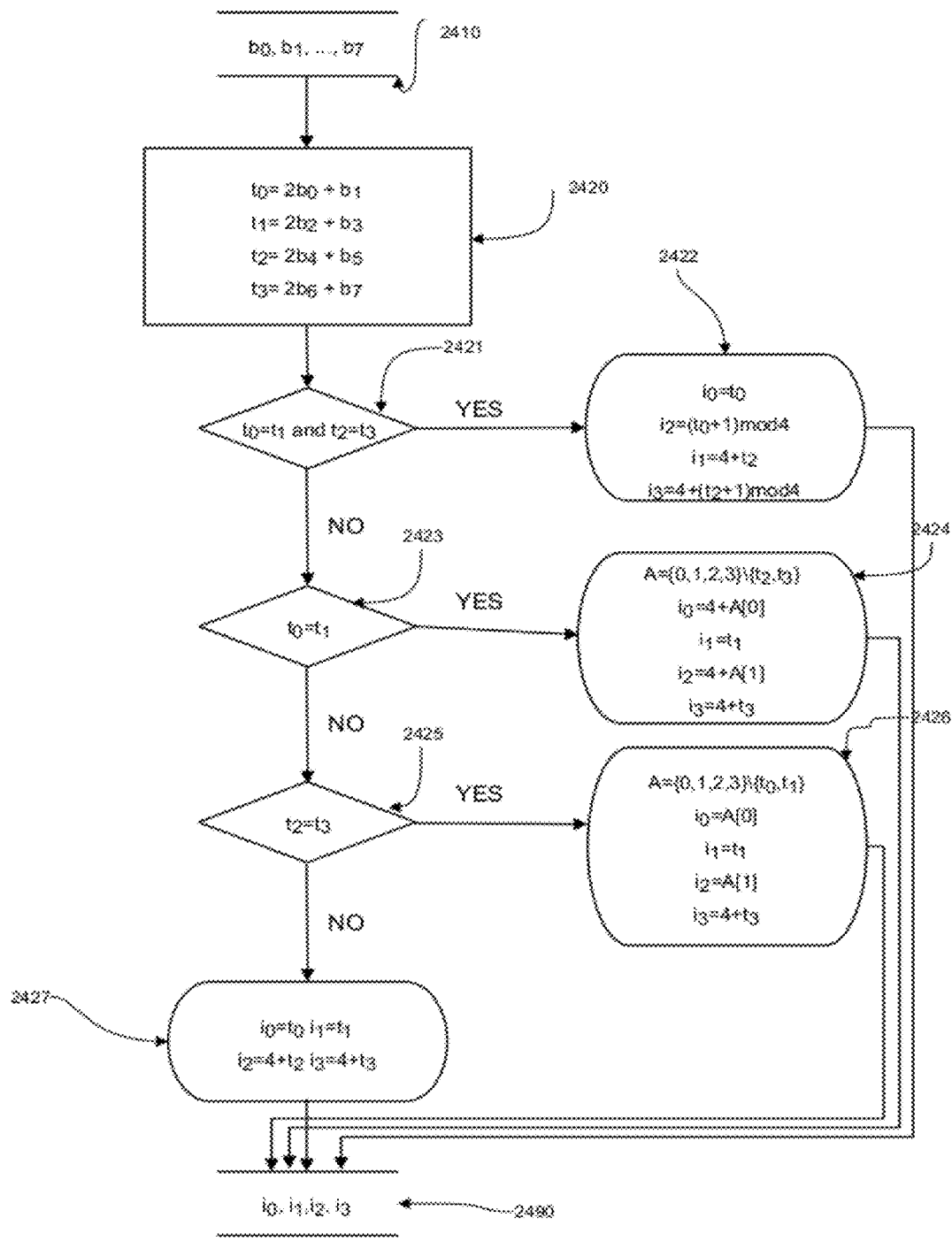
FIG. 29 is a flowchart of a process for generating indices for an 8b8w code.

A process that may be implemented by the index generators 2320 and 2322 to generate the indices $i_0, \ldots, i_3$ for a valid 8b8w code defined by a basis vector $x_0=[-1, -1, 1, 1, 0, 0, 0, 0]$ is shown in FIG. 29. The inputs 2410 to the process are the bits $b_0, \ldots, b_7$ and the outputs 2490 of this encoding process are the four indices $i_0$, $i_1$, $i_2$ and $i_3$. The indices $i_0$ and $i_2$ are equal to the positions of the $-1$s in a vector that corresponds to the permutation of the basis vector $x_0$ and the indices $i_1$ and $i_3$ are equal to the positions of the 1s.

In step 2420, four indices $t_0, \ldots, t_3$ are formed from the eight input bits in 2410. The way this is done is by converting pairs of input bits to their decimal representation, i.e., $b_0$ and $b_1$ are converted to $2b_0+b_1$. In the process exemplified in FIG. 29, four different cases can be distinguished. The first case is tested in Step 2421 and occurs when $t_0=t_1$ and $t_2=t_3$. When this case is true, the indices $i_0, \ldots, i_3$ are set according to the calculations performed in Step 2422. The second case occurs when $t_0=t_1$ and $t_2 \neq t_3$. The test for this case is in Step 2423 and when true, indices $i_0, \ldots, i_3$ are set according to the calculations performed in Step 2424. It should be understood that these calculations are performed by electronic logic and/or circuits in practical implementations.

In Step 2424, the set A is formed as follows. Initially, the set A contains the integers 0, 1, 2 and 3. From this set, the integers $t_2$ and $t_3$ are removed. The smallest element of the remaining set is denoted by A[0] and the largest element of the remaining set is denoted by A[1]. The third case occurs when $t_0 \neq t_1$ and $t_2=t_3$. The test for this case is in Step 2425 and when true, indices $i_0, \ldots, i_3$ are set according to the calculations performed in Step 2426. The fourth case is the default case and occurs when $t_0 \neq t_1$ and $t_2 \neq t_3$. When this case occurs, the indices $i_0, \ldots, i_3$ are set according to Step 2427. The table shown in FIG. 30 shows the mapping from the decimal representation $128b_7+64b_6+32b_5+16b_4+8b_3+4b_2+2b_1+b_0$ of the bits $b_0, \ldots, b_7$ to the integers $i_0, \ldots, i_3$.

Figure 31:
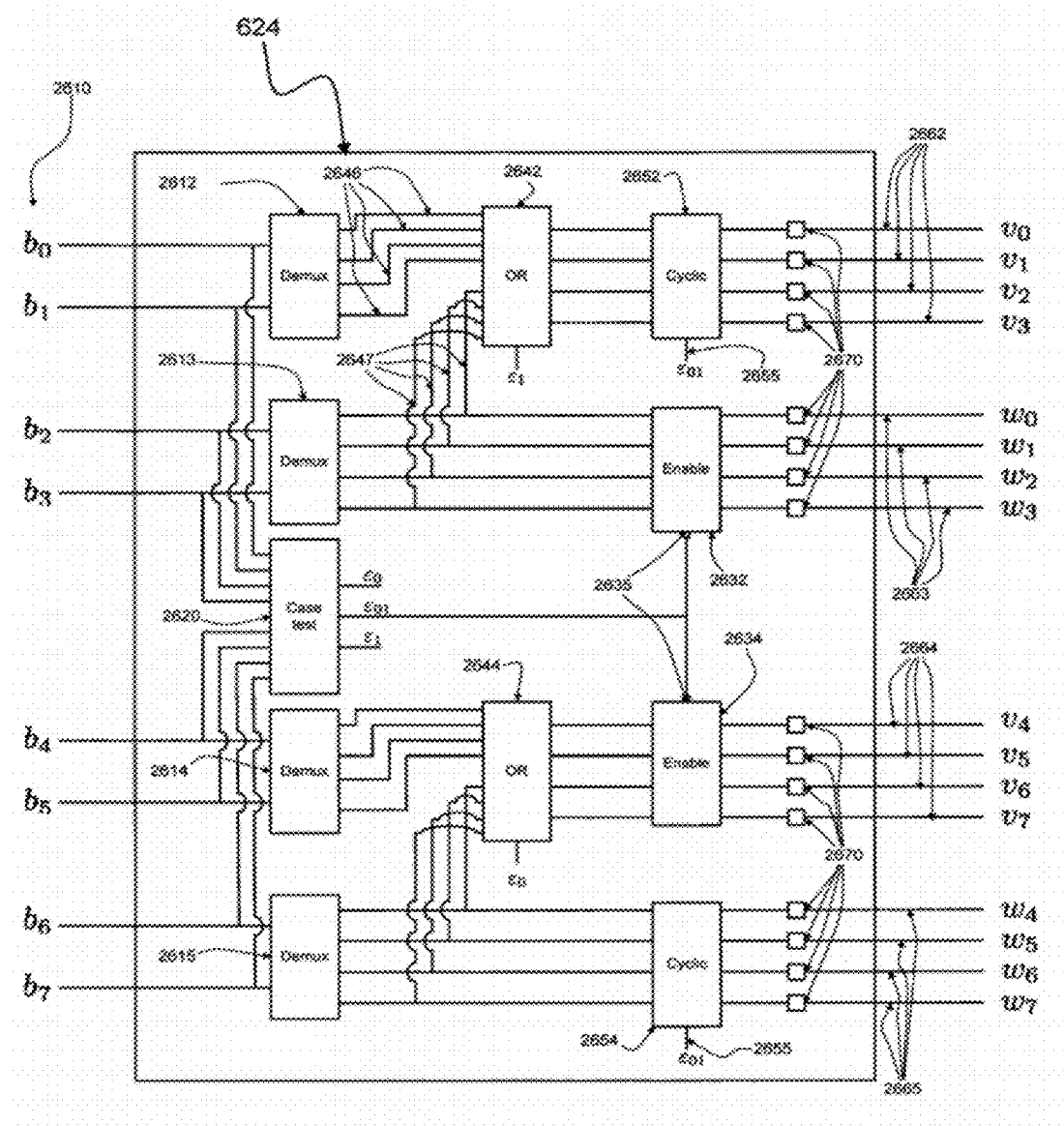
FIG. 31 is a block diagram of an implementation of aspects of an encoder for an 8b8w code.

In a preferred embodiment the process exemplified in FIG. 29 is implemented with basic building blocks as shown in FIG. 31. The inputs to the sparse encoder 624 in FIG. 31 are the eight bits $b_0, \ldots, b_7$ and the output comprises four sets of signals. The first and third set of output signals 2662 and 2664 are denoted by $v_0, \ldots, v_3$ and $v_4, \ldots, v_7$, respectively. These output signals are logical signals and signal $v_i$ corresponds to wire i. When signal $v_i$ is high, this may indicate that on wire i a $-1$ is transmitted. The second and fourth set of output signals 2663 and 2665 are denoted by $w_0, \ldots, w_3$ and $w_4, \ldots, w_7$, respectively. These output signals are logical signals and signal $w_i$ corresponds to wire i. When signal $w_i$ is high, this may indicate that on wire i a 1 is transmitted. The eight input bits 2610 are split into four pairs $(b_0, b_1)$, $(b_2, b_3)$, $(b_4, b_5)$ and $(b_6, b_7)$. Each pair is fed to a de-multiplexer unit 2612, 2613, 2614, 2615, respectively, where it is understood that the i-th pair is fed to the i-th multiplexer unit. The logical function that the de-multiplexer units 2612, 2613, 2614 and 2615 implement is illustrated for de-multiplexer unit 2612 in Table 6 where the outputs of the de-multiplexer unit are denoted by $p_0, \ldots, p_3$.

TABLE 6

| $b_0 b_1$ | $p_0 p_1 p_2 p_3$ |
| --- | --- |
| 00 | 1000 |
| 01 | 0100 |
| 10 | 0010 |
| 11 | 0001 |

The outputs of de-multiplexer units 2612 and 2614 are fed to OR units 2642 and 2644, respectively. The outputs of de-multiplexer units 2613 are fed to enable unit 2632 and the outputs of the de-multiplexer unit 2615 is fed the cyclic shift unit 2654. A case test unit 2620 has as its input the bits $b_0, \ldots, b_7$ and three outputs that are denoted by $\epsilon_0$, $\epsilon_{01}$ and $\epsilon_1$. The inputs of the case test unit 2620 are the four pairs of bits 2610 and depending on the values of the four pairs of bits one of the outputs is high and the other two outputs are low. Table 7 lists the logical values of the outputs $\epsilon_0$, $\epsilon_{01}$ and $\epsilon_1$ as a function of the input bits $b_0, \ldots, b_7$.

TABLE 7

| Case | $\epsilon_0 \epsilon_{01} \epsilon_1$ |
| --- | --- |
| $b_0 b_1 = b_2 b_3 \wedge b_4 b_5 = b_6 b_7$ | 010 |
| $b_0 b_1 = b_2 b_3 \wedge b_4 b_5 \neq b_6 b_7$ | 100 |
| $b_0 b_1 \neq b_2 b_3 \wedge b_4 b_5 = b_6 b_7$ | 001 |

The cases of Table 7 correspond to the case tests 2421, 2423 and 2435 of the process exemplified in FIG. 29. The output $\epsilon_0$ of the case test unit 2620 is input to an OR unit 2644, the output $\epsilon_{01}$ is input to two enable units 2632 and 2634, the output $\epsilon_1$ is input to an OR unit 2642. Each of the OR units 2642 and 2644 has a select input, eight inputs and four outputs. The operation of the OR units 2642 and 2644 is further explained with reference to OR unit 2642. The operation of OR unit 2644 is similar. The input of OR unit 2642 comprises four input signals 2646 originating from de-multiplexer unit 2612 and of four input signals 2647 originating from de-multiplexer unit 2613. The first four input signals 2646 are denoted by $c_0, \ldots, c_3$ and the second four input signals 2647 are denoted by $d_0, \ldots, d_3$. In case output $\epsilon_1$ of the case test unit 2620 is low the four outputs of the OR unit 2642 are equal to $c_0, c_1, c_2, c_3$ and in case $\epsilon_1$ is high the four outputs of the OR unit are equal to $\overline{c_0 \vee d_0}$, $\overline{c_1 \vee d_1}$, $\overline{c_2 \vee d_2}$, $\overline{c_3 \vee d_3}$.

The enable units 2632 and 2634 have a select input 2635, four inputs and four outputs. The select input 2635 of the enable units 2632 and 2634 are inverting. When output $\epsilon_{01}$ of the case test unit 2620 is high the output of the enable units is low and when $\epsilon_{01}$ is low, the outputs of the enable units are equal to their respective inputs. The cyclic shift units 2652 and 2654 both have a select input 2655, four inputs and four outputs. The select input is connected to output $\epsilon_{01}$ of the case test unit 2620. In case the select input of the cyclic shift units 2652 and 2654 are low, the outputs are equal to the inputs. In case the select input is high, the cyclic shift units 2652 and 2654 map the four possible inputs to outputs as defined in Table 8.

TABLE 8

| Input | Output |
| --- | --- |
| 1000 | 1100 |
| 0100 | 0110 |
| 0010 | 0011 |
| 0001 | 1001 |

The cyclic shift units 2652 and 2654 implement the assignment in Step 2422 of the process exemplified in FIG. 29. The outputs $v_0, \ldots, v_3$ are equal to the outputs of the cyclic shift unit 2652, the outputs $v_4, \ldots, v_7$ are equal to the outputs of the enable unit 2632, the outputs $w_0, \ldots, w_3$ are equal to the outputs of the enable unit 2632 and the outputs $w_4, \ldots, w_7$ are equal to the outputs of cyclic shift unit 2654. One may require a set of additional flip-flops or latches 2670 to ensure stability of the output signals 2662, 2663, 2664, 2665.

Figure 32:
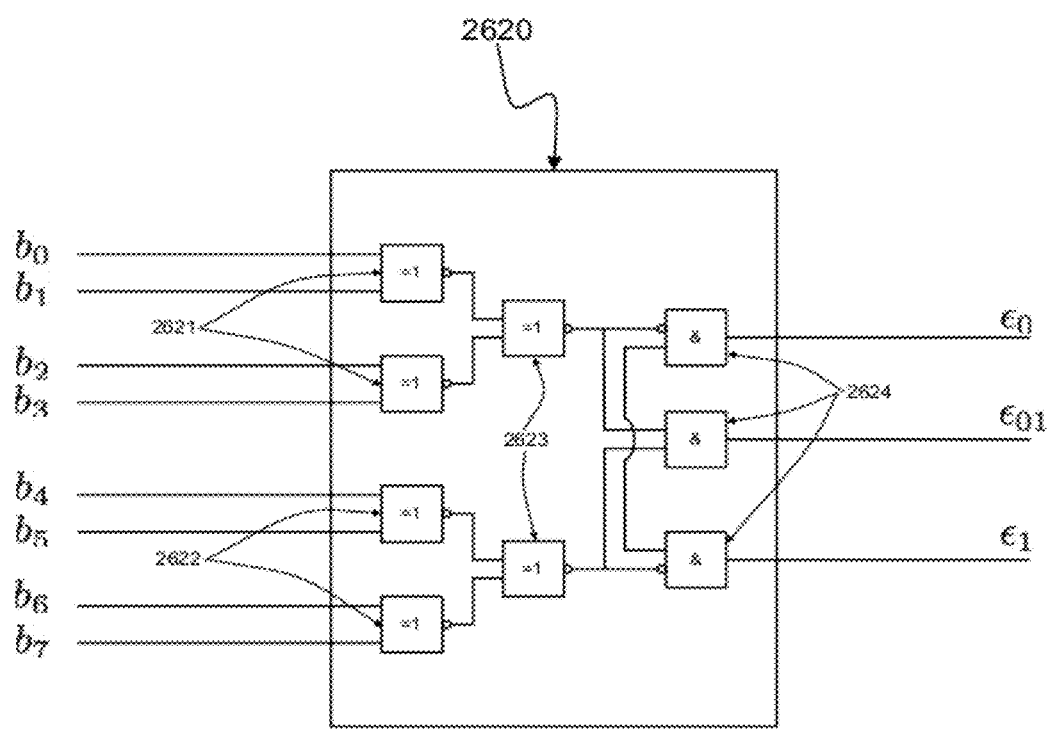
FIG. 32 is a block diagram of an implementation of aspects of an encoder for an 8b8w code.

A preferred embodiment of the de-multiplexer units 2612, 2613, 2614 and 2615 is shown in FIG. 17. This de-multiplexer unit is also used in a preferred embodiment of the 4b5w encoder and is described in more detail above. A preferred embodiment of the case test unit 2620 is shown in FIG. 32. The two pair of inputs $(b_0,b_1)$ and $(b_2,b_3)$ are input to two XOR gates 2621 and the two pairs of inputs $(b_4,b_5)$ and $(b_6,b_7)$ are input to two XOR gates 2622. The outputs of XOR gates 2621 and 2622 are inverting. The outputs of the first layer of XOR gates 2621 and 2622 are fed to a second layer of XOR gates 2623 whose outputs are inverting also. The outputs of XOR gates 2623 are fed to three AND gates 2624 to produce the output signals $\epsilon_0, \epsilon_{01}$ and $\epsilon_1$. Note that some of the inputs of the AND gates 2624 are inverting.

Figure 33:
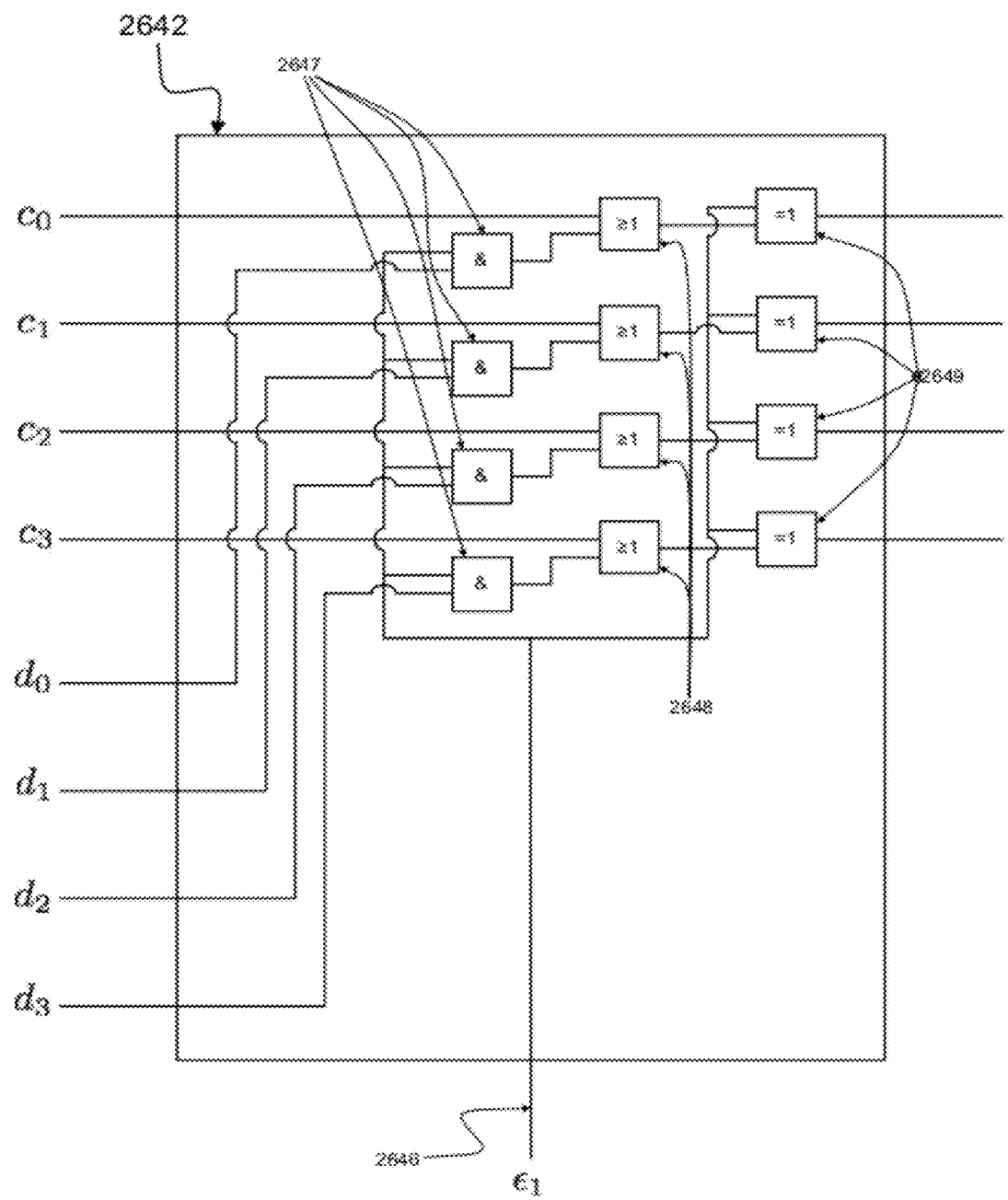
FIG. 33 is a block diagram of an implementation of aspects of an encoder for an 8b8w code.

A preferred embodiment for the enable units 2632 and 2634 is shown in FIG. 19. This enable unit is also used in a preferred embodiment of the 4b5w encoder and is described in more detail above. A preferred embodiment of the OR unit 2642 is exemplified with reference to FIG. 33. A preferred embodiment of the OR unit 2644 may have a similar implementation as the OR unit 2642. The first set of inputs $c_0, \ldots, c_3$ are fed to the first input of four OR gates 2648. The second set of inputs $d_0, \ldots, d_3$ are fed to the second input of four AND gates 2647. The first input of these AND gates 2647 is connected to the input $\epsilon_1$. When $\epsilon_1$ is high the outputs of the AND gates 2647 are equal to their second input and otherwise the outputs are low. Hence when $\epsilon_1$ is high the output of the i-th gate of the OR gates 2648 is equal to $c_i \vee d_i$. The XOR gates 2649 act as inverters when $\epsilon_1$ is high and otherwise they pass their second input as is.

Figure 34:
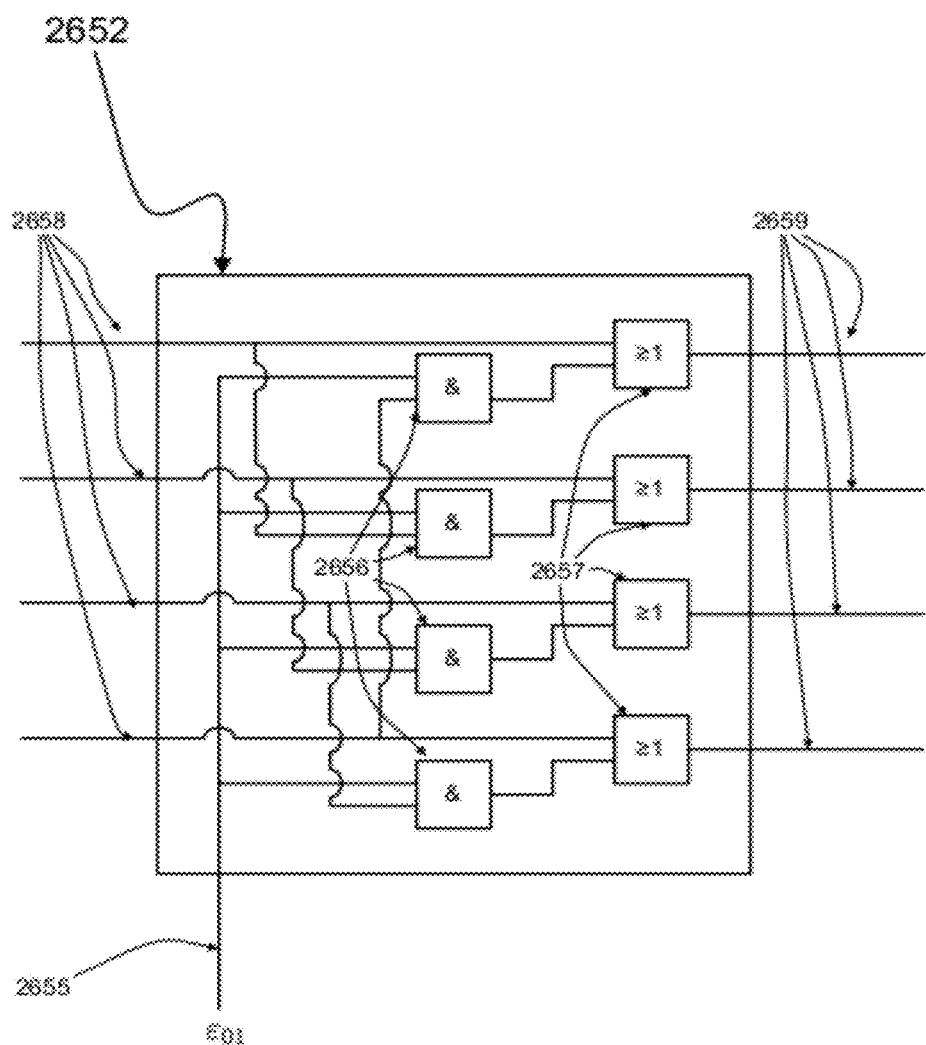
FIG. 34 is a block diagram of an implementation of aspects of an encoder for an 8b8w code.

A preferred embodiment of the cyclic shift unit 2652 is shown in FIG. 34. A preferred embodiment of the cyclic shift unit 2654 may have a similar implementation as the cyclic shift unit 2652. The cyclic shift unit 2652 comprises four AND gates 2656. The first input of these AND gates 2656 is connected to the select input 2655 of the cyclic shift unit 2652. The four inputs 2658 of the cyclic shift unit 2652 are connected to a set of four OR units 2657. The outputs 2659 of the cyclic shift unit 2652 are given by the outputs of the OR units 2657. In case the select input 2655 is high the cyclic shift input implements adds a second high value to the outputs 2659 such that the input to output relation of Table 8 is realized.

A 8b8w Sparse Driver

Figure 35:
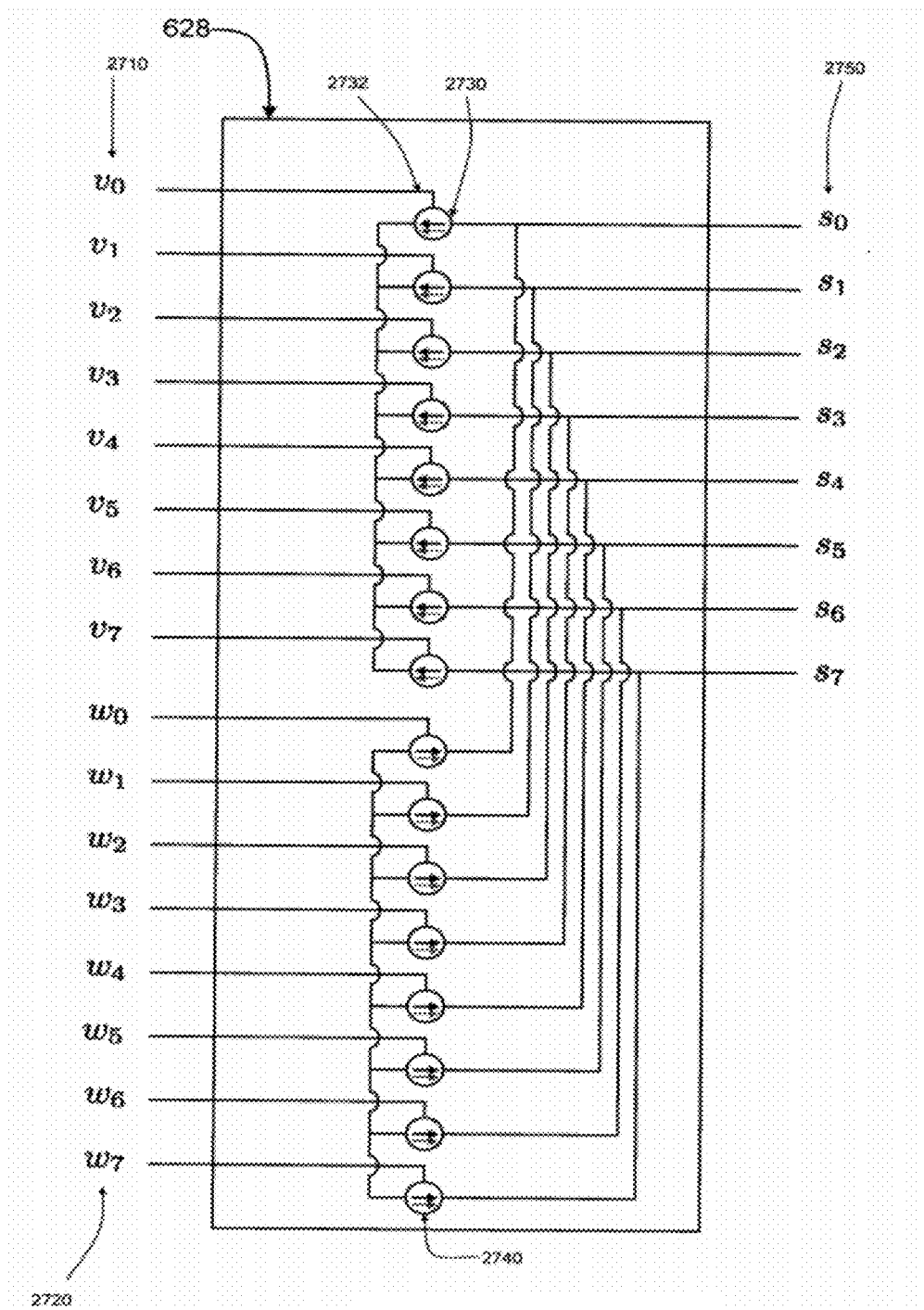
FIG. 35 illustrates another sparse driver for an 8b8w encoder.

A sparse driver 628 for the 8b8w encoder is exemplified in FIG. 35. The sparse driver 628 has eight outputs 2750 that are denoted by $s_0, \ldots, s_7$. Each if the outputs is connected to two current sources of which one is sinking current from the output and one is sourcing current into the output. The inputs of the sparse driver 628 are divided into two groups. The first group of inputs 2710 denoted by $v_0, \ldots, v_7$ corresponds to the wires on which a −1 is sent. Each of the inputs 2710 is connected to a control input 2732 of a current source 2730. When the input $v_i$ is high the corresponding current source sinks a current of I from the i-th output. The second group of inputs 2720 denoted by $w_0, \ldots, w_7$ corresponds to the wires on which a +1 is sent. Each of the inputs 2720 is connected to a control input of one of the sourcing current sources 2740. When the input $w_i$ is high the corresponding current source sources a current of strength I into the i-th output.

Figure 36:
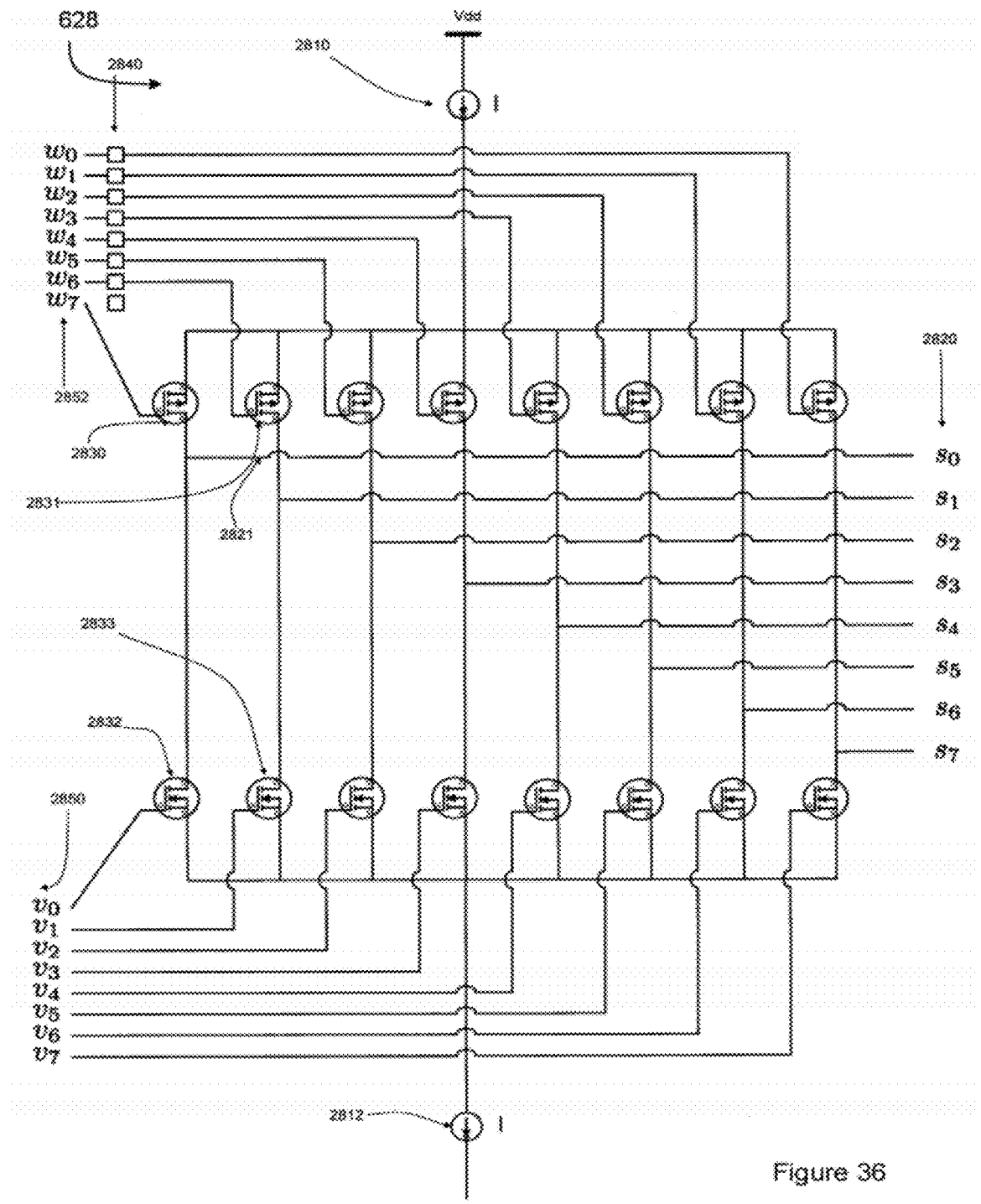
FIG. 36 illustrates the sparse driver of FIG. 35 at a more detailed level.

A preferred embodiment of the sparse driver 624 at a transistor level is exemplified in FIG. 36. The input of the sparse driver 628 comprises two sets of inputs 2850 and 2852 that are denoted by $v_0, \ldots, v_7$ and $w_0, \ldots, w_7$, respectively. The output comprises eight signals 2820 that are denoted by $s_0, \ldots, s_7$. The architecture of the sparse driver 624 of FIG. 36 is similar to the sparse driver for the 4b5w code exemplified in FIG. 24. Current source 2810 sources a current of strength I into two of the wires depending on which of the PMOS transistors are switched on. In case only PMOS transistor 2830 and 2831 are turned on, the current of current source 2810 is sourced into the wires corresponding to the outputs $s_0$ and $s_{-1}$. In case the loads of these wires are equal, the current is split equally between these two wires. Current source 2812 sinks a current of strength I from two wires of which the connected NMOS transistors are turned on. In case NMOS transistors 2832 and 2833 are turned on the current is sinked from the wires corresponding to the outputs $s_0$ and $s_1$.

A 8b8w Signal-to-Digital Converter

Figure 37:
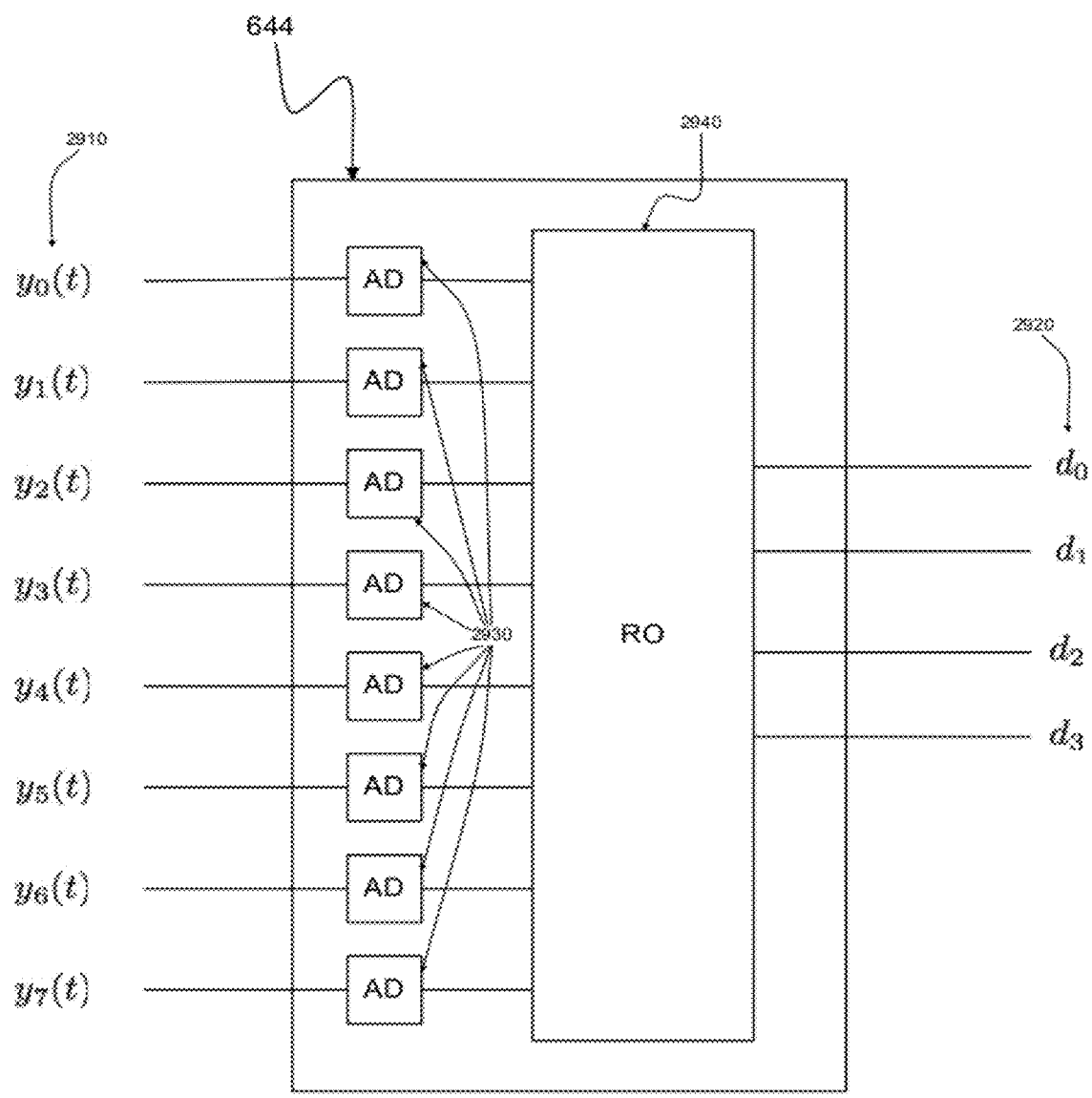
FIG. 37 illustrates an embodiment of an SDC for the 8b8w code of FIG. 35.

A preferred embodiment of a SDC 644 for the 8b8w code is shown in FIG. 37. The inputs of the SDC 644 are eight signals 2910 that are denoted by $y_0(t), \ldots, y_7(t)$. It is assumed that these signals are proportional to the signals generated by the sparse encoder 624 and sparse driver 628 for the 8b8w code. In case the bus is driven in current-mode, the signals $y_0(t), \ldots, y_7(t)$ may be proportional to these currents. The bus may be terminated by resistors, with $y_0(t), \ldots, y_7(t)$ being voltages sensed across the termination resistors.

The SDC comprises eight analog-to-digital converters (ADCs) 2930 denoted by AD. The i-th ADC samples signal $y_{i-1}$ and generates a sample $z_{i-1}$. A clock-and-data recovery unit may determine the time instance within the cycle of 1/T seconds at which the signals are sampled. The set of samples generated by the ADC is denoted by $z_0, \ldots, z_7$. A resolution of 2 bits for the ADC is sufficient to distinguish the different levels as generated by the 8b8w code. A rank-order unit 2940 selects the two largest and the two smallest of the samples $z_0, \ldots, z_7$.

The most likely permutation of the basis vector $x_0$ can be identified when the two largest and two smallest samples from $z_0, \ldots, z_7$ are known. The output of the SDC comprises four indices $d_0, d_1, d_2$ and $d_3$. The indices $d_0$ and $d_1$ may represent the indices of the wires where the two largest values have been observed and the indices $d_2$ and $d_3$ may represent the indices of the wires where the two smallest values have been observed. The resolution of the ADCs 2930 may be chosen in such a way that additional signal processing operations can be performed right after AD conversions. Such operations may include for instance equalization and clock recovery. As with a preferred embodiment of the SDC 644 for the 4b5w code, an architecture with AD converters 2930 is not very cheap in terms of power usage.

The properties of the sparse signaling codes can be used to implement an efficient SDC architecture. A preferred embodiment that accomplishes this is described with reference to FIG. 38. The input of the SDC 648 exemplified in FIG. 38 comprises eight input signals 3010 that are denoted by $y_0(t), \ldots, y_7(t)$. The SDC comprises a min2-detector unit 3030 and a max2-detector unit 3040. The input of the min2-detector unit 3030 comprises the eight input signals 3010. The task of the min2-detector is to find the two inputs on which the two smallest values are present. The input of the max2-detector unit 3040 comprises the eight input signals 3010. The task of the max2-detector is to find the two inputs on which the two largest values are present. The output of the SDC 648 comprises two sets of signals. The first set of signals 3020 is the output of the min2-detector unit 3030 and denoted by $d_0, \ldots, d_7$. The values of signals 3020 encode on which inputs of the min2-detector the two smallest values are detected.

For this purpose, a logical one on output $d_i$ may indicate that one of the two smallest values is detected on the input corresponding to $y_i(t)$. The second set of signals 3022 is the output of the max-detector unit 3040 and is denoted by $e_0, \ldots, e_7$. The values of signals 3022 encode on which inputs of the max2-detector the two largest values are detected. For this purpose, a logical one on output $d_i$ may indicate that one of the two largest values is detected on the input corresponding to $y_i(t)$. These signals 3020 and 3022 may be converted to logical signals to match the input of the sparse decoder 648. The SDC 648 may include a set of sample-and-hold or track-and-hold units 3050 and 3052 for the outputs 3020 and 3022.

Figure 38:
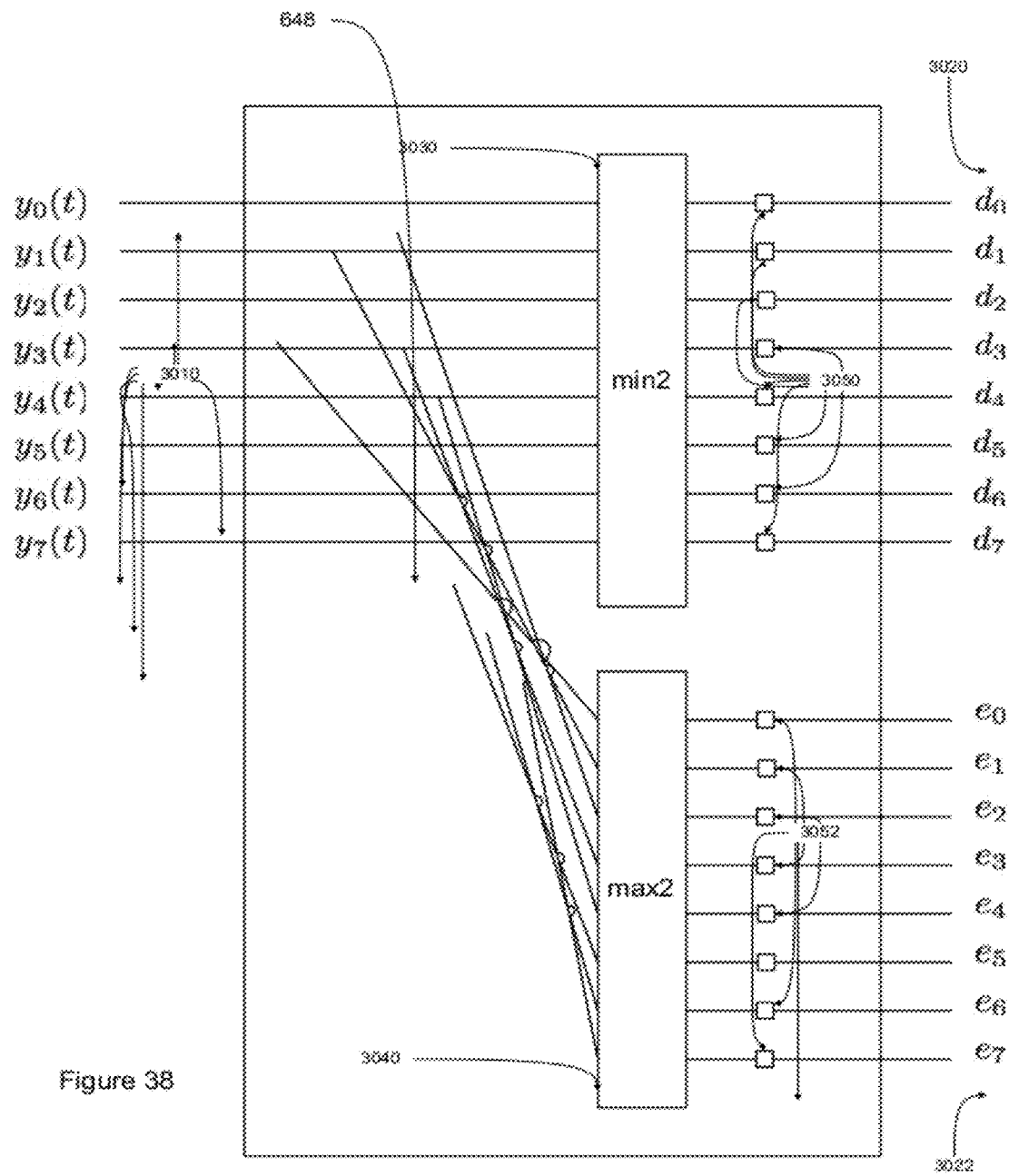
FIG. 38 illustrates an implementation of a particular SDC.

In the embodiment of FIG. 38, the min2-detector unit 3030 and the max2-detector unit 3040 operate in continuous time. The sample-and-hold units 3050 and 3052 may also be used before the input signals 3010 enter the min2-detector unit 3030 and the max2-detector unit 3040. In this case the min2-detector unit 3030 and max2-detector unit 3040 may operate in discrete time. Additional circuitry may used to determine the optimal sampling moment of the sample-and-hold units 3050 and 3052.

Figure 39:
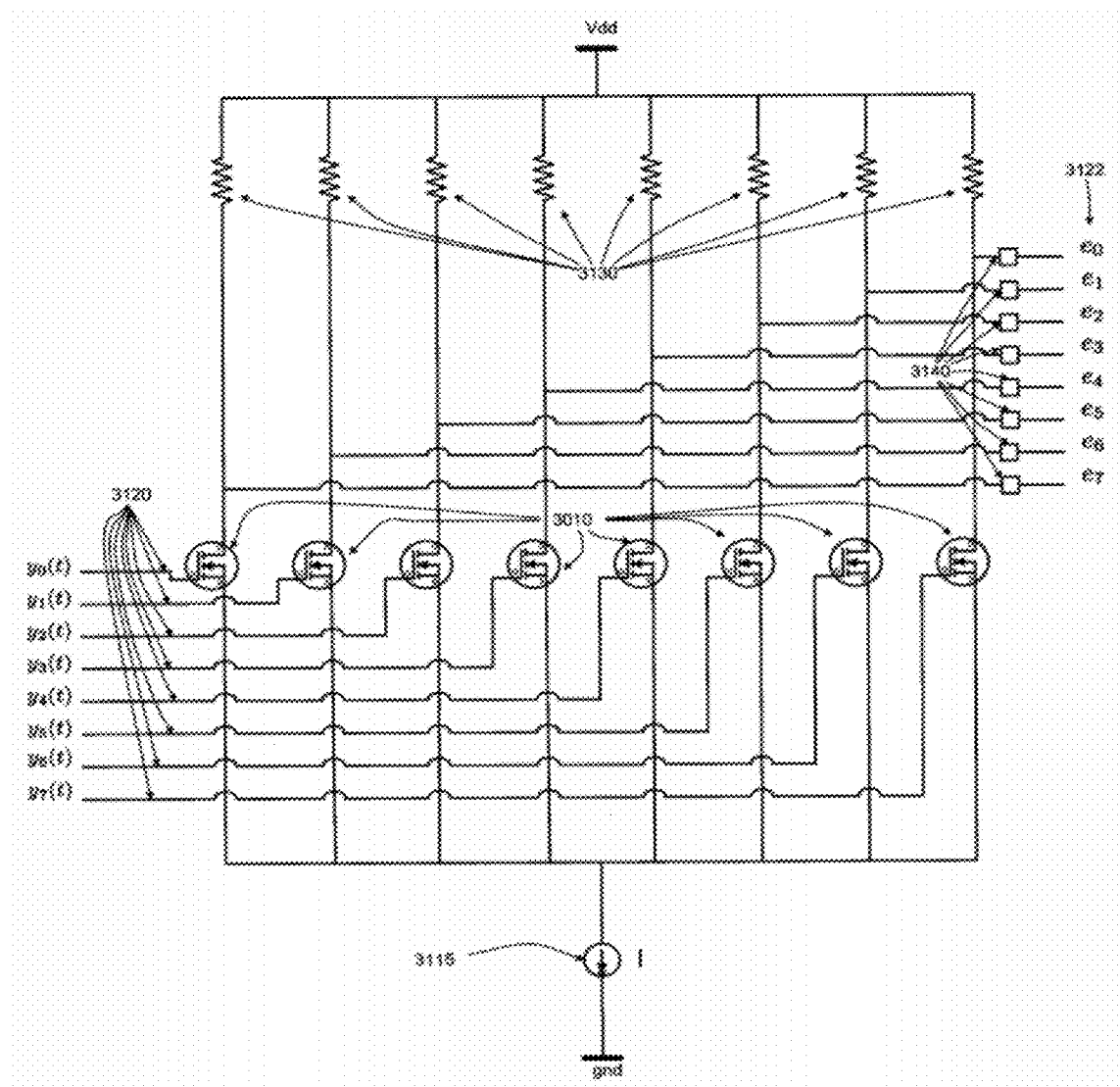
FIG. 39 illustrates an embodiment of a detector unit.

A preferred embodiment of the max2-detector unit 3040 is now further described with reference to FIG. 39. FIG. 39 shows a circuit diagram comprising eight NMOS transistors 3110 and eight resistors 3130. The inputs to the circuits are the signals 3120 that may be connected to the termination of the bus. Each of the gates of the NMOS transistors 3110 is connected to one of the input signals 3120. The sources of the NMOS transistors are all connected together and a current source 3115 is connected to the sources of the NMOS transistors 3110. The NMOS transistors act as non-linear amplifiers and in case the input voltage $y_i$ crosses a predetermined threshold the i-th transistor turns on. The threshold voltage is predetermined such that for the 8b8w code only two transistor turns on at a time. In case these are the i-th and j-th transistor, the current of current source 3115 flows through the i-th transistor and the j-th transistor and the i-th and j-th resistor from the group of resistors 3130. The effect is that the voltage of the i-th and j-th output of the group of outputs 3122 drops to a lower value compared to $V_{dd}$. The exact drop in voltage is influenced by several factors such as the size of I and the values of the resistors 3130 as will be recognized by one of ordinary skill in the art.

The other outputs in 3122 remain at the level of $V_{dd}$ since no current flows through the resistors corresponding to these outputs. A set of eight sample-and-hold units 3140 may sample these signals and may convert their voltage levels such that these signals are suitable to interface with the logic of the sparse decoder 648.

For a correct and low power functioning of the circuit exemplified in FIG. 39, the signals on the bus should be generated according to a sparse signaling code. One reason for the power efficient functioning of the circuit is that only a single current source 3115 supplies the energy for the circuit and the current I can be chosen to be very small (e.g., 100 microamperes). The current I will flow through the transistors that corresponds to the wires that carries the 1 symbol of the sparse signaling code. For a preferred embodiment of a max2-detector circuit 3040, one may use a similar circuit where the NMOS transistors are replaced by PMOS transistors.

A 8b8w Decoder

A process for decoding the 8b8w code that matches the encoding process for the 8b8w code exemplified in FIG. 28 is now described with reference to FIG. 40. The input of the encoding process comprises two sets of signals which are denoted by $d_0, \ldots, d_7$ and $e_0, \ldots e_7$, respectively.

These two sets of signals can be generated by a SDC 648 for the 8b8w code as exemplified in FIG. 38. The signals $d_0, \ldots, d_7$ encode the positions of the $-1$'s and the signals $e_0, \ldots e_7$ encode the positions of the 1's. A logical one for one of these signals indicates that one the corresponding wire a +1 or $-1$ has been transmitted. The output of the process comprises the eight bits $b_0, \ldots, b_7$. In Step 3220, four quantities n0, p0, n1, and p1 are set by applying a function cnt( ... ) to subsets of $d_0, \ldots, d_7$ and $e_0, \ldots e_7$. The value of the function cnt( ... ) is equal to the number of logical ones that are present in the four inputs. These values of n0, p0, n1, and p1 are used in later steps in the process of FIG. 40.

Figure 40:
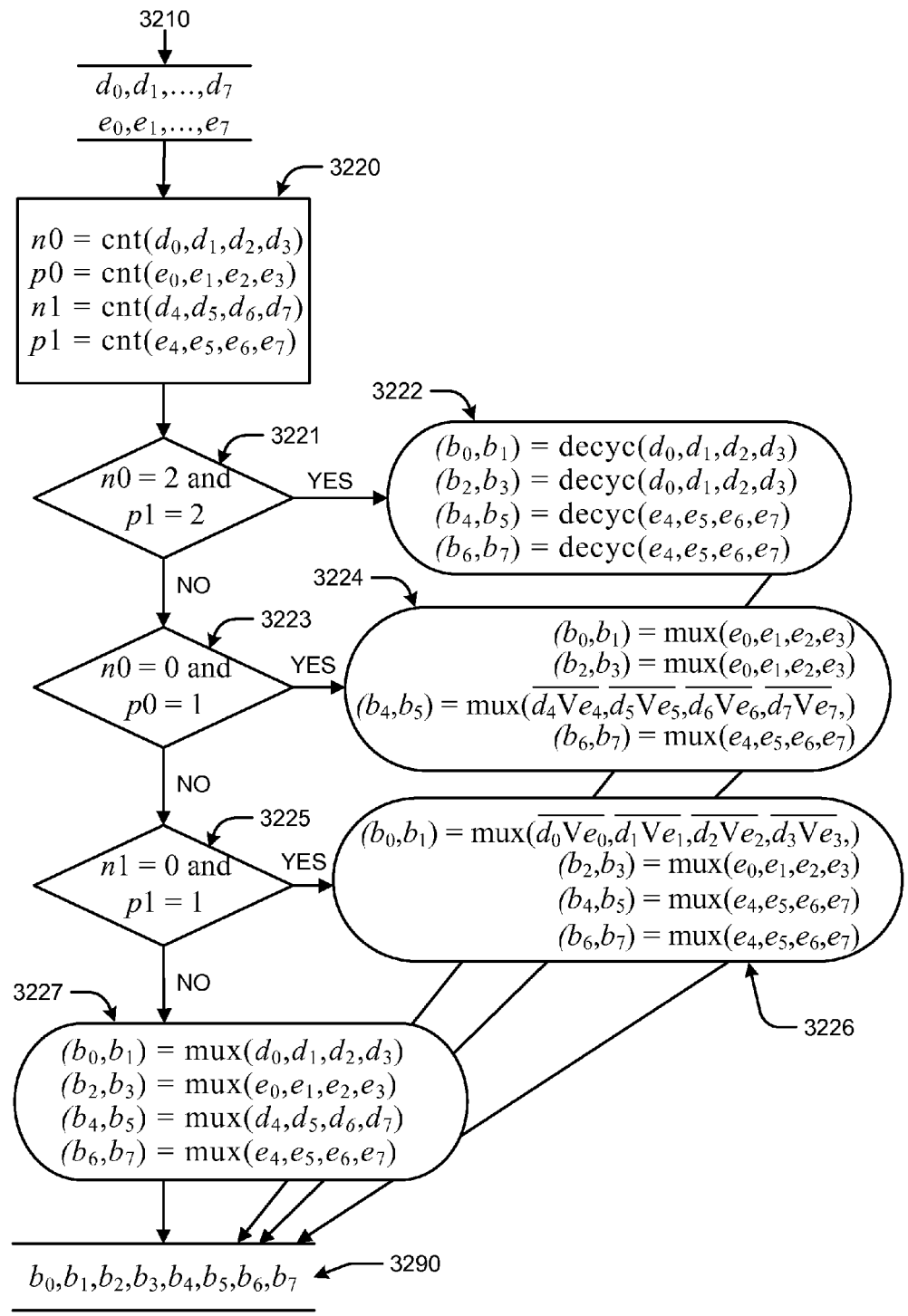
FIG. 40 is a flowchart of a process for encoding.

The decoding process exemplified in FIG. 40 comprises four different cases. The first case occurs when n0=2 and p1=2 and the test for this case is in Step 3221. When true the values of the output bits $b_0, \ldots, b_7$ are set according to the computations in Step 3222. The function decyc( ... ) in Step 3222 is defined by Table 9 where the table only shows the value of the function decyc( ... ) for allowable inputs.

TABLE 9

| Input | Output |
|---|---|
| 1100 | 00 |
| 0110 | 01 |
| 0011 | 10 |
| 1001 | 11 |

The second case occurs when n0=0 and p1=1 and the test for this case is in Step 3223. When true, the values of the output bits $b_0, \ldots, b_7$ are set according to the computations in Step 3224. The function mux( ... ) in Step 3224 is defined by Table 10 where the table only shows the value of the function mux( ... ) for allowable inputs.

TABLE 10

| Input | Output |
|---|---|
| 1000 | 00 |
| 0100 | 01 |
| 0010 | 10 |
| 0001 | 11 |

The third case occurs when n1=0 and p1=1 and the test for this case is in Step 3225. When true the values of the output bits $b_0, \ldots, b_7$ are set according to the computations in Step 3226. The fourth case is the default case and when true the values of $b_0, \ldots, b_7$ are set according to the computations in Step 3227.

In a preferred embodiment, the process that the sparse decoder 648 for the 8b8w code performs is implemented with basic building blocks. Such a preferred embodiment is now further described with reference to FIG. 41. The input of the sparse encoder exemplified in FIG. 41 comprises two sets of eight signals. The first set of signals 3310, 3312 is denoted by $d_0, \ldots, d_7$ and each of these signals carries a logical one when a +1 has been observed on the corresponding wire. The second set of signals 3311, 3313 is denoted by $e_0, \ldots, e_7$ and each of these signals carries a logical one when a $-1$ has been observed on the corresponding wire.

Figure 41:
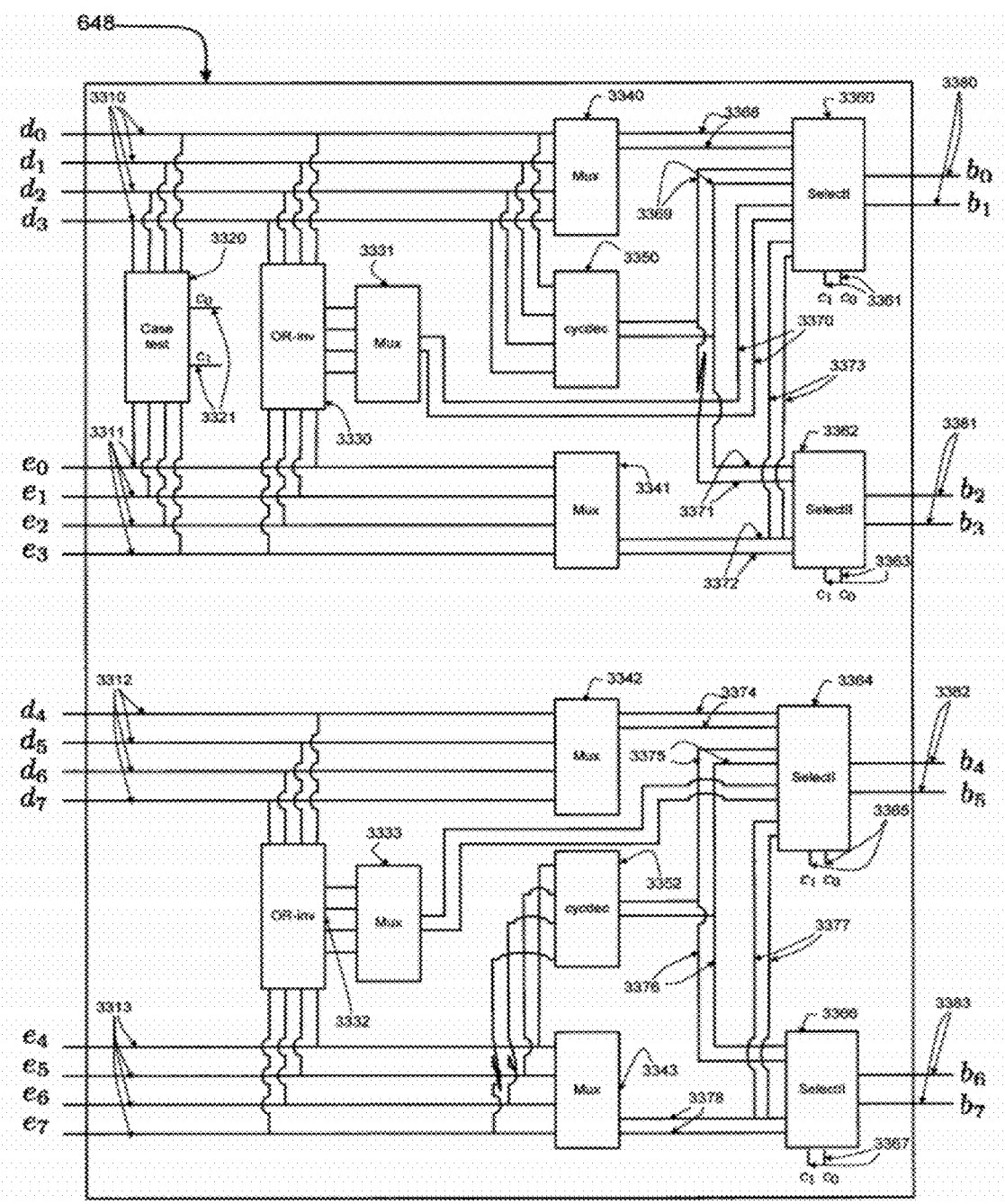
FIG. 41 illustrates a sparse decoder.

A case test unit 3320 determines which of the four possible cases of the process in FIG. 41 is true and for this inputs 3310 and 3311 may be used. The outputs 3321 of the case test unit 3320 may comprise the pair of bits $(c_1, c_0)$. To encode the four different cases, the case test unit 3320 may set $(c_1, c_0)$ as follows. When the number of logical ones in $(d_0, d_1, d_2, d_3)$ and the number of logical ones in $(e_0, e_1, e_2, e_3)$ is even it may set $(c_1, c_0)=(0,0)$. When the number of logical ones in $(d_0, d_1, d_2, d_3)$ and the number of logical ones in $(e_0, e_1, e_2, e_3)$ is odd, it may set $(c_1, c_0)=(1,1)$. When $(d_0, d_1, d_2, d_3)$ contains a non-zero and even number of logical ones and the number of logical ones in $(e_0, e_1, e_2, e_3)$ is odd, then it may set $(c_1,$ $c_0$)=(0,1). Finally, when ($d_0$, $d_1$, $d_2$, $d_3$) contains no logical ones and the number of logical ones in ($e_0$, $e_1$, $e_2$, $e_3$) is odd, then it may set ($c_1$, $c_0$)=(1,0).

These four cases do not cover all possibilities. However, for a valid word from the 8b8w sparse signaling code, all possibilities are covered. In some embodiments, additional components and logic are added to cover the other cases. This is useful when errors during transmission over the bus occur and the properties of the 8b8w code allow for a detection of certain errors.

The inputs 3310, 3311, 3312 and 3313 are fed to multiplexer units 3330, 3331, 3332 and 3333, respectively. Each of these multiplexer units maps its inputs to a set of two outputs according to Table 10 as is the case for the mux( . . . ) function that is used in the process that is shown in FIG. 40. The inputs 3310 ad 3311 are connected to an or-and-invert unit 3330 and the inputs 3312 and 3314 are connected to an or-and-invert unit 3332. Both or-and-invert units 3330 and 3332 may perform a similar function. The outputs of the or-and-invert unit 3330 are denoted by $y_0$, . . . , $y_3$ and the logical function that the or-and-invert unit 3330 performs is given by Equations 12.

$$y_0 = \overline{d_0 \vee e_0}, y_1 = \overline{d_1 \vee e_1}, y_2 = \overline{d_2 \vee e_2}, y_3 = \overline{d_3 \vee e_3} \quad \text{(Eqn. 12)}$$

The outputs $y_0$, . . . , $y_3$ are forwarded to the multiplexer unit 3331. The outputs of the or-and-invert unit 3332 are forwarded to the multiplexer unit 3333. The inputs $d_0$, . . . , $d_3$ and $e_4$, . . . , $e_7$ are also connected to cyclic decoder units 3350 and 3352, respectively. The cyclic decoder units 3350 and 3352 map their respective input signals to two outputs according to Table 8. The cyclic decoder units 3350 and 3352 implement the decyc( . . . ) function that is used in the process that is shown in FIG. 40. The output of the sparse decoder 648 that is exemplified in FIG. 41 comprises four pairs of bits 3380, 3381, 3382 and 3383.

A selectI unit 3360 generates the output bits 3380 as follows. The selectI unit 3360 has two control inputs 3361. The control inputs 3361 are connected to the two outputs 3321 of the case test unit 3320. The input of the selectI unit 3360 comprises a pair of signals 3368 that originates from the multiplexer unit 3340, a pair of signals 3369 that originates from the cyclic decoder unit 3350 and a pair of signals 3370 that originates from the multiplexer unit 3331.

When the output 3321 of the case test unit 3320 is equal to ($c_1$, $c_0$)=(0,0) the selectI unit 3360 sets the outputs 3380 to the value of the inputs 3369 which originate from the cyclic decoder unit 3350. Furthermore, a selectII unit 3362 has control inputs 3363 that are also connected to the outputs 3321 of the case test unit 3320. When ($c_1$, $c_0$)=(0,0) the outputs 3381 are set to the first two inputs 3371 of the selectII 3362. These inputs 3371 originate from the cyclic decoder unit 3350. The selectI unit 3364 and selectII unit may operate in a similar way.

When the output 3321 of the case test unit 3320 is equal to ($c_1$, $c_0$)=(1,1) the selectI unit 3360 sets the output 3380 to the values of the inputs 3368 which originate from the multiplexer unit 3340. Furthermore, the selectII unit 3362 sets the outputs 3381 to the inputs 3372 which originate from the multiplexer unit 3341. The selectI unit 3364 and selectII unit may operate in a similar way.

When the output 3321 of the case test unit 3320 is equal to ($c_1$, $c_0$)=(0,1) the selectI unit 3360 sets the outputs 3380 to the values of the inputs 3370 which originate from the multiplexer unit 3331. The selectII unit 3362 sets the outputs 3381 to the values of the inputs 3372. The selectI unit 3364 sets the outputs 3382 to the values of the inputs 3377 which originate from the multiplexer unit 3343. Furthermore, the selectII unit 3366 sets the outputs 3383 to the values of the inputs 3378.

When the output 3321 of the case test unit 3320 is equal to ($c_1$, $c_0$)=(1,0) the selectI unit 3360 sets the outputs 3380 to the values of the inputs 3373 which originate from the multiplexer unit 3341. Furthermore, the selectII unit 3362 sets the outputs 3381 to the values of the inputs 3372. The selectI unit 3360 sets the outputs 3380 to the values of the inputs 3373 which originate from the multiplexer unit 3341. Furthermore, the selectII unit 3362 sets the outputs 3381 to the values of the inputs 3372. In the same spirit as the encoder for the 8b8w code exemplified in FIGS. 31-34, one may implement the blocks of FIG. 41 with logic gates.

The embodiment of FIG. 41 is not the only way the sparse decoder 648 for the 8b8w code may be implemented.

In the foregoing specification, the invention has been described with reference to specific embodiments thereof. It will be, however, evident that various modifications and changes may be made thereto without departing from the broader scope and spirit of the invention. The specifications and drawings are, accordingly, to be regarded in an illustrative, rather than restrictive, sense.

Generalizations and Further Applications

Sparse signaling codes provide several advantages when used to transmit information in communication systems. Sparse signaling codes are useful when information is transmitted in quantities of k bits on multiple physical channels of communication. The use of sparse signaling codes provides resilience against several types of noise and allows for very low power communications.

Figure 42:
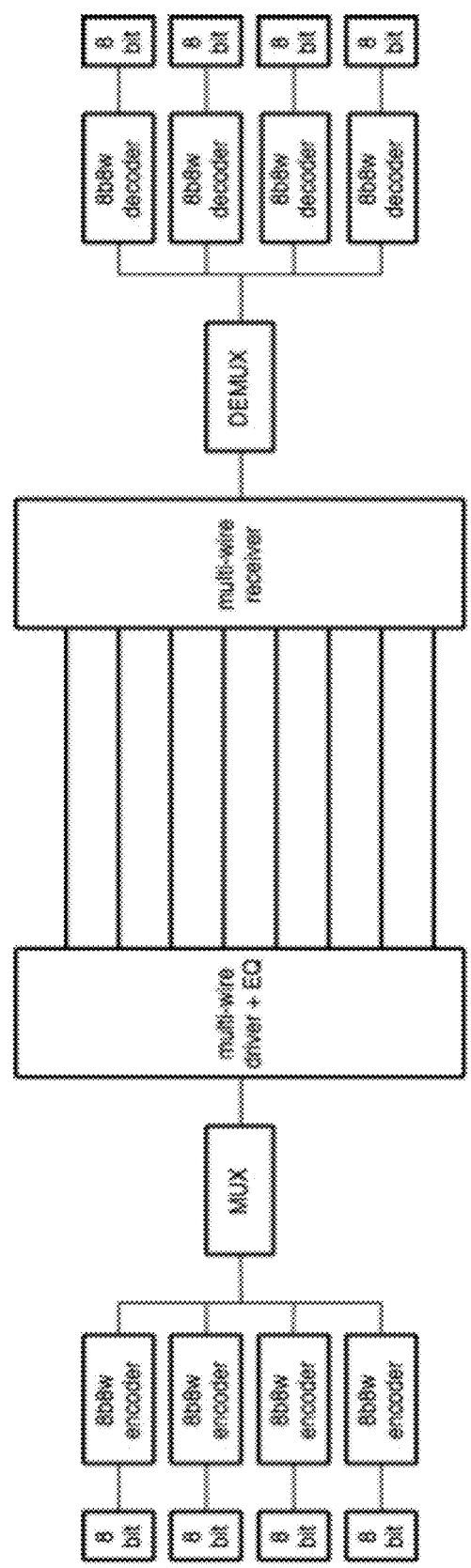
FIG. 42 illustrates a sparse encoding system, for an 8b8w configuration.

In a specific example shown in FIG. 42, power and pin-efficient high speed serial links are provided with an 8b8w set. The encoder and decoder there use sparse permutation modulation ("SPM"). The encoders and decoders described herein provide improved signal integrity and are improved with respect to common-mode noise, crosstalk, simultaneous switching output ("SSO") noise and Gaussian noise (similar to or better than differential signaling). Their pin efficiency can be greater than or equal to one. The power efficiency can be very high, with a compact multi-wire driver and receiver architecture matched to the signaling method itself. Error correction can be included. The resolution can be minimal to send data across. This relaxes methods like equalization. It can use multi-wire signaling, wherein a group of wires is used together to send data across. Also, it can provide a high resilience against cross-talk.

FIG. 42 shows the transmitter and receiver in greater detail, for a specific example of an "8b8w" configuration. In this example, a transceiver operates on eight wires (trace length can be 5-10 cm), using SPM code that transmits 8 bits on 8 wires (ternary code), operates at a symbol clock of 6 GHz, with a link data rate of 48 Gbps. The lines are terminated at both the transmitter and the receiver. Power consumption for a full transceiver system might be as low as, or lower than, 100 mW. This gives a power efficiency of around 2 mW/Gbps.

In another example, an 8b8w encoder operates at 1.5 GHz and encoding is performed within 1 clock period, power consumption is 4 mW for four encoders, and decoders have similar power consumption.

An example multi-wire driver architecture for 8 wires can use passive equalization, with power consumption of 8 mW for the full driver for 8 wires. Using a multi-wire receiver front-end with samplers, power consumption is 10 mW for multi-wire receiver for 8 wires.

In some variations, additional equalization is provided to support longer trace lengths and ESD protection is provided.

Figure 43:
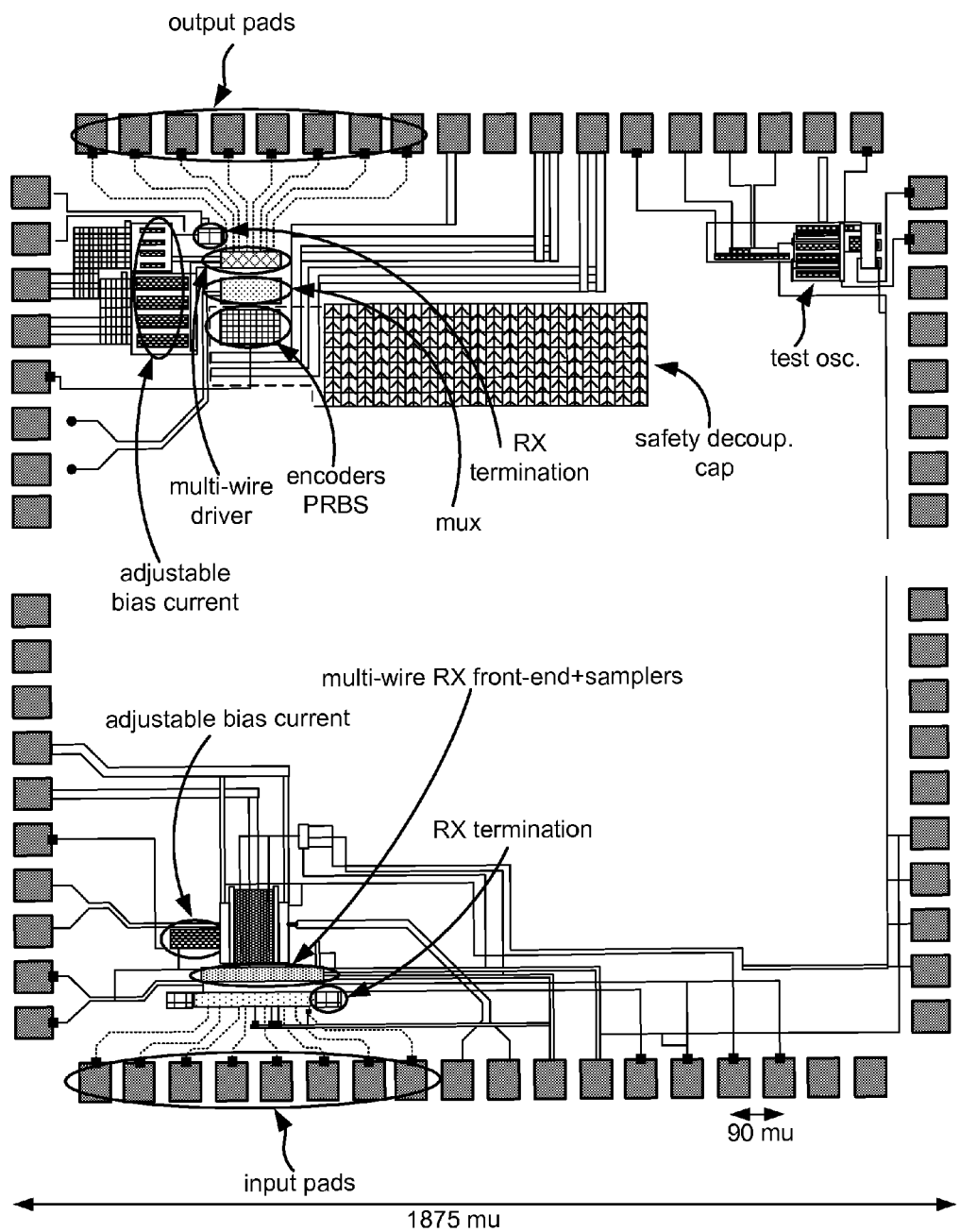
FIG. 43 illustrates an example layout of a sparse encoder and decoder on a chip.
Figure 43A:
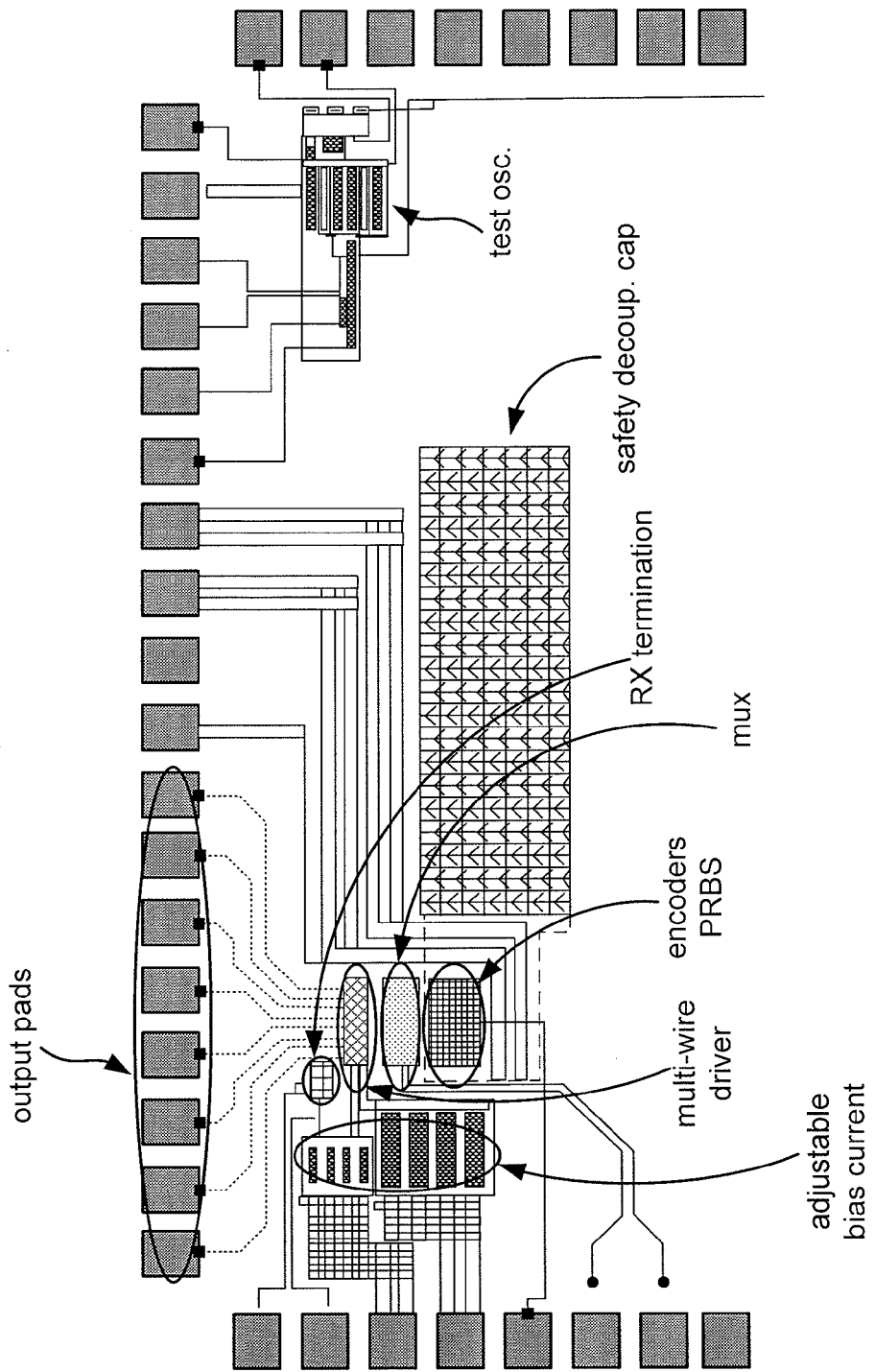
FIG. 43A and FIG. 43B show larger views.
Figure 43B:
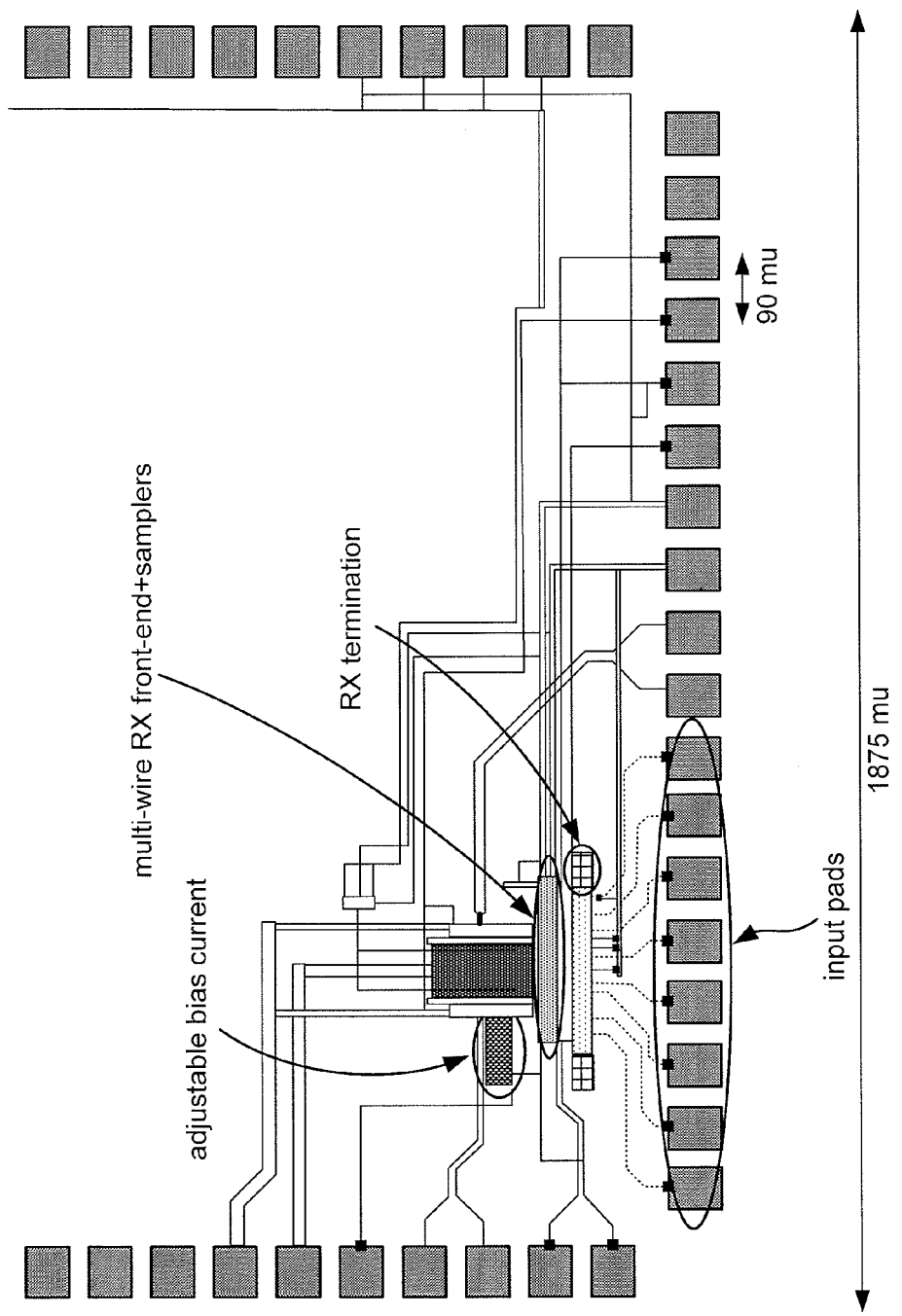

A very specific example of a layout is shown in FIG. 43.

Each of the physical channels is referred to as a wire in this application and the set of wires constitutes the communication bus. However, one should keep in mind that these wires may include the whole path from transmitting IC to receiving IC. This implies that for instance bond wires, strip lines, pins, etc. may be included in this physical channel constituting the wire. Furthermore, these ICs may be located in the same device, may be stacked on top of each other in a package-on-package configuration, or even be integrated on the same die. In the latter case the ICs are really two components of the same chip.

Each of the wires constituting the communication bus might be a medium carrying electrical signals. However, the wire may also comprise an optical fiber that carries electrical signals or a combination. Furthermore, a wire may in part carry electrical signals and in another part carry optical signals. Another possibility is that communication between two ICs takes place wireless. What is important that in the end two ICs communicate with another over a plurality of wires where the wire is understood to be a very general term for a path between transmitting and receiving IC.

The preferred embodiments mostly illustrate the use of sparse signaling codes for chip-to-chip communications. However, this should not been seen in any way to limit the scope of present invention. The methods disclosed in this application may also be useful for storage of information.

What is claimed is:

1. A method for transmitting information using electrical or electromagnetically-propagated signals over a communication bus, the method comprising: receiving, at an encoder circuit, a first set of signals representing the information; mapping the first set of signals to a second set of signals using a circuit, wherein the second set of signals represents a code word of a sparse signaling code, wherein the code words comprise vector components selected from a set of at least three values; and providing the second set of signals for transmission over the communication bus, wherein the sparse signaling code is a balanced code in that a measurable physical effect summed over nonquiescent vector components balances what the measurable physical effect summed would be if all of the vector components were quiescent.

2. The method of claim 1, wherein pin-efficiency refers to a ratio of bits of information conveyed in a period per wire used of the communication bus and the pin-efficiency of the sparse signaling code is larger than 0.5.

3. The method of claim 1, wherein pin-efficiency refers to a ratio of bits of information conveyed in a period per wire used of the communication bus and the pin-efficiency of the sparse signaling code is equal to 1.

4. The method of claim 1, wherein pin-efficiency refers to a ratio of bits of information conveyed in a period per wire used of the communication bus and the pin-efficiency of the sparse signaling code is larger than 1.

5. The method of claim 1, wherein the sparse signaling code is a ternary sparse signaling code, in that code words comprise vector components selected from a set of exactly three values.

6. The method of claim 1, wherein the sparse signaling code is defined by a predetermined basis vector of size n that contains n-2 quiescent components.

7. The method of claim 1, wherein the sparse signaling code is defined by a predetermined basis vector of size n that contains at least n/2 quiescent components.

8. A method, using an encoding circuit, for encoding a predetermined number, k, of bits of information into a code word of a sparse signaling code that is defined by a predetermined basis vector of size n, the method comprising: providing a storage device that is able to store n symbols of the code word, wherein the code words comprise vector components selected from a set of more than two values: initializing storage elements in the storage device to one or more predetermined value; receiving a first set of signals representing the k bits of information; dividing the k bits of information into a predetermined number of partitions; generating a predetermined number of indices and corresponding symbols of the code word based on the partitions, wherein the indices identify the positions in the code word that are equal to one of the n symbols; and using the indices to access the storage device and set the storage elements corresponding to the indices to the symbols, wherein the sparse signaling code is a balanced code in that a measurable physical effect summed over nonquiescent vector components balances what the measurable physical effect summed would be if all of the vector components were quiescent.

9. The method of claim 8, wherein the k bits are divided into the predetermined number of partitions of equal size.

10. The method of claim 8, wherein the indices are generated such that a valid code word from the sparse signaling code that conveys four bits on no more than five wires is generated.

11. The method of claim 8, wherein the indices are generated such that a valid code word from the sparse signaling code that conveys eight bits on no more than eight wires is generated.

12. A method for receiving information conveyed with electrical or electromagnetically-propagated signals over a communication bus, the method comprising: receiving, at a receiver input circuit, a first set of physical signals representing the information, from the communication bus, wherein the first set comprises code words from a sparse signaling code in which code words comprise vector components selected from a set of at least three values; determining, from the first set of physical signals, a second set of physical signals, wherein the second set of physical signals represents a sorted version of the first set of physical signals; and determining from the second set of physical signals, the information transmitted on the communication bus, wherein the sparse signaling code is a balanced code in that a measurable physical effect summed over nonquiescent vector components balances what the measurable physical effect summed would be if all of the vector components were quiescent.

13. The method of claim 12, wherein the sparse signaling code is a ternary sparse signaling code, in that code words comprise vector components selected from a set of exactly three values.

14. The method of claim 13, wherein the set of exactly three values of the ternary sparse signaling code comprise a quiescent value and two distinct nonquiescent values, and wherein the second set of physical signals is formed by detecting positions of nonquiescent components of the ternary sparse signaling code.

15. A communication system for transmitting a code word from a sparse signaling code comprising: a communication bus with n independent signal paths for signal transmission; means for generating the code word from the sparse signaling code, wherein the code word is from a set of code words that comprise vector components selected from a set of at least three values; and means for transmitting the code word from the sparse signaling code on the communication bus, wherein the sparse signaling code is a balanced code in that a measurable physical effect summed over nonquiescent vector components balances what the measurable physical effect summed would be if all of the vector components were quiescent.

16. The communication system of claim 15, wherein the sparse signaling code conveys four bits on no more than five wires.

17. The communication system of claim 15, wherein the sparse signaling code that conveys eight bits on no more than eight wires.

18. The communication system of claim 15, wherein the sparse signaling code is a ternary sparse signaling code, in that code words of the sparse signaling code comprise vector components selected from a set of exactly three values.

19. The communication system of claim 15, further comprising:
   means for receiving the signals from the communication bus;
   means for generating, from the signals, a representation for the code word transmitted on the communication bus; and
   means for inferring the information from the representation of the code word from the sparse signaling code.

20. The communication system of claim 19, wherein the representation is generated by sorting the signals.

\* \* \* \* \*